United States Patent
Kitano et al.

(10) Patent No.: US 9,178,158 B2
(45) Date of Patent: Nov. 3, 2015

(54) LIGHT-EMITTING ELEMENT, LIGHT-EMITTING DEVICE, ELECTRONIC DEVICE, LIGHTING DEVICE AND ORGANIC COMPOUND

(71) Applicant: Semiconductor Energy Laboratory Co., Ltd., Atsugi-shi, Kanagawa-ken (JP)

(72) Inventors: Yasushi Kitano, Kanagawa (JP);
Hiroshi Kadoma, Kanagawa (JP);
Satoko Shitagaki, Kanagawa (JP);
Nobuharu Ohsawa, Tochigi (JP);
Satoshi Seo, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 433 days.

(21) Appl. No.: 13/683,432

(22) Filed: Nov. 21, 2012

(65) Prior Publication Data
US 2013/0134395 A1    May 30, 2013

(30) Foreign Application Priority Data
Nov. 25, 2011    (JP) ................ 2011-258031

(51) Int. Cl.
*H01L 51/00*  (2006.01)
*H01L 51/50*  (2006.01)

(52) U.S. Cl.
CPC ........ *H01L 51/0032* (2013.01); *H01L 51/0059* (2013.01); *H01L 51/0072* (2013.01); *H01L 51/0074* (2013.01); *H01L 51/0085* (2013.01); *H01L 51/5016* (2013.01)

(58) Field of Classification Search
None
See application file for complete search history.

(56) References Cited

U.S. PATENT DOCUMENTS

| | | |
|---|---|---|
| 6,723,445 B2 | 4/2004 | Li et al. |
| 7,355,340 B2 | 4/2008 | Shitagaki et al. |
| 8,247,575 B2 | 8/2012 | Nomura et al. |

(Continued)

FOREIGN PATENT DOCUMENTS

| | | |
|---|---|---|
| EP | 2 363 398 A1 | 9/2011 |
| JP | 2007-189001 A | 7/2007 |

(Continued)

OTHER PUBLICATIONS

Christian Goldsmith et al.; "C—H Bond Activation by a Ferric Methoxide Complex: Modeling the Rate-Determining Step in the Mechanism of Lipoxygenase"; J. Am. Chem. Soc. (Journal of the American Chemical Society); 2002; pp. 83-96; vol. 124, No. 1.

(Continued)

*Primary Examiner* — J. L. Yang
(74) *Attorney, Agent, or Firm* — Fish & Richardson P.C.

(57) ABSTRACT

A novel organic compound which can be used as a host material for a phosphorescent compound is provided. A light-emitting element containing the organic compound is provided. A light-emitting device, an electronic device, and a lighting device each of which includes the light-emitting element are provided. In the light-emitting element including a light-emitting layer interposed between a pair of electrodes, the light-emitting layer contains at least an organic compound and a phosphorescent compound. In the organic compound, a dibenzo[f,h]quinoxaline skeleton and an amino group having two substituents are bonded to each other through an arylene group. The substituents are separately an aryl group or a heteroaryl group.

17 Claims, 33 Drawing Sheets

(56) References Cited

U.S. PATENT DOCUMENTS

| | | |
|---|---|---|
| 2009/0072718 A1 | 3/2009 | Nomura et al. |
| 2009/0140641 A1 | 6/2009 | Nomura et al. |
| 2009/0140642 A1 | 6/2009 | Kadoma et al. |
| 2009/0153041 A1 | 6/2009 | Kawakami et al. |
| 2009/0184633 A1 | 7/2009 | Kadoma et al. |
| 2009/0203704 A1 | 8/2009 | Kadoma et al. |
| 2010/0039024 A1 | 2/2010 | Wendeborn et al. |
| 2010/0249349 A1 | 9/2010 | Chebotareva et al. |
| 2011/0089407 A1 | 4/2011 | Schmidhalter et al. |
| 2011/0210316 A1 | 9/2011 | Kadoma et al. |
| 2012/0193613 A1 | 8/2012 | Kadoma et al. |
| 2012/0197020 A1 | 8/2012 | Osaka et al. |
| 2013/0048971 A1 | 2/2013 | Kitano et al. |

FOREIGN PATENT DOCUMENTS

| | | |
|---|---|---|
| JP | 2008-239613 A | 10/2008 |
| JP | 2010-241801 A | 10/2010 |
| JP | 2011-201869 A | 10/2011 |
| WO | 03/058667 A1 | 7/2003 |
| WO | 2004/043937 A1 | 5/2004 |
| WO | 2007/090773 A1 | 8/2007 |
| WO | 2008/031743 A1 | 3/2008 |
| WO | 2009/100991 A1 | 8/2009 |

OTHER PUBLICATIONS

T. Onishi et al.; "A Method of Measuring an Energy Level"; English Translation of High molecular EL materials-development of light-emitting high molecular compounds-; Dec. 25, 2004; pp. 64-67; Kyoritsu Shuppan, with full English translation.

European Search Report (EP Patent Application No. 11155124.8) dated Jun. 24, 2011, 7 pages.

FIG. 6A
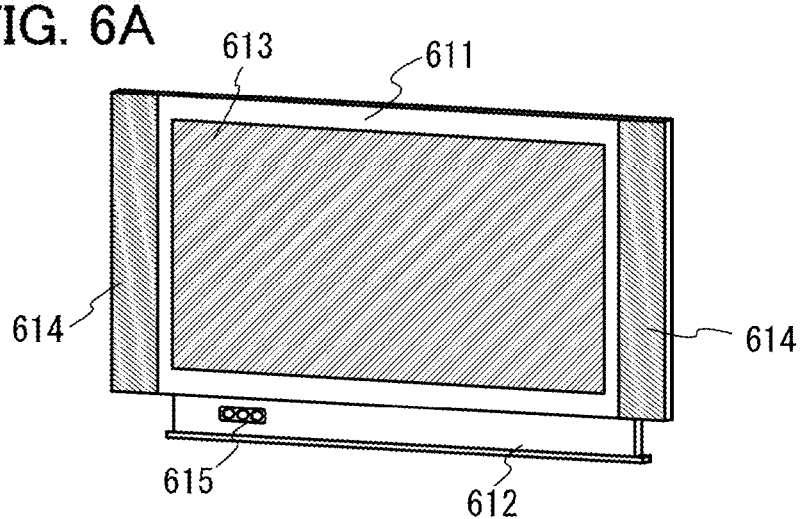
FIG. 6B
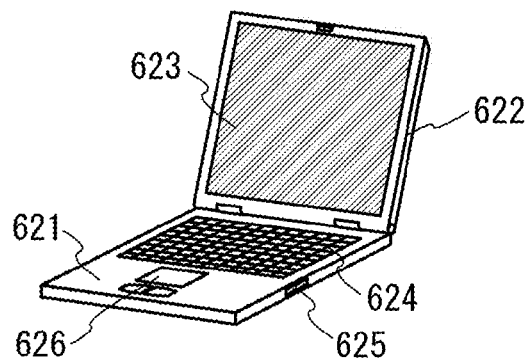
FIG. 6C
FIG. 6D
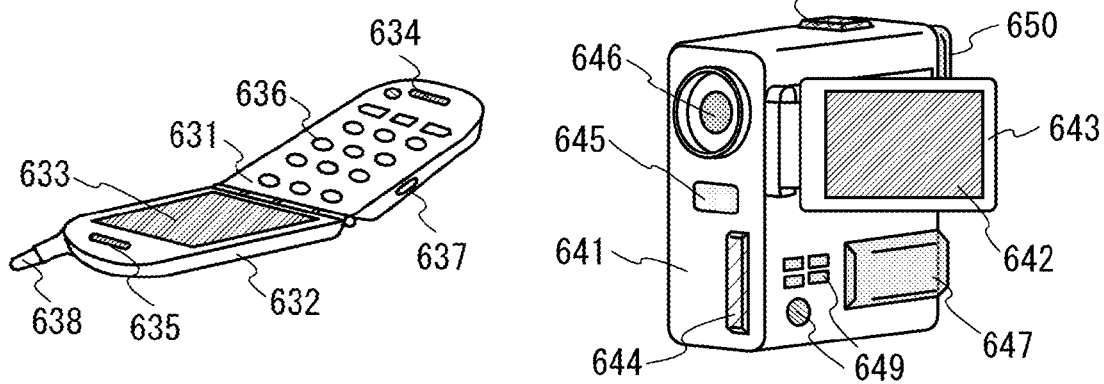

LIGHT-EMITTING ELEMENT, LIGHT-EMITTING DEVICE, ELECTRONIC DEVICE, LIGHTING DEVICE AND ORGANIC COMPOUND

BACKGROUND OF THE INVENTION

1. Field of the Invention

The present invention relates to a light-emitting element, a light-emitting device, an electronic device, a lighting device, and an organic compound.

2. Description of the Related Art

In recent years, research and development have been extensively conducted on light-emitting elements using electroluminescence (EL). In a basic structure of such a light-emitting element, a layer containing a light-emitting substance is interposed between a pair of electrodes. By applying voltage to this element, light emission from the light-emitting substance can be obtained.

Such a light-emitting element is self-luminous elements and has advantages over liquid crystal displays, such as high visibility of the pixels and no need of backlight; thus, such a light-emitting element is thought to be suitable as a flat panel display element. Besides, such a light-emitting element has advantages in that it can be manufactured to be thin and lightweight, and has very fast response speed.

Furthermore, since such a light-emitting element can be formed in a film form, the light-emitting element makes it possible to provide planar light emission; thus, a large-area element can be easily formed. This feature is difficult to obtain with point light sources typified by incandescent lamps and LEDs or linear light sources typified by fluorescent lamps. Thus, the light-emitting element also has great potential as a planar light source applicable to a lighting device and the like.

Such light-emitting elements utilizing electroluminescence can be broadly classified according to whether a light-emitting substance is an organic compound or an inorganic compound. In the case of an organic EL element in which a layer containing an organic compound used as a light-emitting substance is provided between a pair of electrodes, application of voltage to the light-emitting element causes injection of electrons from a cathode and holes from an anode into the layer containing the organic compound having a light-emitting property and thus a current flows. The injected electrons and holes then lead the organic compound to its excited state, so that light emission is obtained from the excited organic compound.

The excited state formed by an organic compound can be a singlet excited state or a triplet excited state. Light emission from the singlet excited state (S*) is called fluorescence, and emission from the triplet excited state (T*) is called phosphorescence. Further, the statistical generation ratio of S* to T* in a light-emitting element is thought to be 1:3.

With a compound that can convert energy of a singlet excited state into light emission (hereinafter, called a fluorescent compound), only light emission from the singlet excited state (fluorescence) is observed and that from the triplet excited state (phosphorescence) is not observed, at room temperature. Accordingly, the internal quantum efficiency (the ratio of the number of generated photons to the number of injected carriers) of a light-emitting element including the fluorescent compound is assumed to have a theoretical limit of 25%, on the basis of S*:T*=1:3.

In contrast, with a compound that can convert energy of a triplet excited state into light emission (hereinafter, called a phosphorescent compound), light emission from the triplet excited state (phosphorescence) is observed. Further, since intersystem crossing (i.e., transition from a singlet excited state to a triplet excited state) easily occurs in a phosphorescent compound, the internal quantum efficiency can be theoretically increased to 100%. In other words, higher emission efficiency can be obtained than using a fluorescent compound. For this reason, light-emitting elements using a phosphorescent compound have been under active development recently so that high-efficiency light-emitting elements can be achieved.

When a light-emitting layer of a light-emitting element is formed using a phosphorescent compound described above, in order to suppress concentration quenching or quenching due to triplet-triplet annihilation in the phosphorescent compound, the light-emitting layer is often formed such that the phosphorescent compound is dispersed in a matrix of another compound. Here, the compound as the matrix is called a host material, and the compound dispersed in the matrix, such as a phosphorescent compound, is called a guest material (dopant).

In the case where a phosphorescent compound is a guest material, a host material needs to have higher triplet excited energy (energy difference between a ground state and a triplet excited state) than the phosphorescent compound. The host material also needs to have properties of easily accepting and transporting both holes and electrons (i.e., a bipolar property).

When a substance used as a host material has a bipolar property, holes and electrons can be accepted efficiently; thus, a light-emitting element in which such a host material is used in a light-emitting layer can have lower driving voltage.

Furthermore, since singlet excitation energy (energy difference between a ground state and a singlet excited state) is higher than triplet excited energy, a substance that has high triplet excited energy also has high singlet excitation energy. Therefore the above substance that has high triplet excited energy is also effective in a light-emitting element using a fluorescent compound as a light-emitting substance.

As a host material which has a bipolar property and higher triplet excited energy than a phosphorescent compound, a carbazole derivative which has a heteroaromatic ring having, in the same molecule, a carbazole skeleton with a hole-transport property and an oxadiazole skeleton or a quinoxaline skeleton with an electron-transport property which is the heteroaromatic ring is disclosed (e.g., Patent Document 1).

REFERENCE

[Patent Document 1] Japanese Published Patent Application No. 2010-241801

SUMMARY OF THE INVENTION

As reported in Patent Document 1, the development of a host material for a phosphorescent compound has been actively conducted. However, light-emitting elements still need to be improved in terms of emission efficiency, reliability, emission characteristics, synthesis efficiency, and cost, and better light-emitting elements are expected to be developed.

In view of the above, an object of one embodiment of the present invention is to provide a novel organic compound which can be used as a host material for a phosphorescent compound. Another object is to provide a light-emitting element containing the organic compound.

Another object of one embodiment of the present invention is to provide a light-emitting device, an electronic device, and a lighting device each of which includes the light-emitting element.

One embodiment of the present invention is a light-emitting element which includes a light-emitting layer interposed between a pair of electrodes. The light-emitting layer contains at least an organic compound and a phosphorescent compound. In the organic compound, a dibenzo[f,h]quinoxaline skeleton and an amino group having two substituents are bonded to each other through an arylene group. The substituents are separately an aryl group or a heteroaryl group.

In the above structure, at least one of the substituents preferably includes a carbazole skeleton. In addition, the dibenzo[f,h]quinoxaline skeleton is a 2-position substituted skeleton; the 2-position of the dibenzo[f,h]quinoxaline skeleton is preferably bonded to the amino group through the arylene group.

The dibenzo[f,h]quinoxaline skeleton which has a high electron-transport property and the amino group having two substituents which has a high hole-transport property are bonded to each other through the arylene group in the organic compound, so that the organic compound can have a bipolar property. When the organic compound has a bipolar property, holes and electrons can be accepted efficiently. Further, the organic compound has a high triplet excited energy level ($T_1$ level). Thus, the light-emitting element in which such an organic compound is used in the light-emitting layer can have lower driving voltage.

Another embodiment of the present invention is a light-emitting element which includes a light-emitting layer interposed between a pair of electrodes. The light-emitting layer contains at least an organic compound and a phosphorescent compound. The organic compound can be represented by General Formula (G1). Note that the organic compound represented by General Formula (G1) is a useful, novel compound and is one embodiment of the present invention.

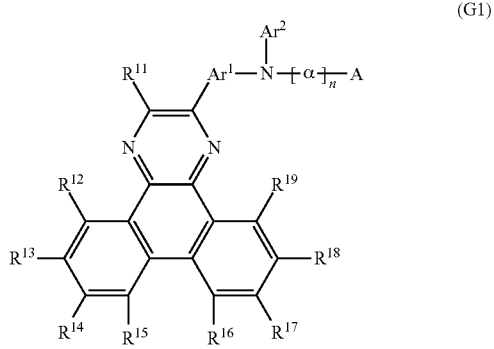

(G1)

In General Formula (G1), $R^{11}$ to $R^{19}$ separately represent hydrogen, an alkyl group having 1 to 4 carbon atoms, or a substituted or unsubstituted aryl group having 6 to 13 carbon atoms. $Ar^1$ represents a substituted or unsubstituted arylene group having 6 to 13 carbon atoms. $Ar^2$ represents a substituted or unsubstituted aryl group having 6 to 13 carbon atoms. In addition, α represents a substituted or unsubstituted phenylene group or a substituted or unsubstituted biphenyldiyl group; n represents 0 or 1; A represents substituted or unsubstituted 9H-carbazol-9-yl group or a substituted or unsubstituted 9-aryl-9H-carbazol-3-yl group.

Another embodiment of the present invention is a light-emitting element which includes a light-emitting layer interposed between a pair of electrodes. The light-emitting layer contains at least an organic compound and a phosphorescent compound. The organic compound can be represented by General Formula (G2-1). Note that the organic compound represented by General Formula (G2-1) is a useful, novel compound and is one embodiment of the present invention.

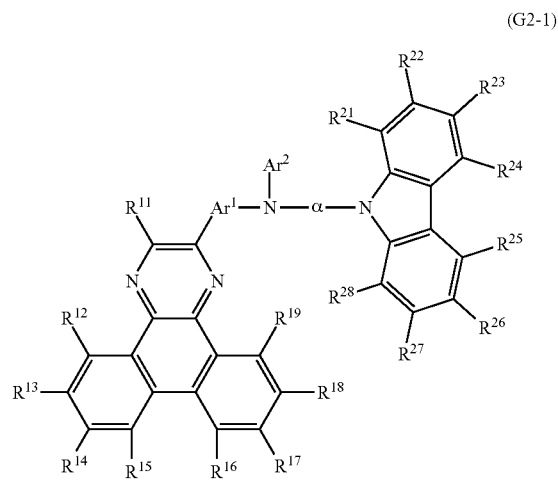

(G2-1)

In General Formula (G2-1), $R^{11}$ to $R^{19}$ and $R^{21}$ to $R^{28}$ separately represent hydrogen, an alkyl group having 1 to 4 carbon atoms, or a substituted or unsubstituted aryl group having 6 to 13 carbon atoms. $Ar^1$ represents a substituted or unsubstituted arylene group having 6 to 13 carbon atoms. $Ar^2$ represents a substituted or unsubstituted aryl group having 6 to 13 carbon atoms. In addition, α represents a substituted or unsubstituted phenylene group or a substituted or unsubstituted biphenyldiyl group.

Another embodiment of the present invention is a light-emitting element which includes a light-emitting layer interposed between a pair of electrodes. The light-emitting layer contains at least an organic compound and a phosphorescent compound. The organic compound can be represented by General Formula (G3-1). Note that the organic compound represented by General Formula (G3-1) is a useful, novel compound and is one embodiment of the present invention.

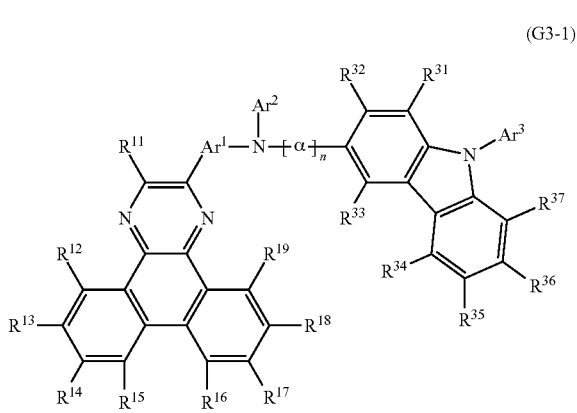

(G3-1)

In General Formula (G3-1), $R^{11}$ to $R^{19}$ and $R^{31}$ to $R^{37}$ separately represent hydrogen, an alkyl group having 1 to 4 carbon atoms, or a substituted or unsubstituted aryl group having 6 to 13 carbon atoms. $Ar^1$ represents a substituted or unsubstituted arylene group having 6 to 13 carbon atoms. $Ar^2$ and $Ar^3$ separately represent a substituted or unsubstituted aryl group having 6 to 13 carbon atoms. In addition, α represents a substituted or unsubstituted phenylene group or a substituted or unsubstituted biphenyldiyl group; n represents 0 or 1.

In each of the organic compounds represented by General Formulae (G2-1) and (G3-1), $Ar^1$ is preferably a substituted or unsubstituted phenylene group or a substituted or unsubstituted biphenyldiyl group.

In the organic compound represented by General Formula (G2-1), α is preferably a substituted or unsubstituted para-phenylene group. In the organic compound represented by General Formula (G3-1), n is preferably 1 and α is preferably a substituted or unsubstituted para-phenylene group. In each of the organic compounds represented by General Formula (G2-1) and (G3-1), $Ar^1$ is preferably a substituted or unsubstituted para-phenylene group. In other words, the organic compounds represented by General Formulae (G2-1) and (G3-1) can be represented by General Formulae (G2-2) and (G3-2), respectively.

Thus, another embodiment of the present invention is a light-emitting element which includes a light-emitting layer interposed between a pair of electrodes. The light-emitting layer contains at least an organic compound and a phosphorescent compound. The organic compound can be represented by General Formula (G2-2). Note that the organic compound represented by General Formula (G2-2) is a useful, novel compound and is one embodiment of the present invention.

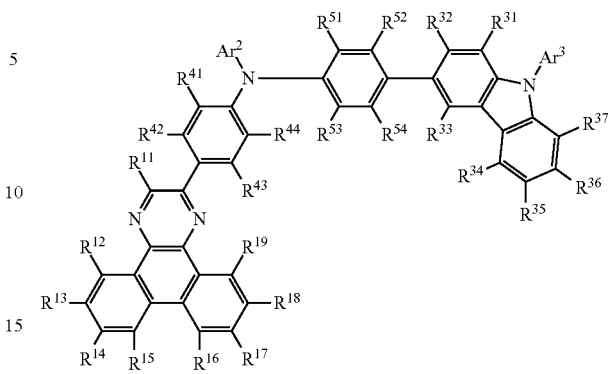

In General Formula (G3-2), $R^{11}$ to $R^{19}$, $R^{31}$ to $R^{37}$, $R^{41}$ to $R^{44}$, and $R^{51}$ to $R^{54}$ separately represent hydrogen, an alkyl group having 1 to 4 carbon atoms, or a substituted or unsubstituted aryl group having 6 to 13 carbon atoms. $Ar^2$ and $Ar^3$ separately represent a substituted or unsubstituted aryl group having 6 to 13 carbon atoms.

Another embodiment of the present invention is a light-emitting element which includes a light-emitting layer interposed between a pair of electrodes. The light-emitting layer contains at least an organic compound and a phosphorescent compound. The organic compound can be represented by General Formula (G3-3). Note that the organic compound represented by General Formula (G3-3) is a useful, novel compound and is one embodiment of the present invention.

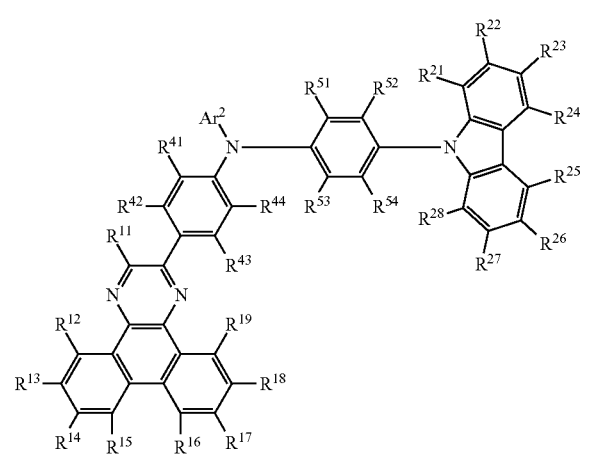

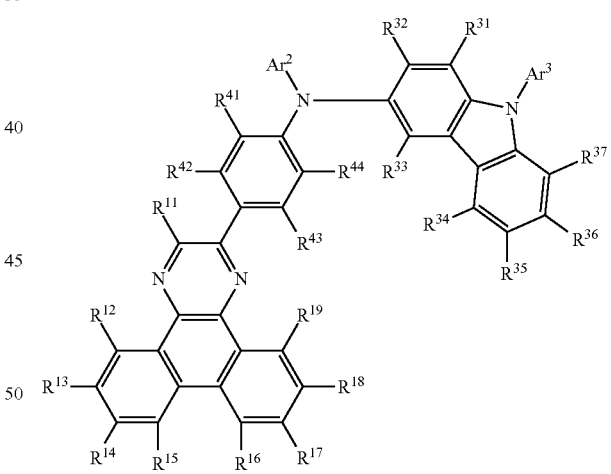

In General Formula (G2-2), $R^{11}$ to $R^{19}$, $R^{21}$ to $R^{28}$, $R^{41}$ to $R^{44}$, and $R^{51}$ to $R^{54}$ separately represent hydrogen, an alkyl group having 1 to 4 carbon atoms, or a substituted or unsubstituted aryl group having 6 to 13 carbon atoms. $Ar^2$ represents a substituted or unsubstituted aryl group having 6 to 13 carbon atoms.

Another embodiment of the present invention is a light-emitting element which includes a light-emitting layer interposed between a pair of electrodes. The light-emitting layer contains at least an organic compound and a phosphorescent compound. The organic compound can be represented by General Formula (G3-2). Note that the organic compound represented by General Formula (G3-2) is a useful, novel compound and is one embodiment of the present invention.

In General Formula (G3-3), $R^{11}$ to $R^{19}$, $R^{31}$ to $R^{37}$, and $R^{41}$ to $R^{44}$ separately represent hydrogen, an alkyl group having 1 to 4 carbon atoms, or a substituted or unsubstituted aryl group having 6 to 13 carbon atoms. $Ar^2$ and $Ar^3$ separately represent a substituted or unsubstituted aryl group having 6 to 13 carbon atoms.

A light-emitting device, an electronic device, and a lighting device each using the above light-emitting element are also included in the scope of the present invention. Note that the light-emitting device in this specification includes an image display device and a light source. In addition, the light-emitting device includes, in its category, all of a module in which a connector such as a flexible printed circuit (FPC) or a tape carrier package (TCP) is connected to a panel, a module in which a printed wiring board is provided on the tip of a TCP, and a module in which an integrated circuit (IC) is directly mounted on a light-emitting element by a chip on glass (COG) method.

According to one embodiment of the present invention, a novel organic compound which can be used as a host material for a phosphorescent compound can be provided. A light-emitting element containing the organic compound can also be provided. A light-emitting element which has low driving voltage and high current efficiency can also be provided. According to another embodiment of the present invention, the use of the light-emitting element makes it possible to provide a light-emitting device, an electronic device, and a lighting device which have lower power consumption.

BRIEF DESCRIPTION OF THE DRAWINGS

FIGS. 6A to 6D illustrate electronic devices of one embodiment of the present invention.

FIGS. 7A-1 to 7B illustrate electronic devices of one embodiment of the present invention.

DETAILED DESCRIPTION OF THE INVENTION

Hereinafter, embodiments of the present invention will be described in detail with reference to the accompanying drawings. Note that the present invention is not limited to the following description, and it will be easily understood by those skilled in the art that the mode and detail can be modified in various ways without departing from the spirit and scope of the present invention. Therefore, the present invention should not be construed as being limited to the description in the following embodiments.

(Embodiment 1)

In this embodiment, a structure of a light-emitting element, in which a light-emitting layer is interposed between a pair of electrodes and contains at least an organic compound and a phosphorescent compound, will be described with reference to FIG. 1.

Figure 1:
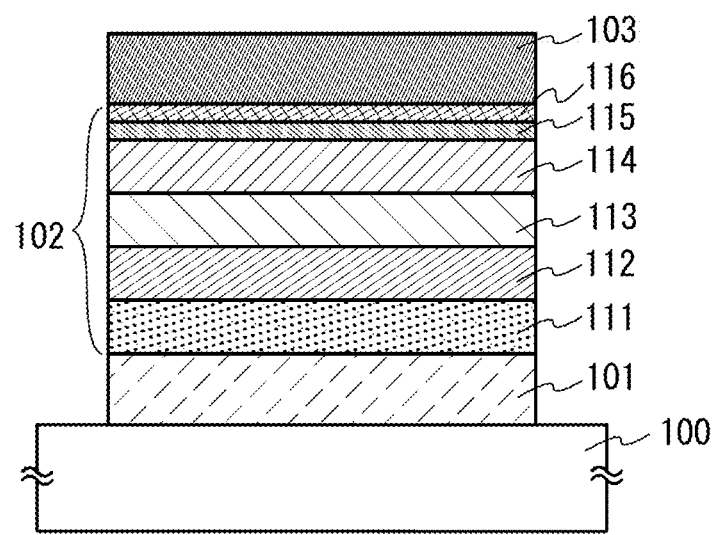
FIG. 1 illustrates a light-emitting element of one embodiment of the present invention.

In a light-emitting element described in this embodiment, as illustrated in FIG. 1, an EL layer 102 including a light-emitting layer 113 is provided between a pair of electrodes (a first electrode 101 and a second electrode 103), and the EL layer 102 includes a hole-injection layer 111, a hole-transport layer 112, an electron-transport layer 114, an electron-injection layer 115, a charge-generation layer 116, and the like in addition to the light-emitting layer 113. Note that in this embodiment, the first electrode 101 is used as an anode and the second electrode 103 is used as a cathode. The first electrode 101 is formed over a substrate 100. A glass substrate or the like can be used as the substrate 100.

When voltage is applied to such a light-emitting element, a hole injected from the first electrode 101 side and an electron injected from the second electrode 103 side recombine in the light-emitting layer 113, whereby a phosphorescent compound is excited. Then, light is emitted when the phosphorescent compound in the excited state returns to the ground state. Thus, in one embodiment of the present invention, the phosphorescent compound functions as a light-emitting substance in the light-emitting element.

The light-emitting layer 113 contains at least an organic compound and a phosphorescent compound. In the organic compound, a dibenzo[f,h]quinoxaline skeleton and an amino group having two substituents are bonded to each other through an arylene group. The substituents are separately an aryl group or a heteroaryl group.

The dibenzo[f,h]quinoxaline skeleton which has a high electron-transport property and the amino group having two substituents which has a high hole-transport property are bonded to each other through the arylene group in the organic compound, so that the organic compound can have a bipolar property. The organic compound also has a high $T_1$ level and thus can efficiently accept holes and electrons. Thus, the light-emitting element including the light-emitting layer 113 containing such an organic compound can have lower driving voltage.

The hole-injection layer 111 included in the EL layer 102 is a layer containing a substance having a high hole-transport property and an acceptor substance. When electrons are extracted from the substance having a high hole-transport property owing to the acceptor substance, holes are generated. Thus, holes are injected from the hole-injection layer 111 into the light-emitting layer 113 through the hole-transport layer 112.

The charge-generation layer 116 is a layer containing a substance having a high hole-transport property and an acceptor substance. Electrons are extracted from the substance having a high hole-transport property owing to the acceptor substance, and the extracted electrons are injected from the electron-injection layer 115 having an electron-injection property into the light-emitting layer 113 through the electron-transport layer 114.

A specific example in which the light-emitting element described in this embodiment is manufactured is described below.

For the first electrode 101 and the second electrode 103, a metal, an alloy, an electrically conductive compound, a mixture thereof, and the like can be used. Specifically, indium oxide-tin oxide (ITO: indium tin oxide), indium oxide-tin oxide containing silicon or silicon oxide, indium oxide-zinc oxide, indium oxide containing tungsten oxide and zinc oxide, gold (Au), platinum (Pt), nickel (Ni), tungsten (W), chromium (Cr), molybdenum (Mo), iron (Fe), cobalt (Co), copper (Cu), palladium (Pd), and titanium (Ti) can be used. In addition, an element belonging to Group 1 or Group 2 of the periodic table, for example, an alkali metal such as lithium (Li) or cesium (Cs), an alkaline earth metal such as magnesium (Mg), calcium (Ca), or strontium (Sr), an alloy containing such an element (e.g., MgAg or AlLi), a rare earth metal such as europium (Eu) or ytterbium (Yb), an alloy containing such an element, graphene, and the like can be used. The first electrode 101 and the second electrode 103 can be formed by, for example, a sputtering method, an evaporation method (including a vacuum evaporation method), or the like.

Examples of the substance having a high hole-transport property which is used for the hole-injection layer 111, the hole-transport layer 112, and the charge-generation layer 116 include aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(carbazol-9-yl)triphenylamine (abbreviation: TCTA), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB); 3-[N-(9-phenylcarbazol-3-yl)-N-phenylamino]-9-phenylcarbazole (abbreviation: PCzPCA1); 3,6-bis[N-(9-phenylcarbazol-3-yl)-N-phenylamino]-9-phenylcarbazole (abbreviation: PCzPCA2); and 3-[N-(1-naphthyl)-N-(9-phenylcarbazol-3-yl)amino]-9-phenylcarbazole (abbreviation: PCzPCN1). Other examples include carbazole compounds such as 4,4'-di(N-carbazolyl)biphenyl (abbreviation: CBP), 1,3,5-tris[4-(N-carbazolyl)phenyl]benzene (abbreviation: TCPB), and 9-[4-(10-phenyl-9-anthracenyl)phenyl]-9H-carbazole (abbreviation: CzPA); dibenzothiophene compounds such as 4,4',4''-(1,3,5-benzenetriyl)tri(dibenzothiophene) (abbreviation: DBT3P-II); dibenzofuran compounds such as 1,3,5-tri(dibenzofuran-4-yl)-benzene (abbreviation: DBF3P-II); and condensed-ring compounds such as 9-[3,5-di(phenanthren-9-yl)-phenyl]-phenanthrene (abbreviation: Pn3P). The substances given here are mainly ones having a hole mobility of $10^{-6}$ $cm^2/Vs$ or higher. Note that any other substance may be used as long as the substance has a hole-transport property higher than an electron-transport property.

The organic compound of one embodiment of the present invention has a hole-transport property and thus can also be used for the hole-transport layer 112.

Further, a high molecular compound such as poly(N-vinylcarbazole) (abbreviation: PVK), poly(-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), or poly[N,N'-bis(4-butylphenyl)-N,N'-bis(phenyl)benzidine] (abbreviation: Poly-TPD) can be used.

As each of the hole-injection layer 111 and the charge-generation layer 116, a layer in which any of the substances having a high hole-transport property given above and a substance having an acceptor property are mixed is preferably used, in which case a favorable carrier-injection property is obtained. As examples of the acceptor substance to be used, a transition metal oxide and an oxide of a metal belonging to any of Groups 4 to 8 of the periodic table can be given. Specifically, molybdenum oxide is particularly preferable.

The light-emitting layer 113 contains a phosphorescent compound as a guest material which serves as a light-emitting substance and is formed using a substance having higher triplet excited energy than the phosphorescent compound as a host material.

Here, the organic compound of one embodiment of the present invention can be used as the host material. In the organic compound of one embodiment of the present invention, a dibenzo[f,h]quinoxaline skeleton and an amino group having two substituents are bonded to each other through an arylene group. The substituents are separately an aryl group or a heteroaryl group. At least one of the substituents preferably includes a carbazole skeleton. The dibenzo[f,h]quinoxaline skeleton is a 2-position substituted skeleton; the 2-position of the dibenzo[f,h]quinoxaline skeleton is preferably bonded to an amino group through an arylene group.

In other words, the organic compound is an organic compound represented by General Formula (G1). The organic compound represented by General Formula (G1) is one embodiment of the present invention.

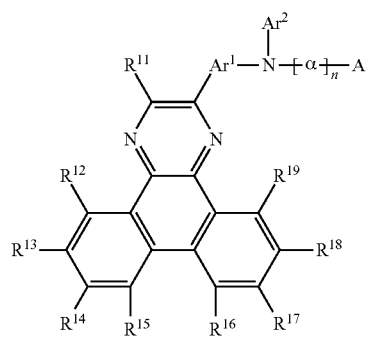

(G1)

In General Formula (G1), $R^{11}$ to $R^{19}$ separately represent hydrogen, an alkyl group having 1 to 4 carbon atoms, or a substituted or unsubstituted aryl group having 6 to 13 carbon atoms. $Ar^1$ represents a substituted or unsubstituted arylene group having 6 to 13 carbon atoms. $Ar^2$ represents a substituted or unsubstituted aryl group having 6 to 13 carbon atoms. In addition, α represents a substituted or unsubstituted phenylene group or a substituted or unsubstituted biphenyldiyl group; n represents 0 or 1; A represents substituted or unsubstituted 9H-carbazol-9-yl group or a substituted or unsubstituted 9-aryl-9H-carbazol-3-yl group.

Specifically, an organic compound represented by General Formula (G2-1) is preferable as the organic compound represented by General Formula (G1). Further, the organic compound represented by General Formula (G2-1) is one embodiment of the present invention.

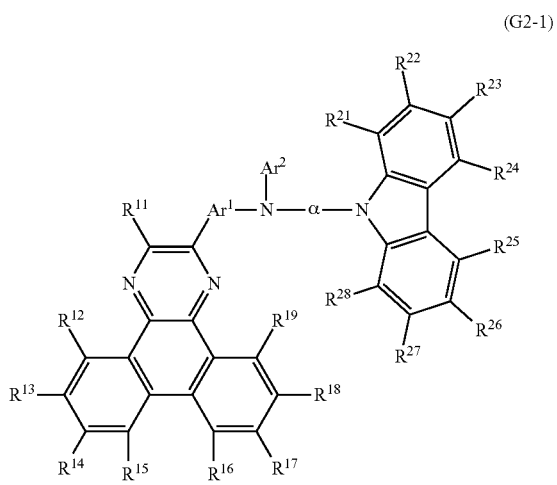

(G2-1)

In General Formula (G2-1), $R^{11}$ to $R^{19}$ and $R^{21}$ to $R^{28}$ separately represent hydrogen, an alkyl group having 1 to 4 carbon atoms, or a substituted or unsubstituted aryl group having 6 to 13 carbon atoms. $Ar^1$ represents a substituted or unsubstituted arylene group having 6 to 13 carbon atoms. $Ar^2$ represents a substituted or unsubstituted aryl group having 6 to 13 carbon atoms. In addition, α represents a substituted or unsubstituted phenylene group or a substituted or unsubstituted biphenyldiyl group.

Specifically, an organic compound represented by General Formula (G3-1) is preferable as the organic compound represented by General Formula (G1). Further, the organic compound represented by General Formula (G3-1) is one embodiment of the present invention.

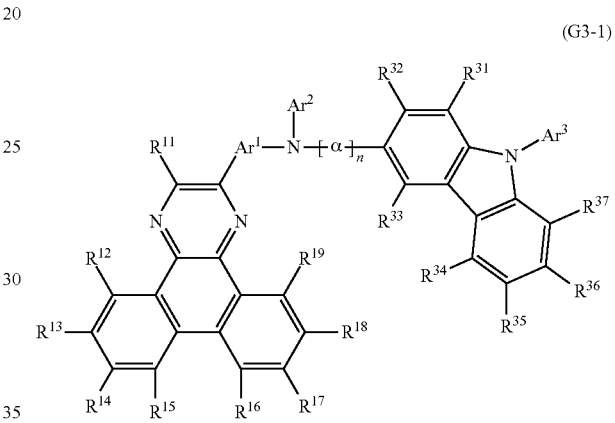

(G3-1)

In General Formula (G3-1), $R^{11}$ to $R^{19}$ and $R^{31}$ to $R^{37}$ separately represent hydrogen, an alkyl group having 1 to 4 carbon atoms, or a substituted or unsubstituted aryl group having 6 to 13 carbon atoms. $Ar^1$ represents a substituted or unsubstituted arylene group having 6 to 13 carbon atoms. $Ar^2$ and $Ar^3$ represent a substituted or unsubstituted aryl group having 6 to 13 carbon atoms. In addition, α represents a substituted or unsubstituted phenylene group or a substituted or unsubstituted biphenyldiyl group; n represents 0 or 1.

In each of the organic compounds represented by General Formulae (G2-1) and (G3-1), $Ar^1$ is preferably a substituted or unsubstituted phenylene group or a substituted or unsubstituted biphenyldiyl group.

In the organic compound represented by General Formula (G2-1), α is preferably a substituted or unsubstituted para-phenylene group. In the organic compound represented by General Formula (G3-1), n is preferably 1 and α is preferably a substituted or unsubstituted para-phenylene group. In each of the organic compounds represented by General Formulae (G2-1) and (G3-1), $Ar^1$ is preferably a substituted or unsubstituted para-phenylene group. In other words, the organic compounds represented by General Formulae (G2-1) and (G3-1) can be represented by General Formulae (G2-2) and (G3-2), respectively. Further, the organic compounds represented by General Formulae (G2-2) and (G3-2) are each one embodiment of the present invention.

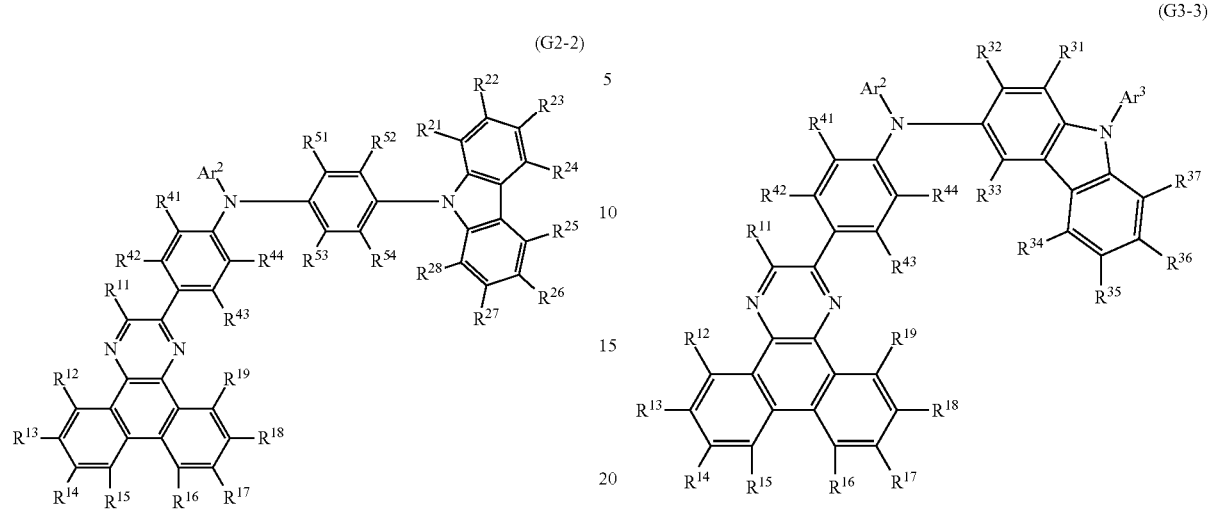

In General Formula (G2-2), $R^{11}$ to $R^{19}$, $R^{21}$ to $R^{28}$, $R^{41}$ to $R^{44}$, and $R^{51}$ to $R^{54}$ separately represent hydrogen, an alkyl group having 1 to 4 carbon atoms, or a substituted or unsubstituted aryl group having 6 to 13 carbon atoms. $Ar^2$ represents a substituted or unsubstituted aryl group having 6 to 13 carbon atoms.

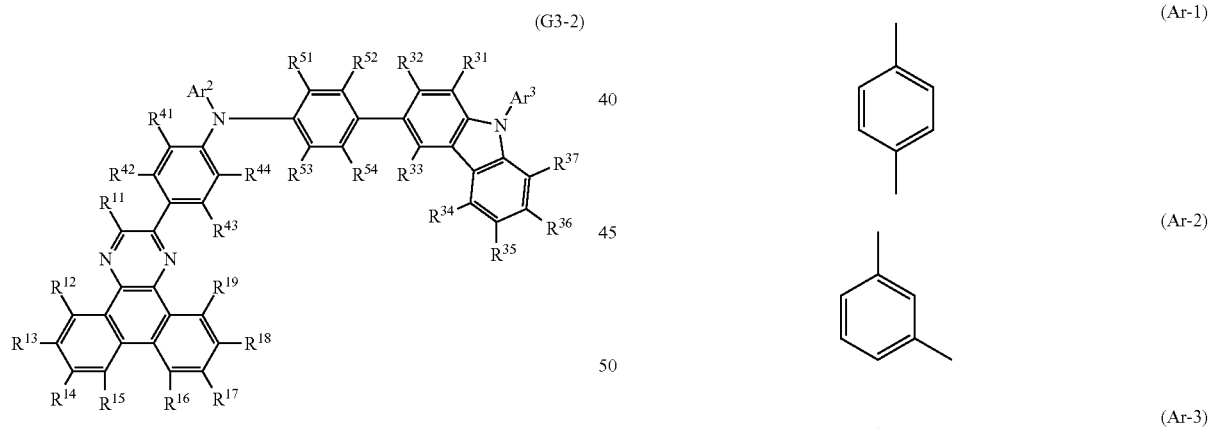

In General Formula (G3-2), $R^{11}$ to $R^{19}$, $R^{31}$ to $R^{37}$, $R^{41}$ to $R^{44}$, and $R^{51}$ to $R^{54}$ separately represent hydrogen, an alkyl group having 1 to 4 carbon atoms, or a substituted or unsubstituted aryl group having 6 to 13 carbon atoms. $Ar^2$ and $Ar^3$ separately represent a substituted or unsubstituted aryl group having 6 to 13 carbon atoms.

Specifically, organic compounds represented by General Formulae (G1) and (G3-1) are preferable as the organic compound represented by General Formula (G3-3). Further, the organic compound represented by General Formula (G3-3) is one embodiment of the present invention.

In General Formula (G3-3), $R^{11}$ to $R^{19}$, $R^{31}$ to $R^{37}$, and $R^{41}$ to $R^{44}$ separately represent hydrogen, an alkyl group having 1 to 4 carbon atoms, or a substituted or unsubstituted aryl group having 6 to 13 carbon atoms. $Ar^2$ and $Ar^3$ separately represent a substituted or unsubstituted aryl group having 6 to 13 carbon atoms.

Specific examples of $Ar^1$ in General Formulae (G1), (G2-1), and (G3-1) are substituents represented by Structural Formulae (Ar-1) to (Ar-15).

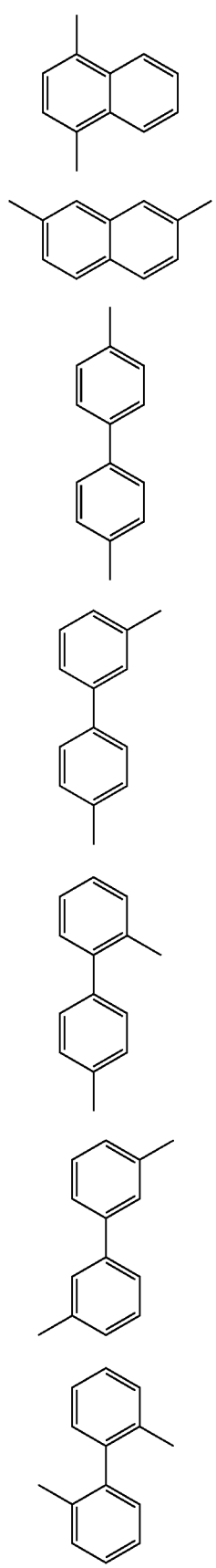
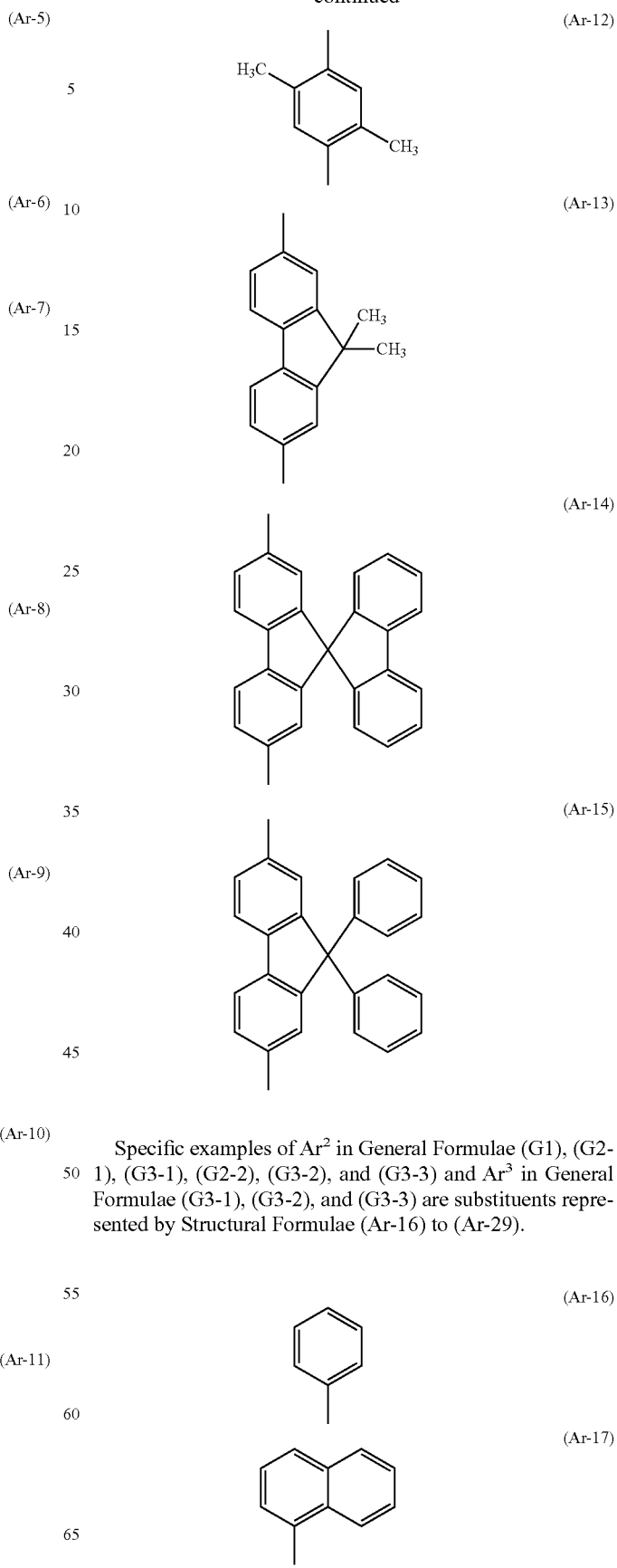
Specific examples of Ar² in General Formulae (G1), (G2-1), (G3-1), (G2-2), (G3-2), and (G3-3) and Ar³ in General Formulae (G3-1), (G3-2), and (G3-3) are substituents represented by Structural Formulae (Ar-16) to (Ar-29).

(Ar-18) 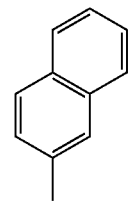
(Ar-19) 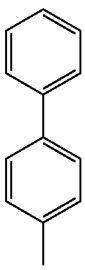
(Ar-20) 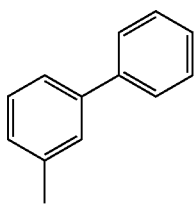
(Ar-21) 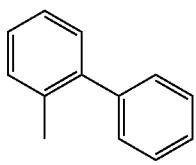
(Ar-22) 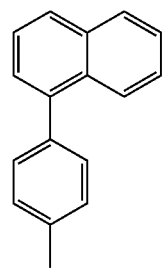
(Ar-23) 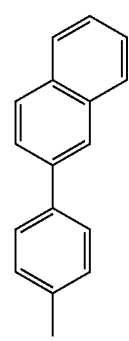
(Ar-24) 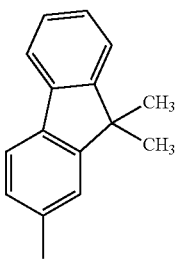
(Ar-25) 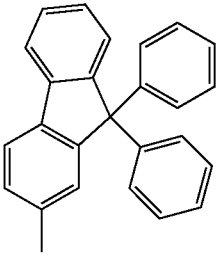
(Ar-26) 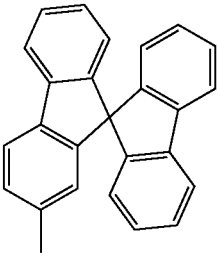
(Ar-27) 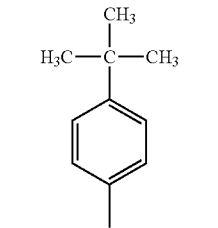
(Ar-28) 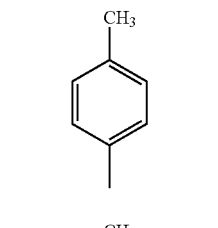
(Ar-29) 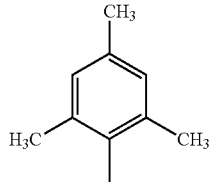
Specific examples of $R^{11}$ to $R^{19}$ in General Formulae (G1), (G2-1), (G3-1), (G2-2), (G3-2), and (G3-3), $R^{21}$ to $R^{28}$ in General Formulae (G2-1) and (G2-2), $R^{31}$ to $R^{37}$ in General Formulae (G3-1), (G3-2), and (G3-3), $R^{41}$ to $R^{44}$ in General Formulae (G2-2), (G3-2), and (G3-3), and $R^{51}$ to $R^{54}$ in General Formulae (G2-2) and (G3-2) are substituents represented by Structural Formulae (R-1) to (R-23).

-continued
(R-1) 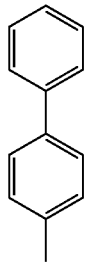
(R-2)
(R-3)
(R-4)
(R-5)
(R-6)
(R-7)
(R-8)
(R-9)
(R-10)
(R-11)
(R-12)
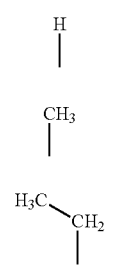
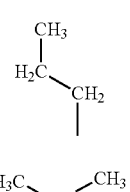
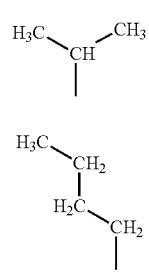
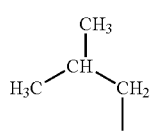
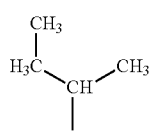
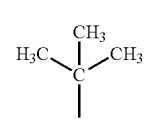
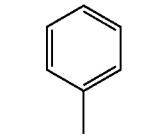
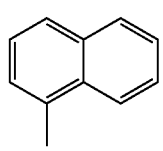
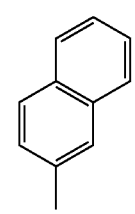
(R-13)
(R-14)
(R-15)
(R-16)
(R-17)
(R-18) 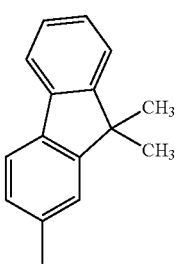

(R-19)
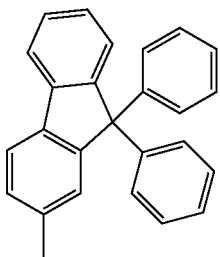
(R-20)
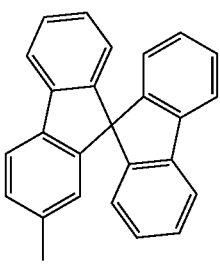
(R-21)
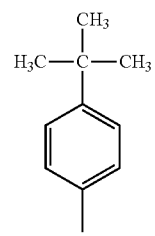
(R-22)
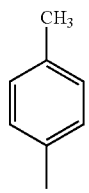
(R-23)
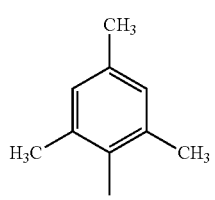
(100)
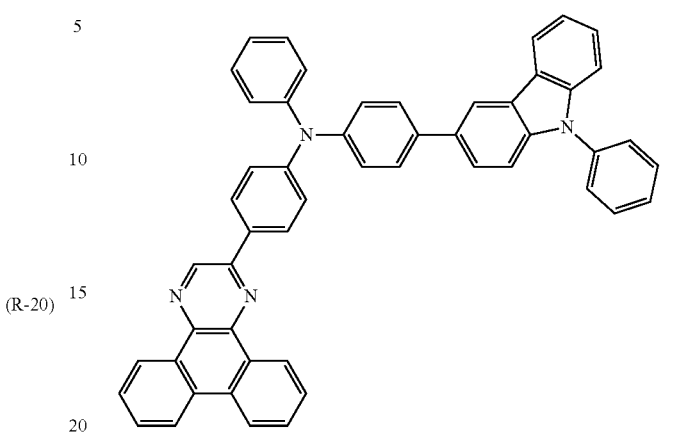
(101)
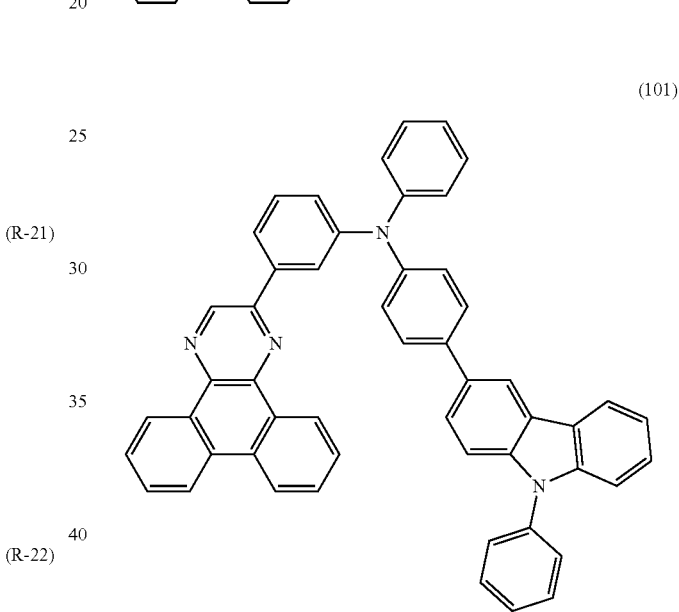
(102)
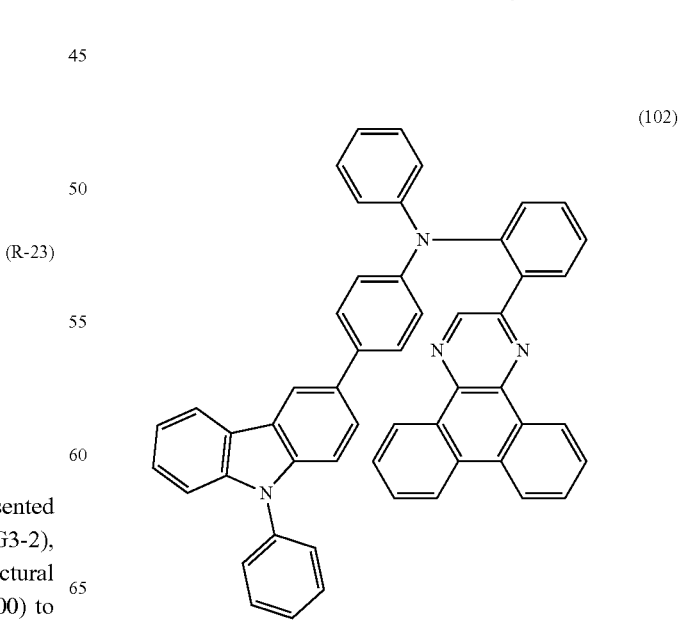
Specific examples of the organic compounds represented by General Formulae (G1), (G2-1), (G3-1), (G2-2), (G3-2), and (G3-3) are organic compounds represented by Structural Formulae (100) to (157) and Structural Formulae (200) to (235).

(103)
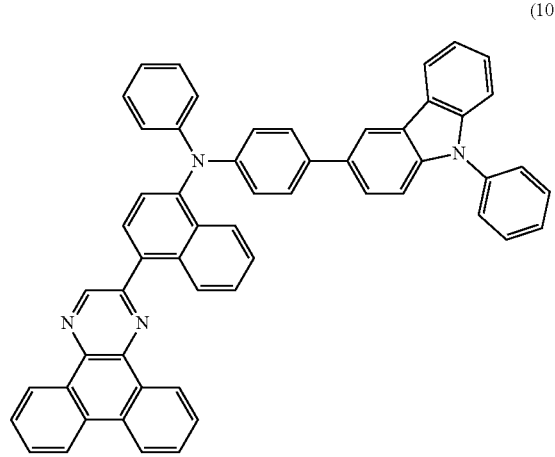
(104)
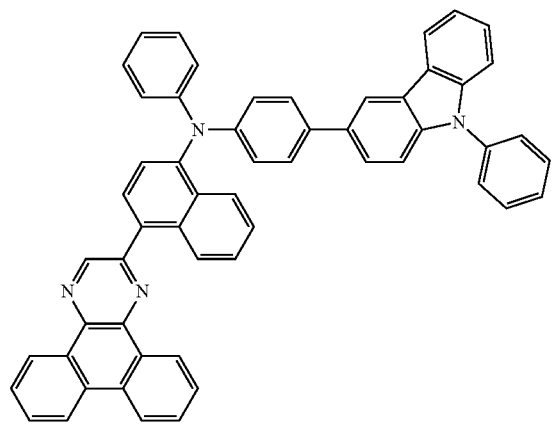
(105)
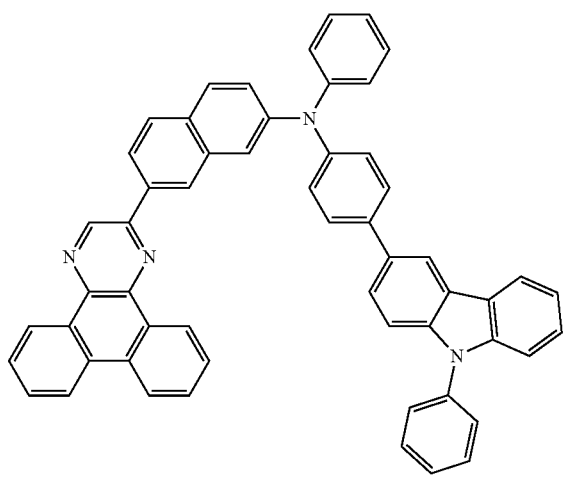
(106)
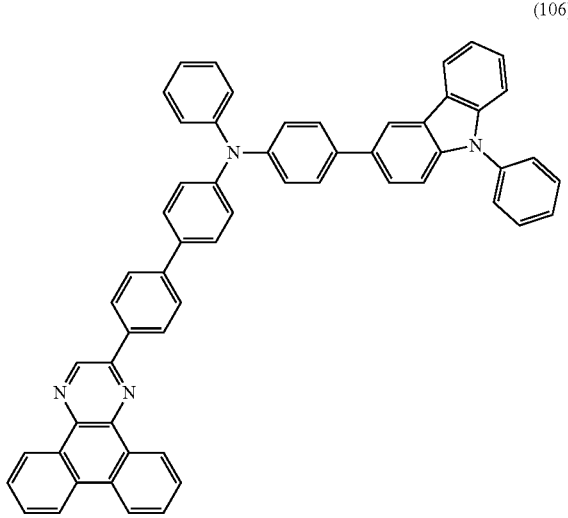
(107)
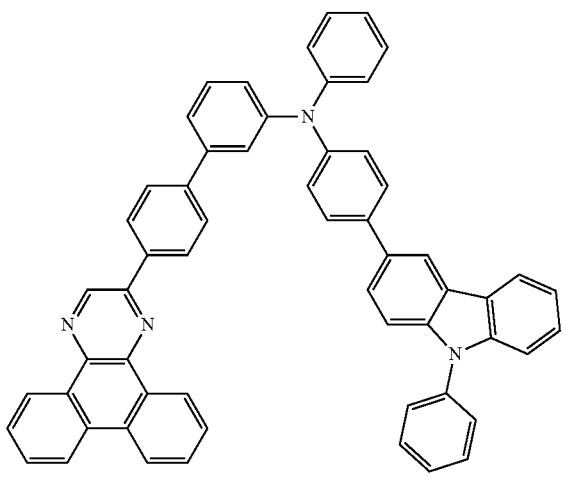
(108)
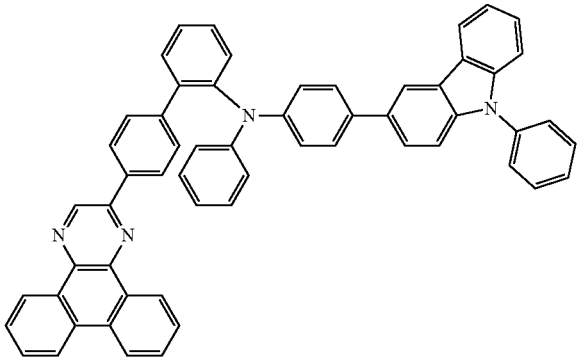

(109)
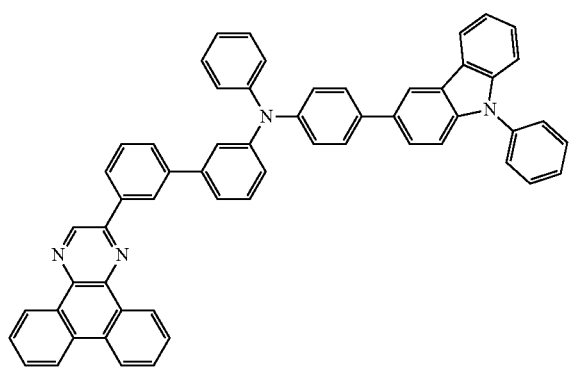
(110)
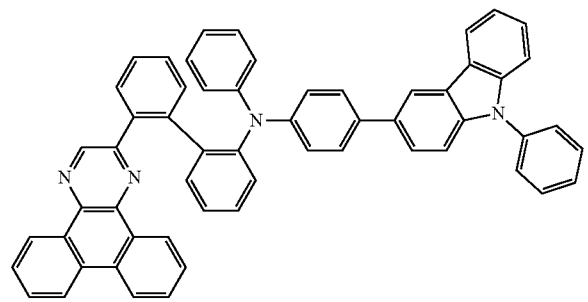
(111)
(112)
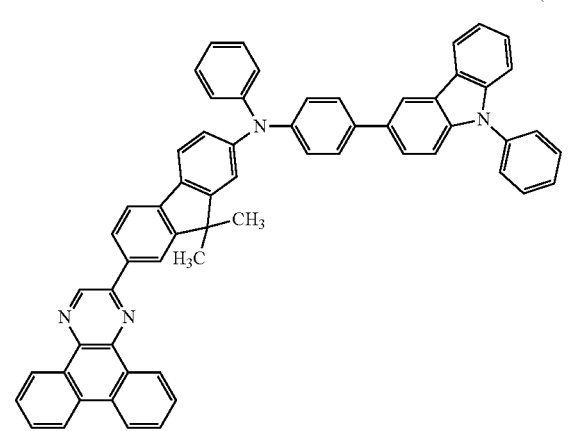
(113)
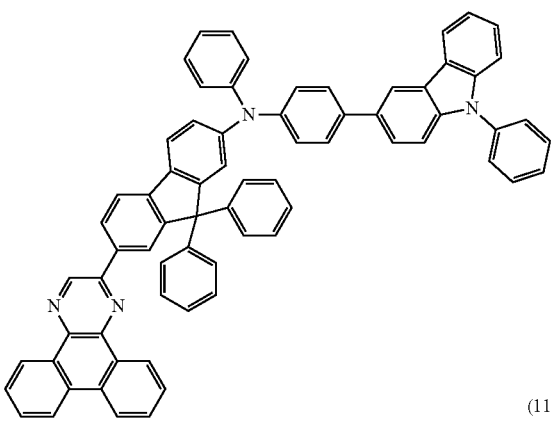
(114)
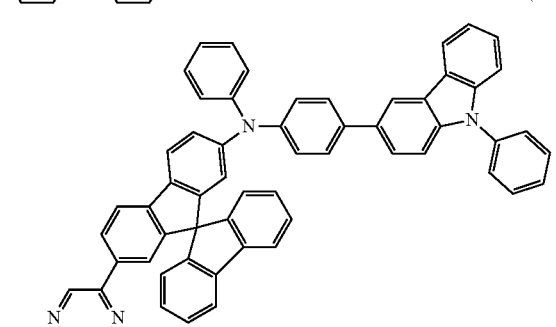
(115)
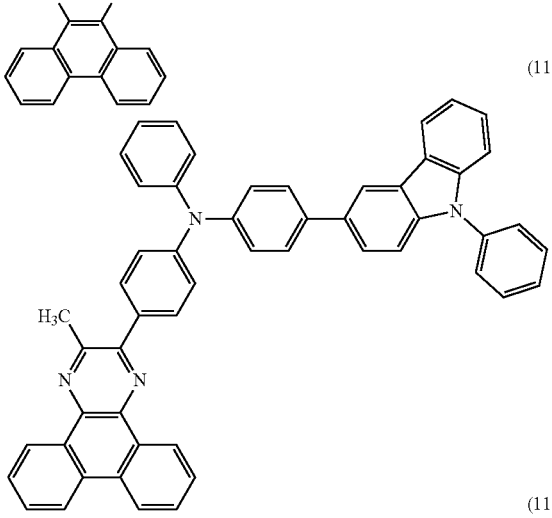
(116)
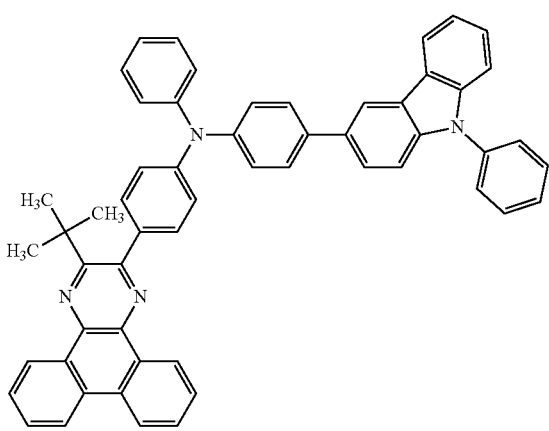

(117)
(118)
(119)
(120)
(121)
(122)
(123)
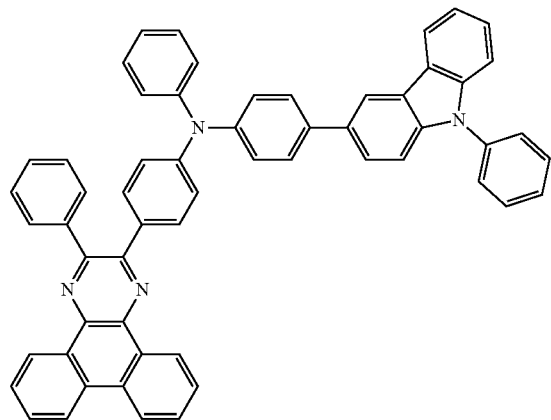
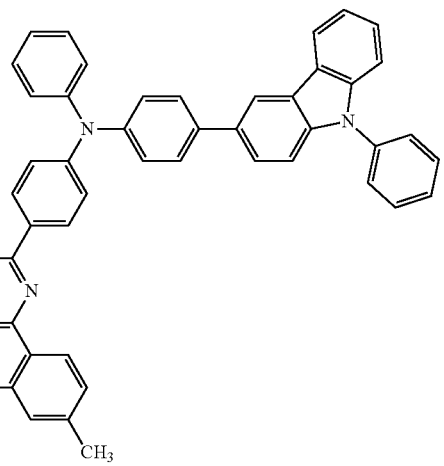
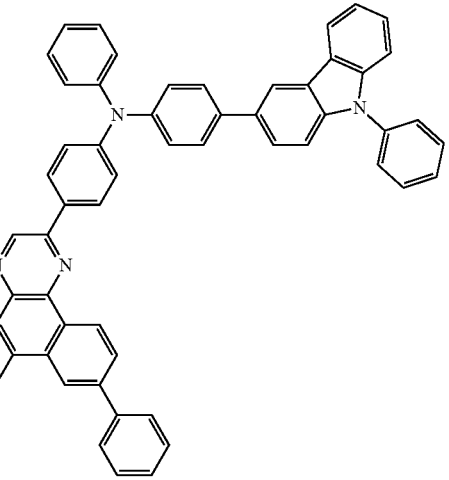
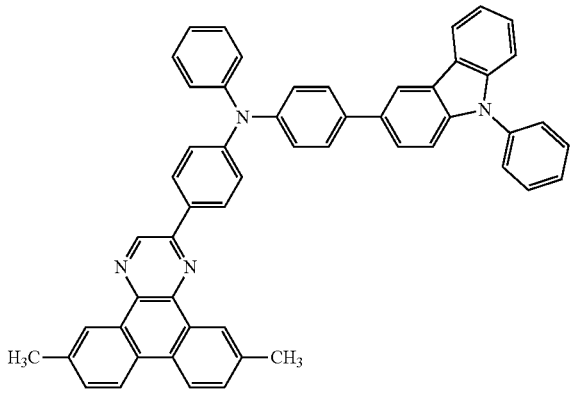
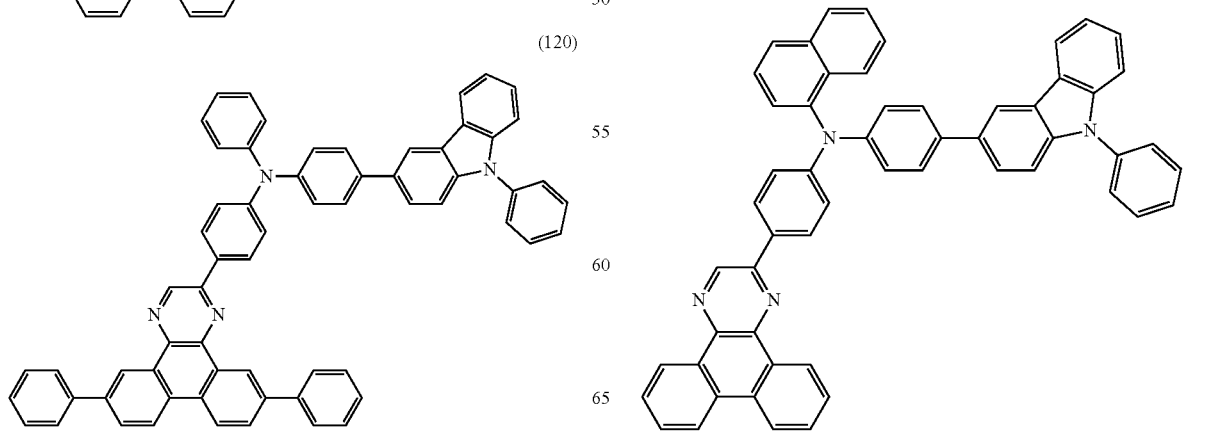

(124)
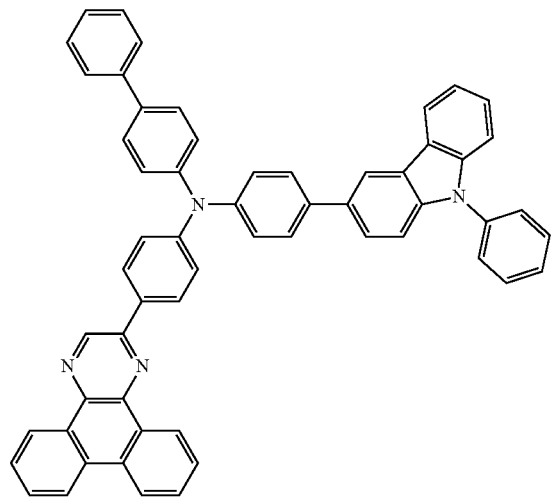
(125)
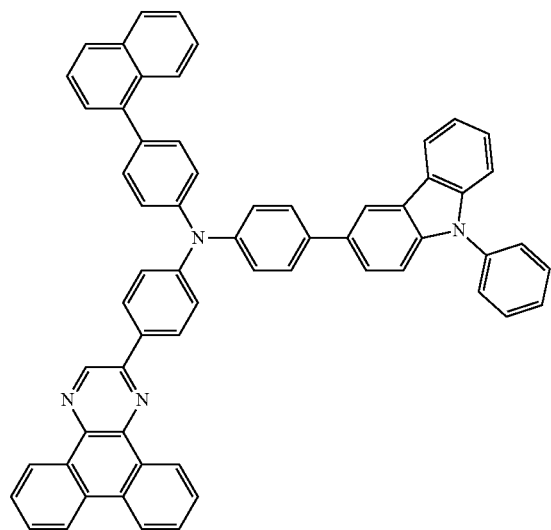
(126)
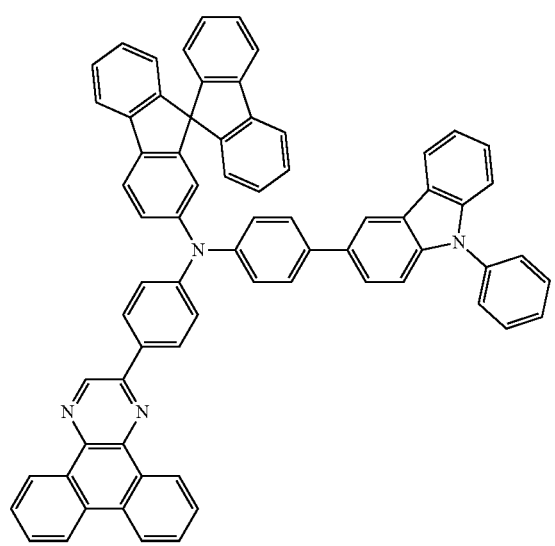
(127)
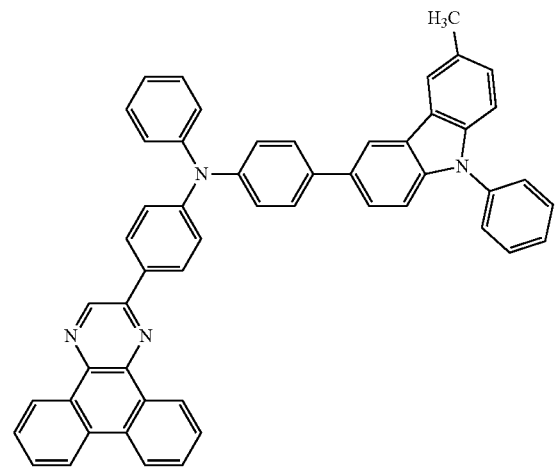
(128)
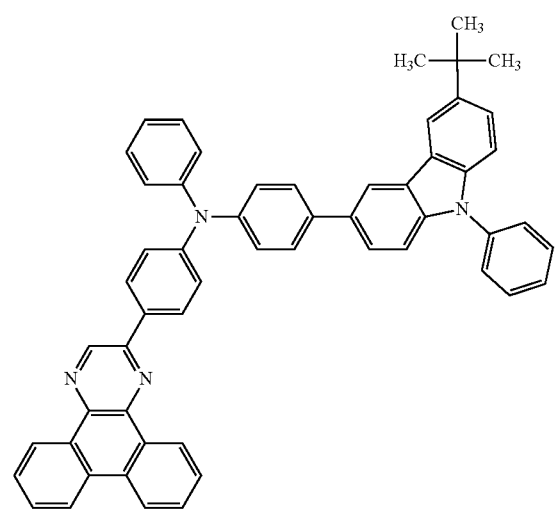
(129)
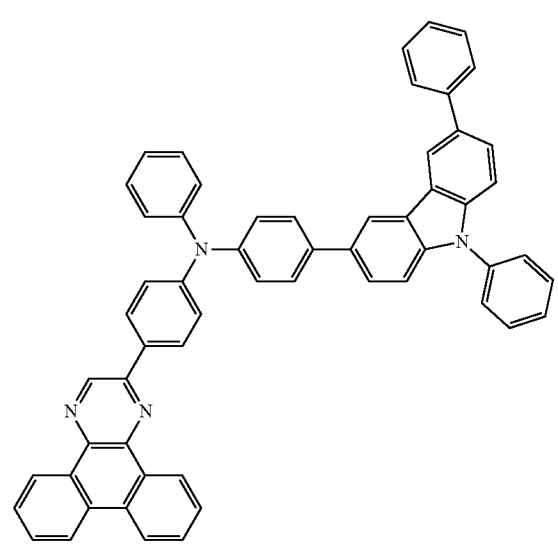

(130)
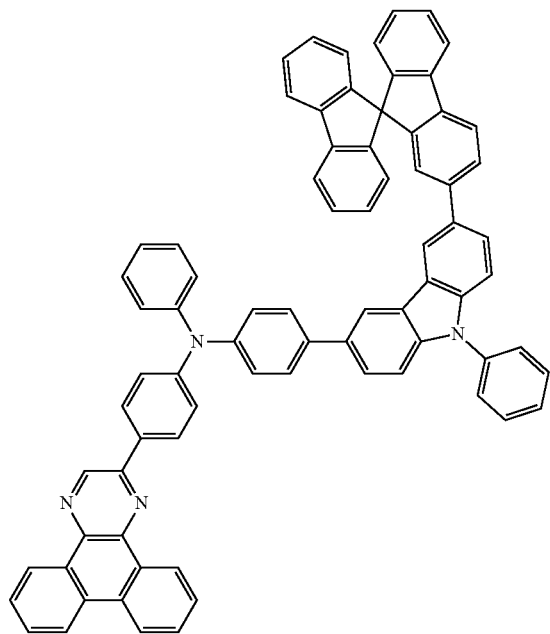
(131)
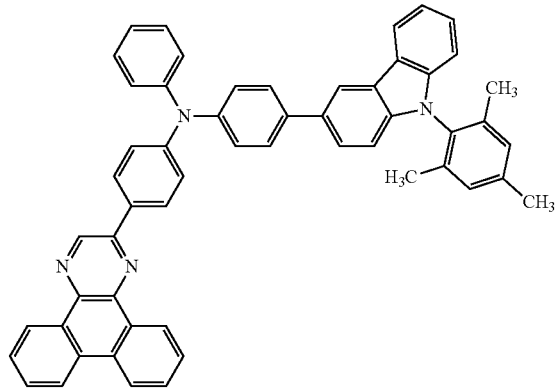
(132)
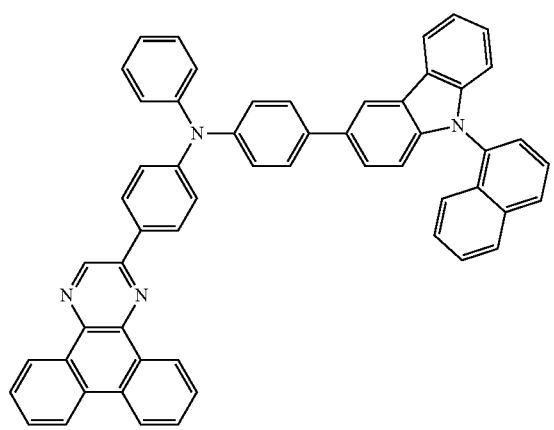
(133)
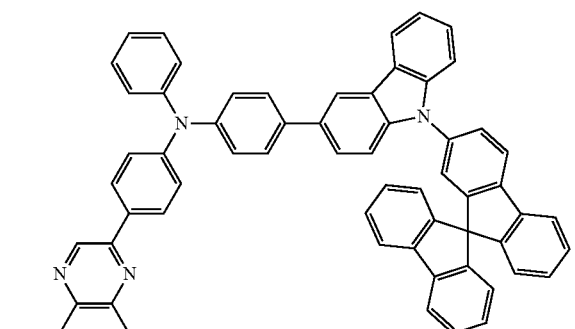
(134)
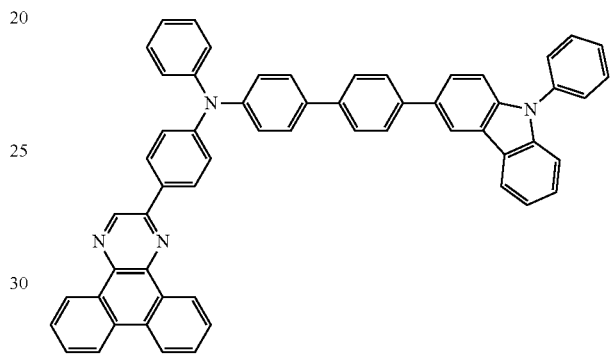
(135)
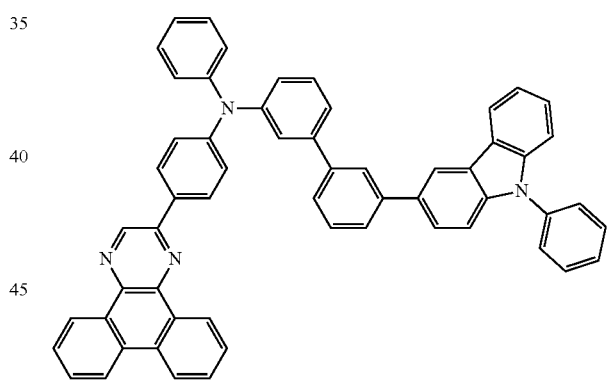
(136)
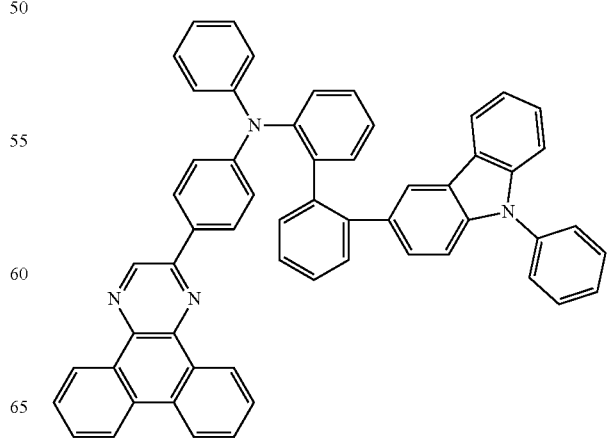

(137)
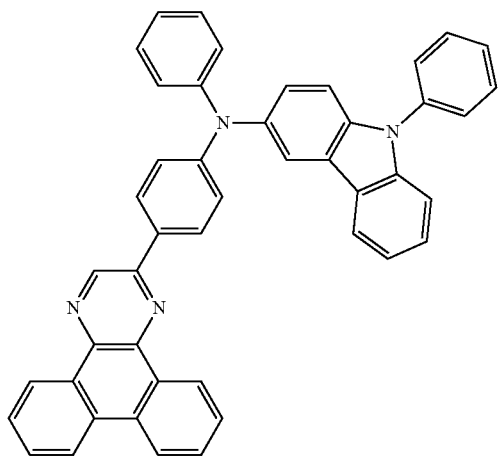
(138)
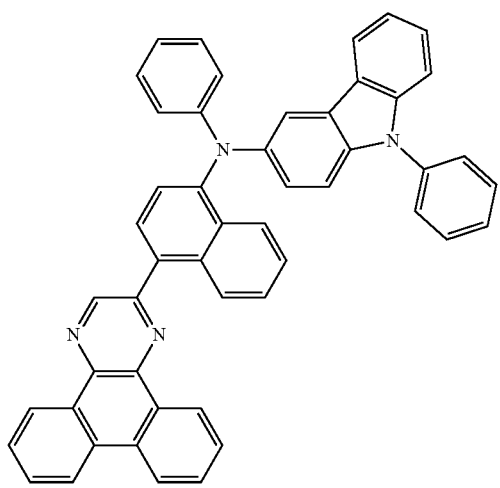
(139)
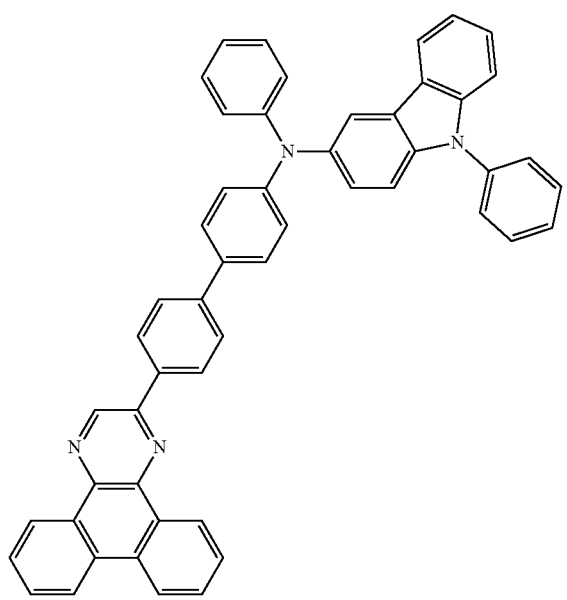
(140)
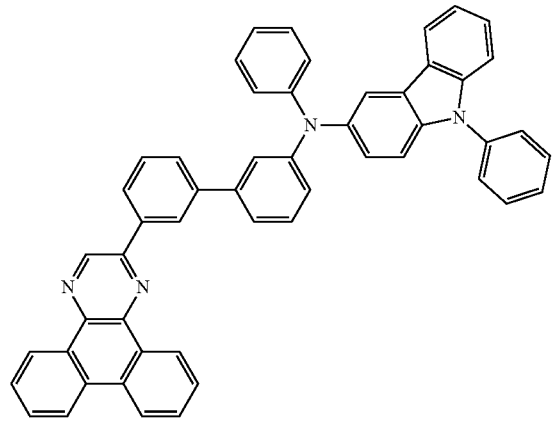
(141)
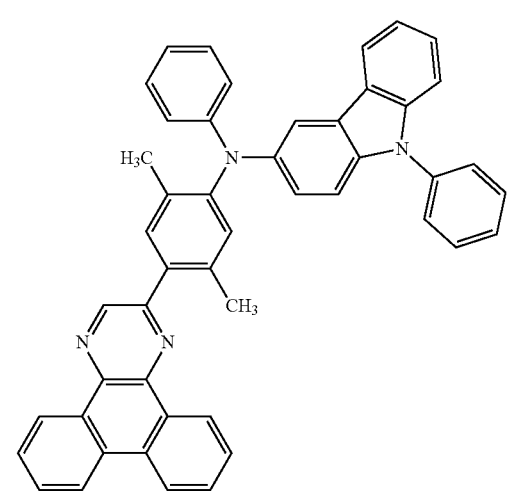
(142)
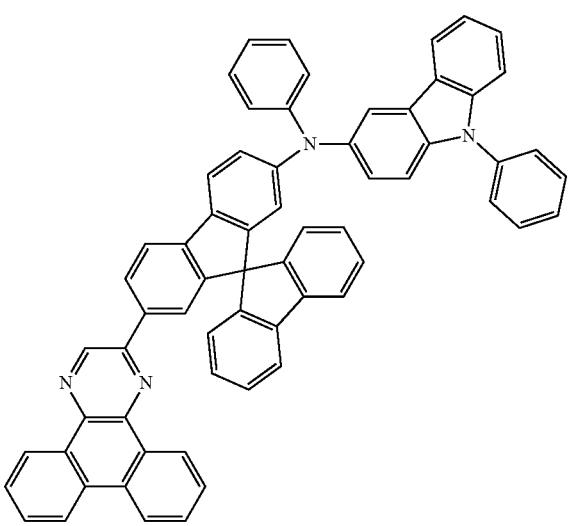

-continued
(143)
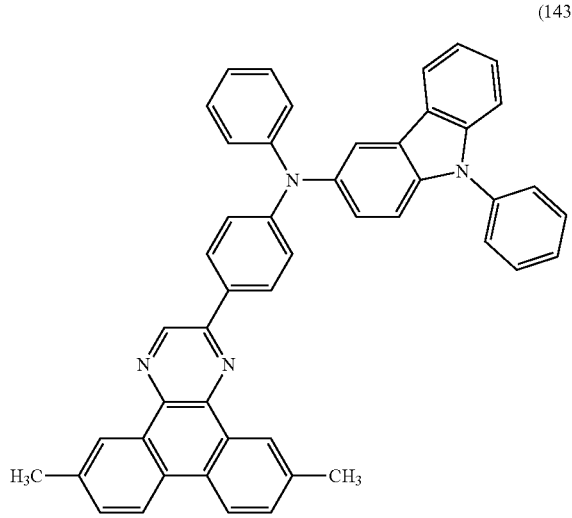
(144)
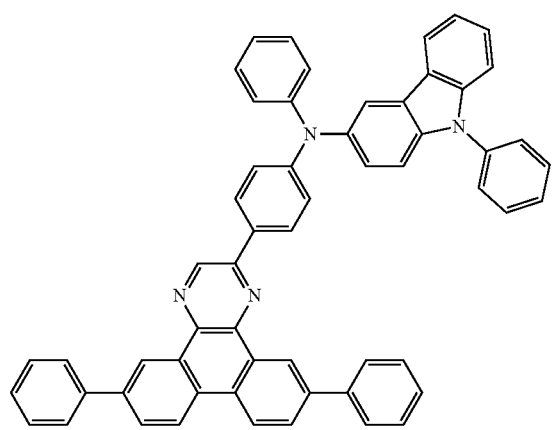
(145)
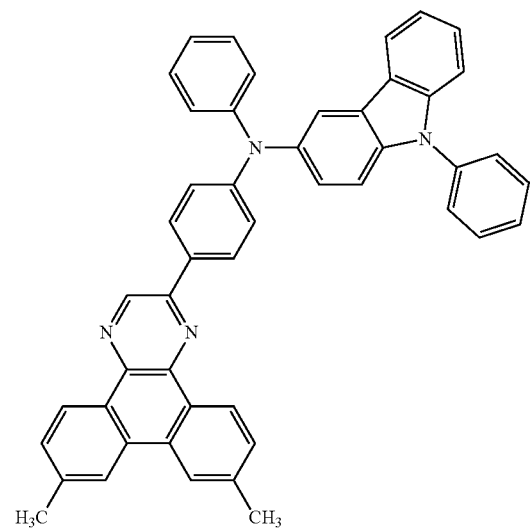
-continued
(146)
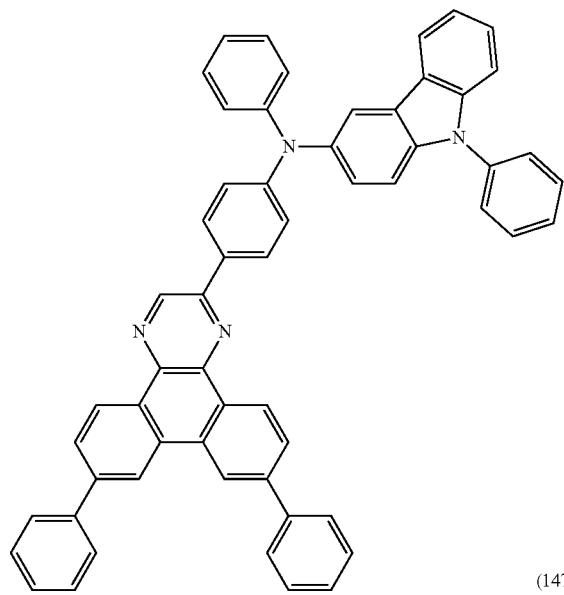
(147)
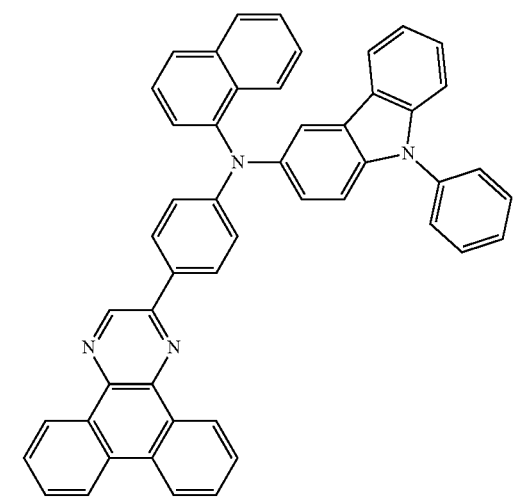
(148)
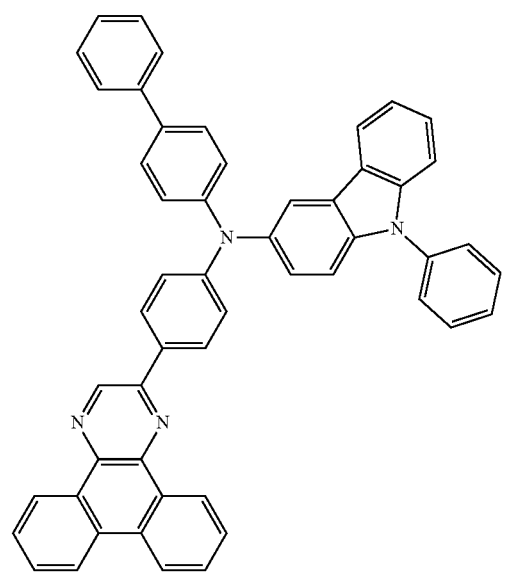

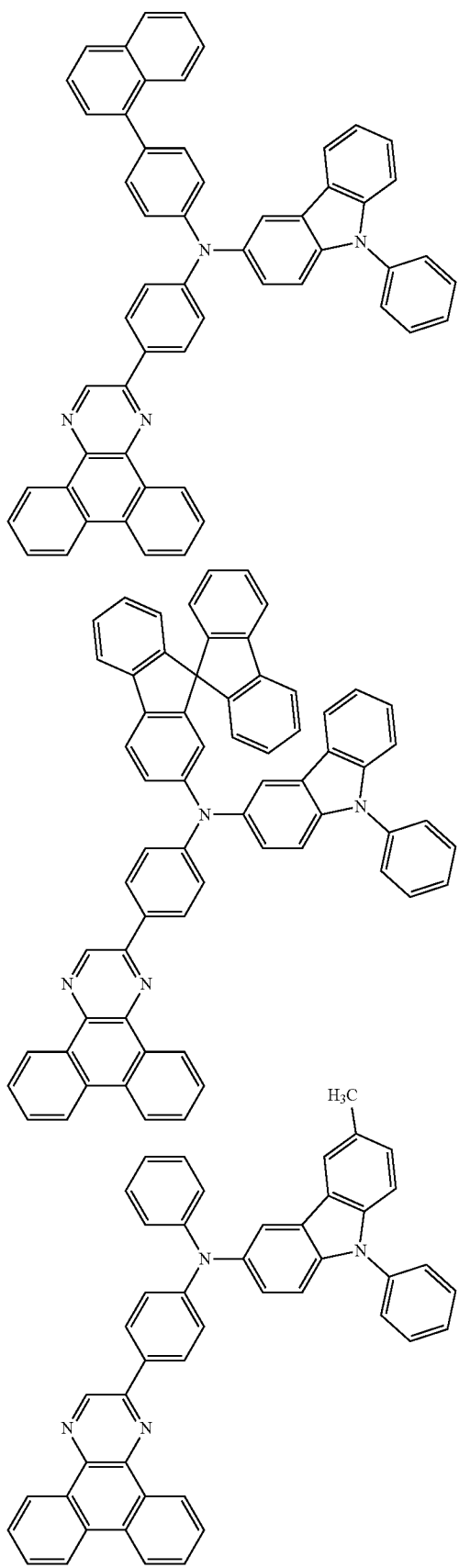
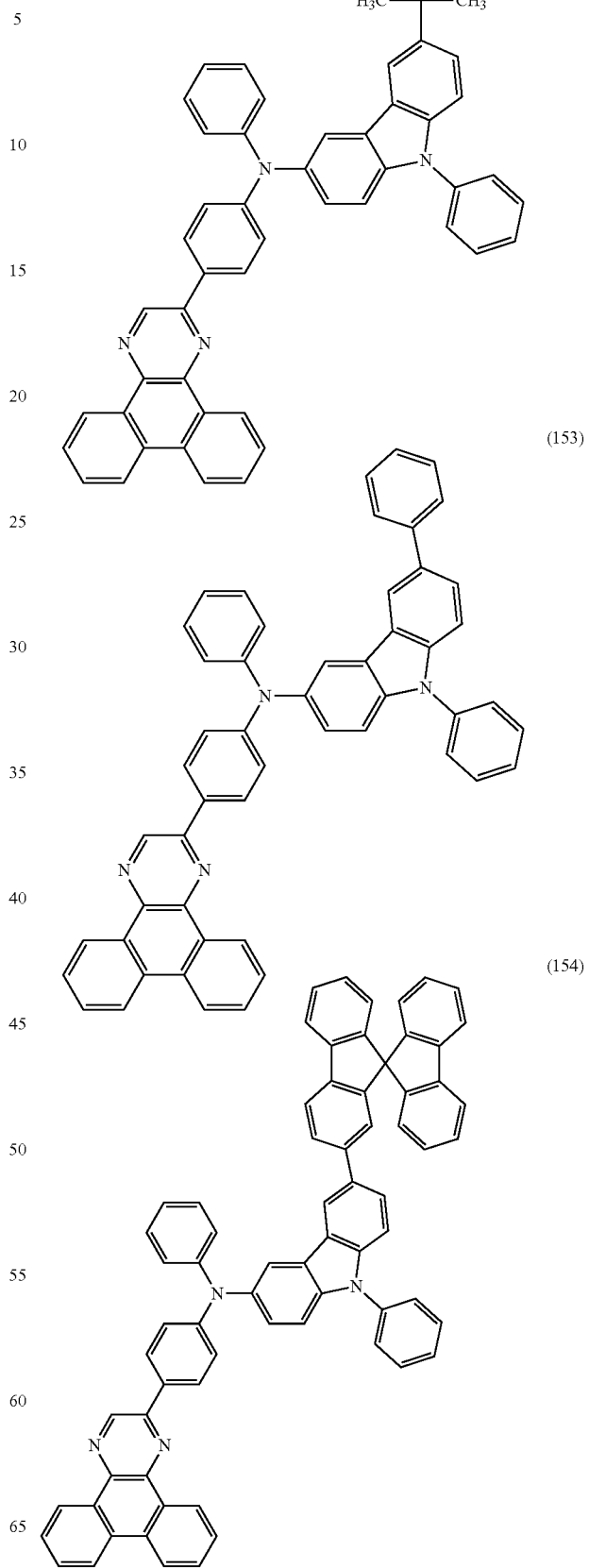

(155)
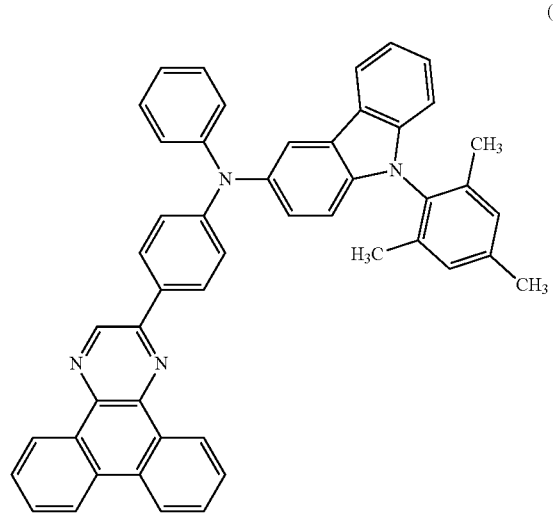
(200)
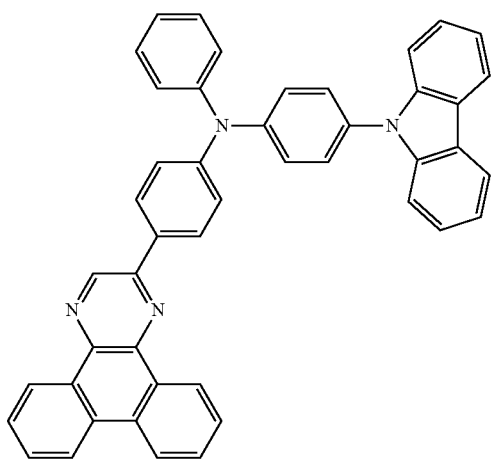
(156)
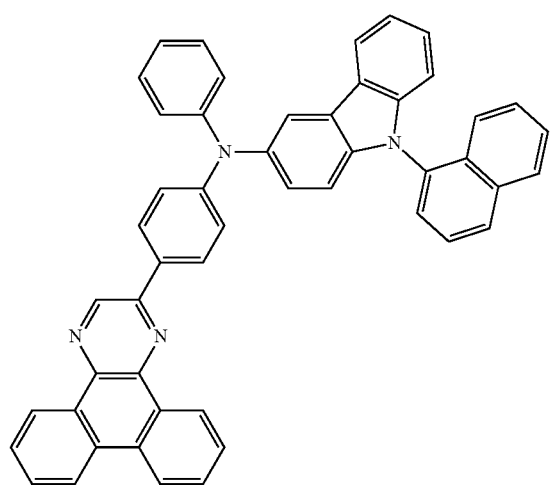
(201)
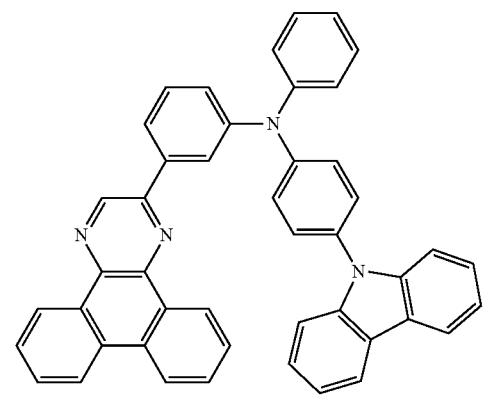
(157)
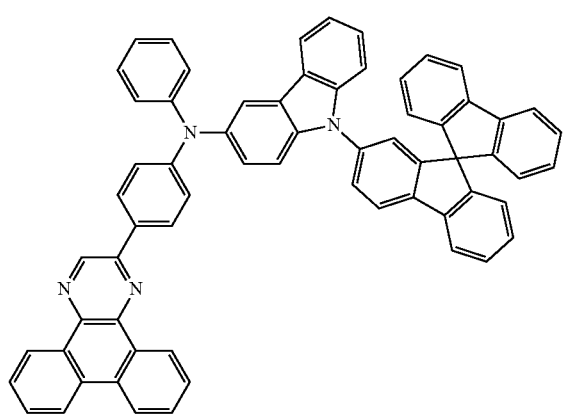
(202)
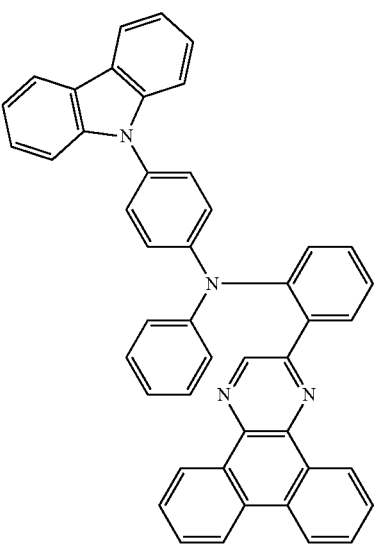

-continued
(203)
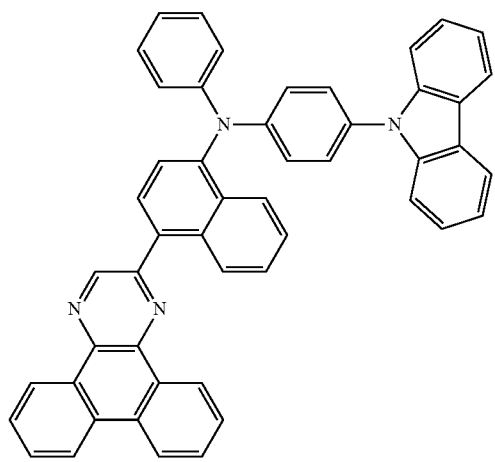
(204)
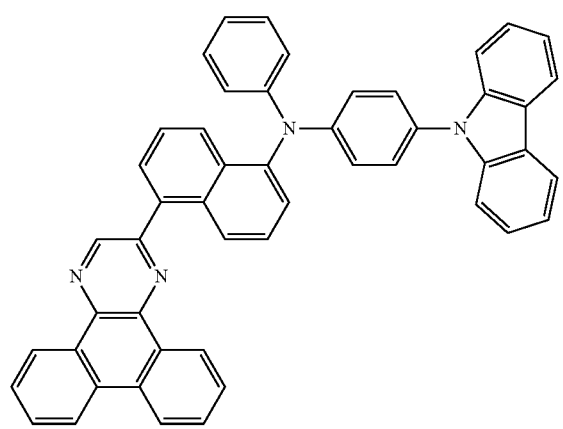
(205)
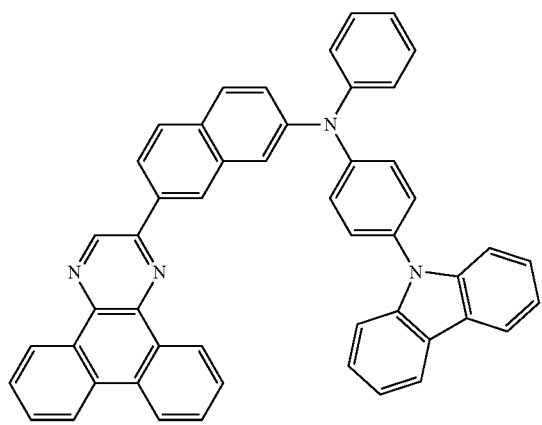
-continued
(206)
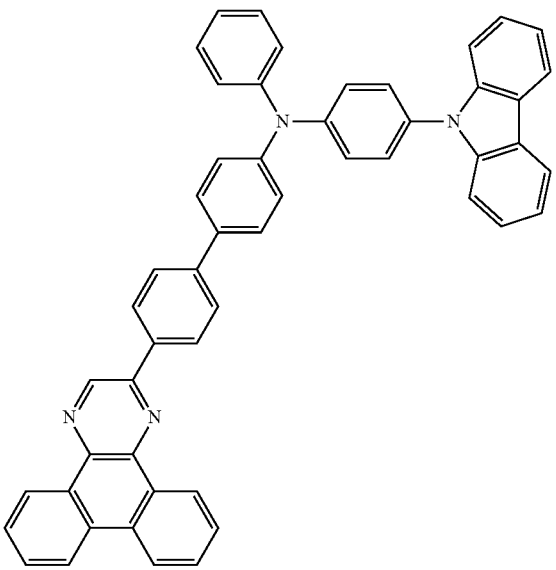
(207)
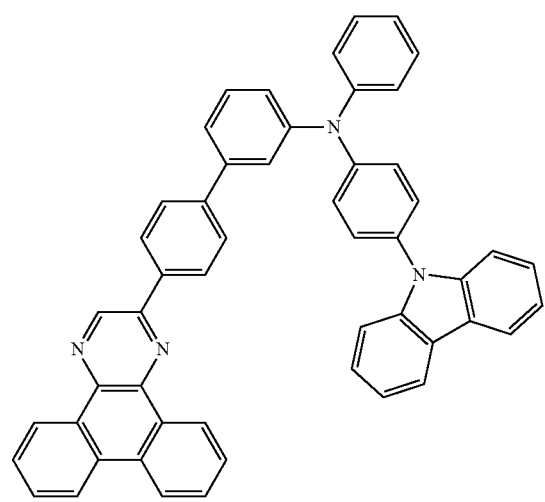
(208)
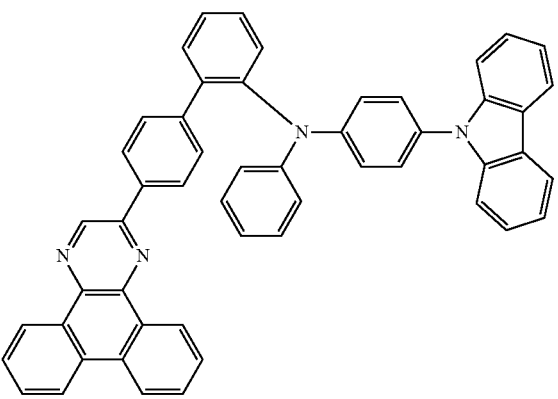

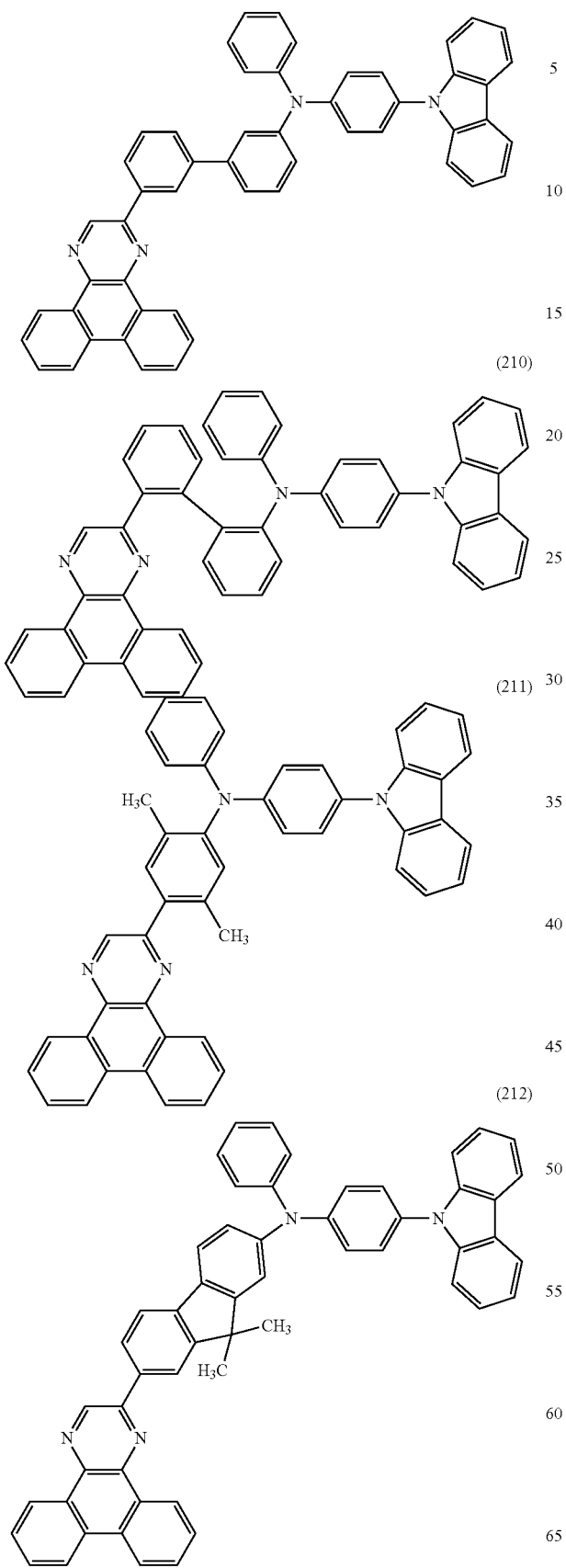

(216)
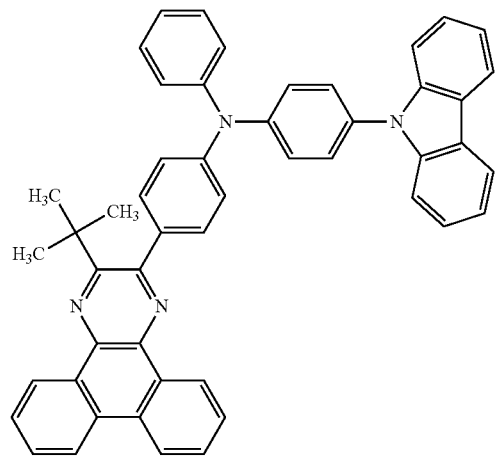
(217)
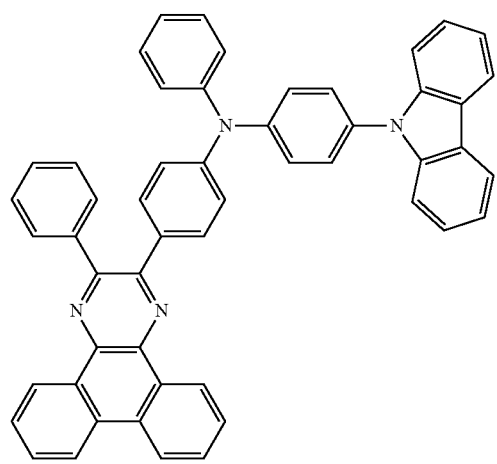
(218)
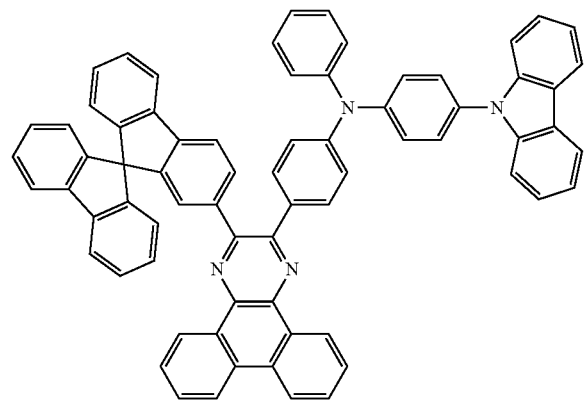
(219)
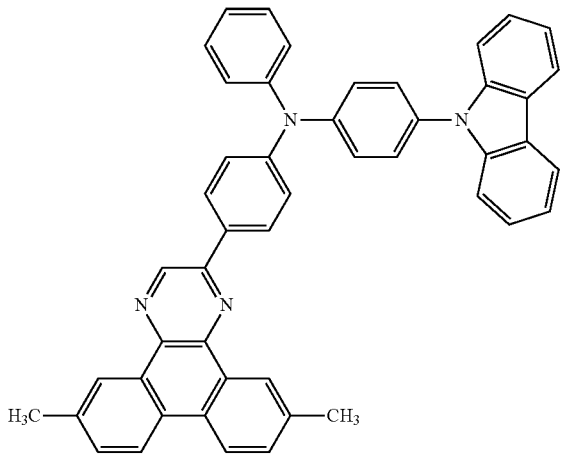
(220)
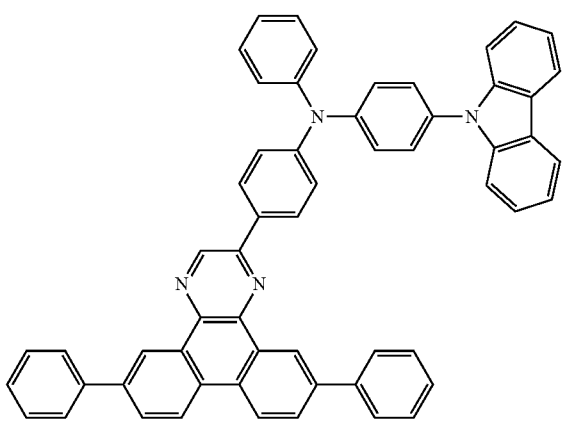
(221)
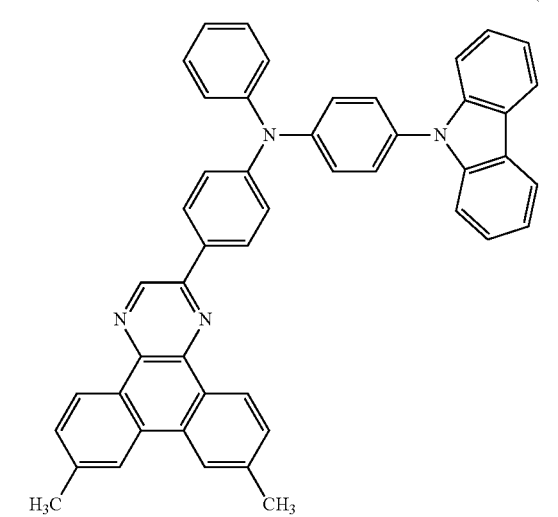

(222)
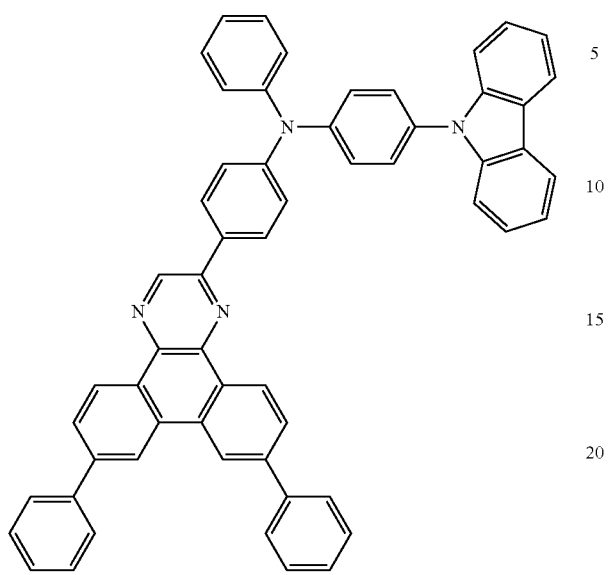
(223)
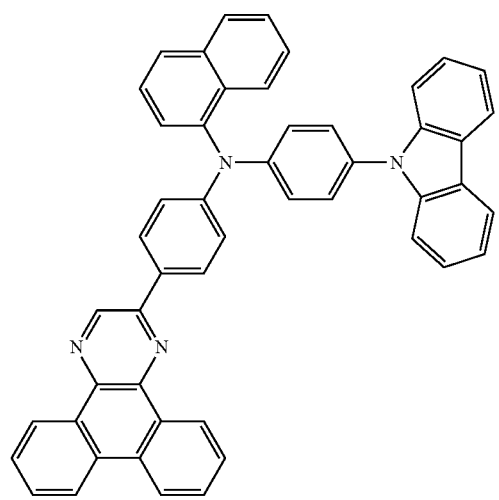
(224)
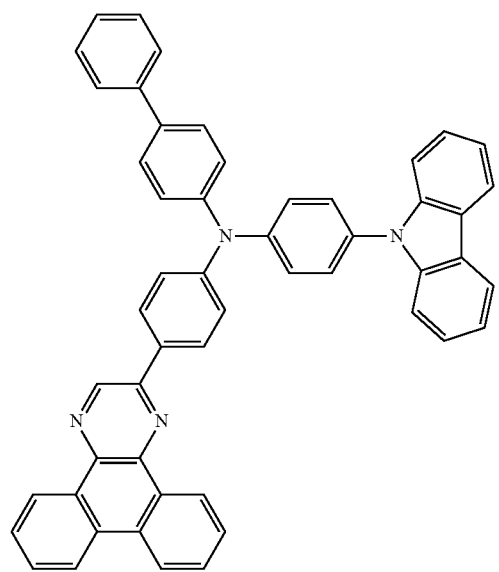
(225)
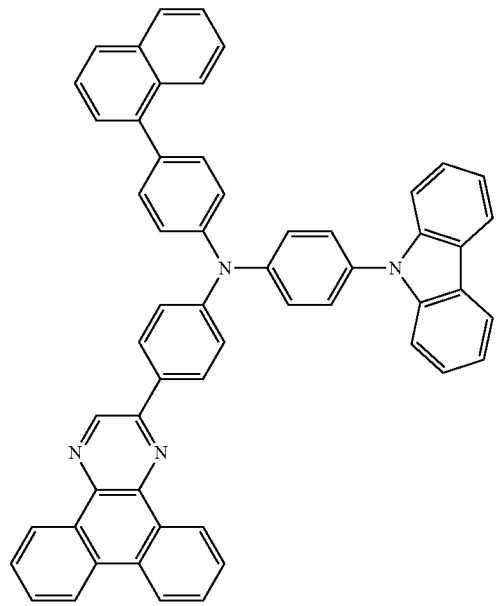
(226)
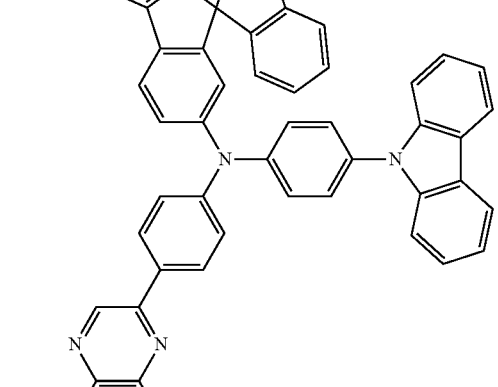
(227)
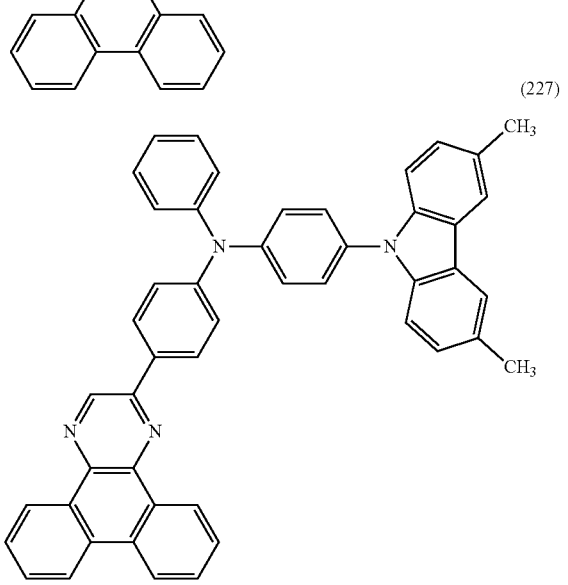

(228)
(229)
(230)
(231)
(232)
(233)
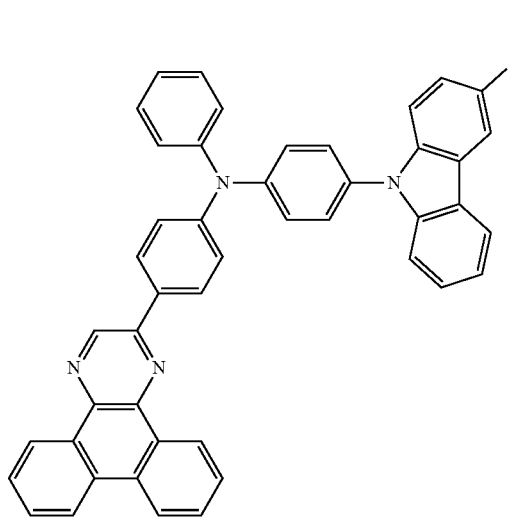
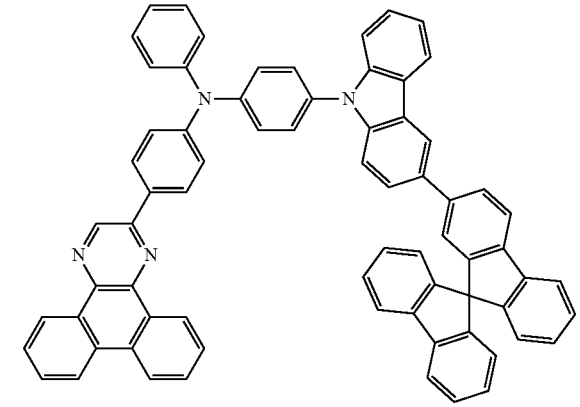
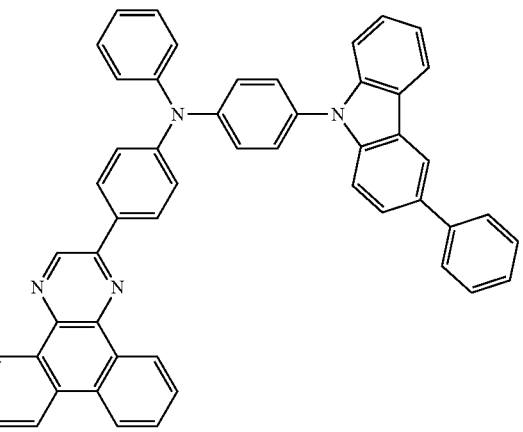
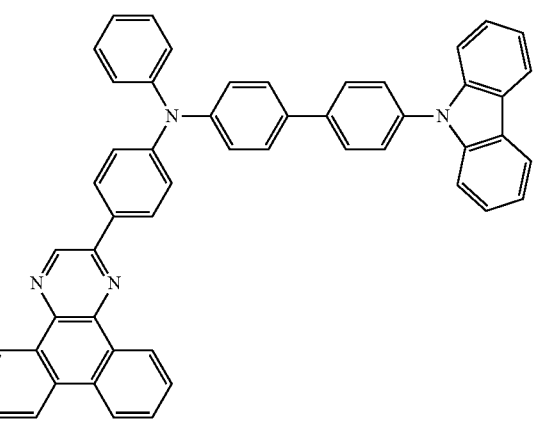

-continued (234)

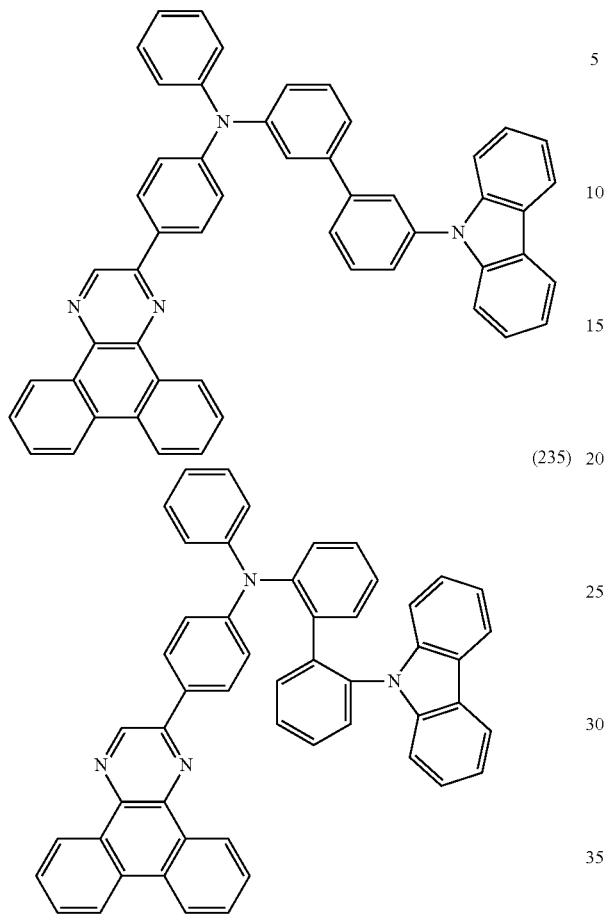

(235)

A variety of reactions can be applied to a synthesis method of the organic compound of one embodiment of the present invention. For example, synthesis reactions described below enable the synthesis of the organic compound represented by General Formula (G1). Note that the synthesis method of the organic compound is not limited to the synthesis method below.

<Synthesis Method of Organic Compound Represented by General Formula (G1)>

First, Synthesis Scheme (A-1) is described below. As shown in Synthesis Scheme (A-1), a halide of a dibenzo[f,h] quinoxaline derivative (Compound 1) and an organoboron compound of an amine derivative or boronic acid of an amine derivative (Compound 2) are coupled by Suzuki-Miyaura Coupling, whereby the organic compound represented by General Formula (G1), which is a target compound, can be synthesized.

(A-1)

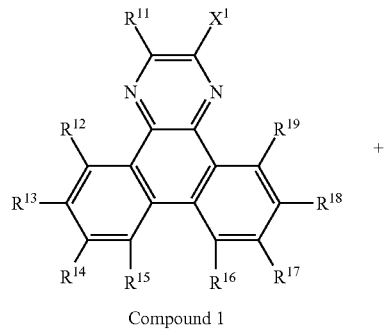

Compound 1

+

-continued

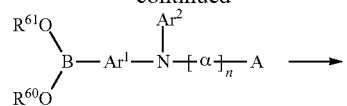

Compound 2

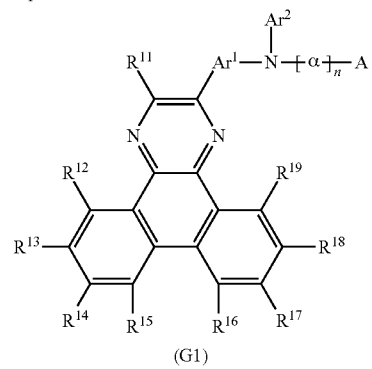

(G1)

In Synthesis Scheme (A-1), $R^{11}$ to $R^{19}$ separately represent hydrogen, an alkyl group having 1 to 4 carbon atoms, or a substituted or unsubstituted aryl group having 6 to 13 carbon atoms, and $R^{60}$ and $R^{61}$ separately represent any of hydrogen or an alkyl group having 1 to 6 carbon atoms. In the synthesis scheme (A-1), $R^{60}$ and $R^{61}$ may be bonded to each other to form a ring. $X^1$ represents a halogen or a triflate group. $Ar^1$ represents a substituted or unsubstituted arylene group having 6 to 13 carbon atoms. $Ar^2$ represents a substituted or unsubstituted aryl group having 6 to 13 carbon atoms. In addition, α represents a substituted or unsubstituted phenylene group or a substituted or unsubstituted biphenyldiyl group; n represents 0 or 1; A represents substituted or unsubstituted 9H-carbazol-9-yl group or a substituted or unsubstituted 9-aryl-9H-carbazol-3-yl group.

Examples of a palladium catalyst which can be used in Synthesis Scheme (A-1) include, but not limited to, palladium(II) acetate, tetrakis(triphenylphosphine)palladium(0), bis(triphenylphosphine)palladium(II) dichloride, and the like.

Examples of a ligand of the palladium catalyst which can be used in Synthesis Scheme (A-1) include, but not limited to, tri(ortho-tolyl)phosphine, triphenylphosphine, tricyclohexylphosphine, and the like.

Examples of a base which can be used in Synthesis Scheme (A-1) include, but not limited to, an organic base such as sodium tert-butoxide and an inorganic base such as potassium carbonate and sodium carbonate.

Examples of a solvent which can be used in Synthesis Scheme (A-1) include, but not limited to, a mixed solvent of toluene and water; a mixed solvent of toluene, alcohol such as ethanol, and water; a mixed solvent of xylene and water; a mixed solvent of xylene, alcohol such as ethanol, and water; a mixed solvent of benzene and water; a mixed solvent of benzene, alcohol such as ethanol, and water; and a mixed solvent of an ether such as ethylene glycol dimethyl ether and water. Note that a mixed solvent of toluene and water; a mixed solvent of toluene, ethanol, and water; or a mixed solvent of water and ether such as ethylene glycol dimethyl ether is more preferable.

As the coupling reaction shown in Synthesis Scheme (A-1), the Suzuki-Miyaura reaction using the organoboron compound or the boronic acid represented by Compound 2 may be replaced with a cross coupling reaction using an organoaluminum compound, an organozirconium compound, an organozinc compound, an organotin compound, or the like. However, the present invention is not limited thereto.

In the coupling reaction shown in Synthesis Scheme (A-1), an organoboron compound of a dibenzo[f,h]quinoxaline derivative or boronic acid of a dibenzo[f,h]quinoxaline derivative may be coupled with a halide of an amine derivative or an amine derivative which has a triflate group as a substituent by the Suzuki-Miyaura reaction.

Further, as shown in Synthesis Scheme (A-2), a halide of a dibenzo[f,h]quinoxaline derivative (Compound 3) and an amine derivative (Compound 4) are coupled using a metal catalyst, a metal, or a metal compound in the presence of a base, whereby the organic compound represented by General Formula (G1), which is a target compound, can be synthesized.

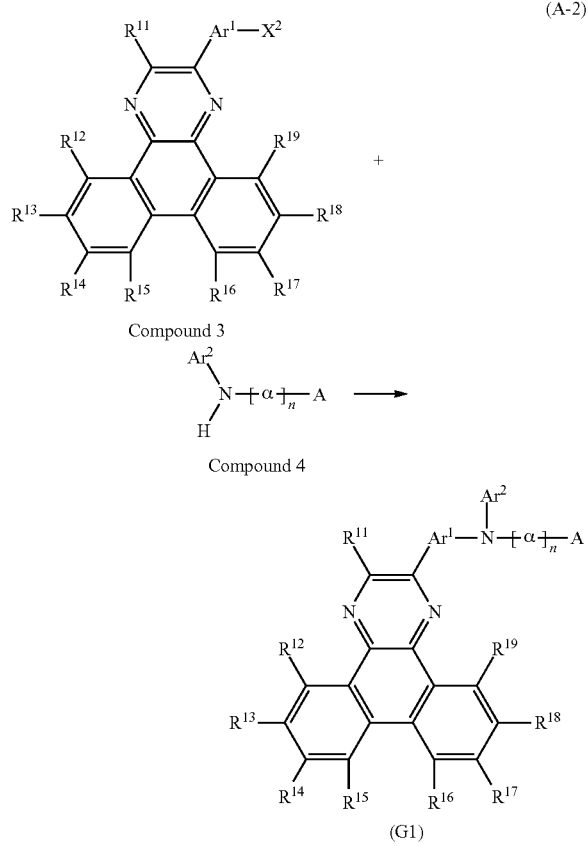

In Synthesis Scheme (A-2), $R^{11}$ to $R^{19}$ separately represent hydrogen, an alkyl group having 1 to 4 carbon atoms, or a substituted or unsubstituted aryl group having 6 to 13 carbon atoms. $X^2$ represents a halogen or a triflate group, and the halogen is preferably iodine or bromine. $Ar^1$ represents a substituted or unsubstituted arylene group having 6 to 13 carbon atoms. $Ar^2$ represents a substituted or unsubstituted aryl group having 6 to 13 carbon atoms. In addition, α represents a substituted or unsubstituted phenylene group or a substituted or unsubstituted biphenyldiyl group; n represents 0 or 1; A represents substituted or unsubstituted 9H-carbazol-9-yl group or a substituted or unsubstituted 9-aryl-9H-carbazol-3-yl group.

In the case where the Buchwald-Hartwig reaction is performed in Synthesis Scheme (A-2), examples of a palladium catalyst which can be used include, but not limited to, bis(dibenzylideneacetone)palladium(0) and palladium(II) acetate.

Examples of a ligand in the palladium catalyst which can be used in Synthesis Scheme (A-2) include, but not limited to, tri(tert-butyl)phosphine, tri(n-hexyl)phosphine, and tricyclohexylphosphine.

Examples of a base which can be used in Synthesis Scheme (A-2) include, but not limited to, an organic base such as sodium tert-butoxide and an inorganic base such as potassium carbonate.

Examples of a solvent which can be used in Synthesis Scheme (A-2) include, but not limited to, toluene, xylene, benzene, and tetrahydrofuran.

Other than the Hartwig-Buchwald reaction, the Ullmann reaction or the like may be used, and the reaction is not limited to these.

Thus, the organic compound of one embodiment of the present invention can be synthesized.

Note that in the case where the light-emitting layer 113 contains the above-described organic compound (host material) and a phosphorescent compound (guest material), the light-emitting layer 113 can emit phosphorescence with high emission efficiency.

Although the light-emitting element containing a phosphorescent compound is described in this embodiment, the present invention is not limited thereto. In the organic compound of one embodiment of the present invention, a dibenzo[f,h]quinoxaline skeleton and an amino group having two substituents are bonded to each other through an arylene group. The substituents are separately an aryl group or a heteroaryl group. Further, the organic compound of one embodiment of the present invention has a high $T_1$ level and thus also has a high singlet excited energy level ($S_1$ level). Thus, the organic compound of one embodiment of the present invention can also be used as a host material for a material emitting fluorescence in the visible light region.

Plural kinds of substances can be used as the substances (host materials) in which the light-emitting substance (guest material) is dispersed. Thus, the light-emitting layer 113 may contain a second host material (also referred to as assist material) in addition to the organic compound of one embodiment of the present invention. Note that the organic compound of one embodiment of the present invention may be used as the second host material (assist material).

Examples of the second host material include the materials used for the hole-transport layer 112.

The electron-transport layer 114 is a layer containing a substance having a high electron-transport property. For the electron-transport layer 114, a metal complex such as $Alq_3$, tris(4-methyl-8-quinolinolato)aluminum (abbreviation: $Almq_3$), bis(10-hydroxybenzo[h]quinolinato)beryllium (abbreviation: $BeBq_2$), BAlq, $Zn(BOX)_2$, or bis[2-(2-hydroxyphenyl)benzothiazolato]zinc (abbreviation: $Zn(BTZ)_2$) can be used. Further, a heteroaromatic compound such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), or 4,4'-bis(5-methylbenzoxazol-2-yl)stilbene (abbreviation: BzOs) can be used. Further, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py) or poly[(9,9-dioctylfluorene-2,7-diyl)-co-(2,2'-bipyridine-6,6'-diyl)] (abbreviation: PF-BPy) can be used. The substances given here are mainly ones having an electron mobility of $10^{-6}$ cm$^2$/Vs or higher. Note that any other substance may be used for the electron-transport layer as long as the substance has an electron-transport property higher than a hole-transport property.

The electron-transport layer 114 is not limited to a single layer, but may be a stack of two or more layers containing any of the above substances. Further, the organic compound of one embodiment of the present invention has an electron-transport property and thus can also be used for the electron-transport layer 114.

The electron-injection layer 115 is a layer containing a substance having a high electron-injection property. For the electron-injection layer 115, an alkali metal, an alkaline earth metal, or a compound thereof, such as lithium fluoride (LiF), cesium fluoride (CsF), calcium fluoride ($CaF_2$), or lithium oxide ($LiO_x$) can be used. A rare earth metal compound like erbium fluoride ($ErF_3$) can also be used. Any of the substances for forming the electron-transport layer 114, which are given above, can also be used.

Alternatively, a composite material in which an organic compound and an electron donor (donor) are mixed may be used for the electron-injection layer 115. Such a composite material is excellent in an electron-injection property and an electron-transport property because electrons are generation in the organic compound by the electron donor. In this case, the organic compound is preferably a material excellent in transporting the generated electrons. Specifically, for example, the substances for forming the electron-transport layer 114 (e.g., a metal complex and a heteroaromatic compound), which are given above, can be used. As the electron donor, a substance exhibiting an electron-donating property to the organic compound may be used; specific examples thereof include an alkali metal, an alkaline-earth metal, and a rare earth metal, such as lithium, cesium, magnesium, calcium, erbium, and ytterbium. Further, an alkali metal oxide or an alkaline-earth metal oxide is preferable; examples thereof include lithium oxide, calcium oxide, and barium oxide. A Lewis base such as magnesium oxide can also be used. An organic compound such as tetrathiafulvalene (abbreviation: TTF) can also be used.

Note that each of the above-described hole-injection layer 111, hole-transport layer 112, light-emitting layer 113, electron-transport layer 114, electron-injection layer 115, and charge-generation layer 116 can be formed by a method such as an evaporation method (e.g., a vacuum evaporation method), an ink-jet method, or a coating method.

In the above-described light-emitting element, current flows due to a potential difference generated between the first electrode 101 and the second electrode 103 and holes and electrons recombine in the EL layer 102, whereby light is emitted. Then, the emitted light is extracted outside through one or both of the first electrode 101 and the second electrode 103. Thus, one or both of the first electrode 101 and the second electrode 103 are electrodes having a light-transmitting property.

The above-described light-emitting element can emit phosphorescence originating from the phosphorescent compound and thus can have higher efficiency than a light-emitting element using a fluorescent compound.

Note that although the light-emitting element described in this embodiment is one structural example of a light-emitting element, a light-emitting element having another structure which is described in another embodiment can also be applied to a light-emitting device of one embodiment of the present invention. Further, as a light-emitting device including the above light-emitting element, a passive matrix type light-emitting device and an active matrix type light-emitting device can be manufactured. It is also possible to manufacture a light-emitting device with a microcavity structure including a light-emitting element which is a different light-emitting element from the above light-emitting elements as described in another embodiment. Each of the above light-emitting devices is included in the present invention.

Note that there is no particular limitation on the structure of the TFT in the case of manufacturing the active matrix light-emitting device. For example, a staggered TFT or an inverted staggered TFT can be used as appropriate. Further, a driver circuit formed over a TFT substrate may be formed using both of an n-type TFT and a p-type TFT or only either an n-type TFT or a p-type TFT. Furthermore, there is no particular limitation on the crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

(Embodiment 2)

Figure 25:
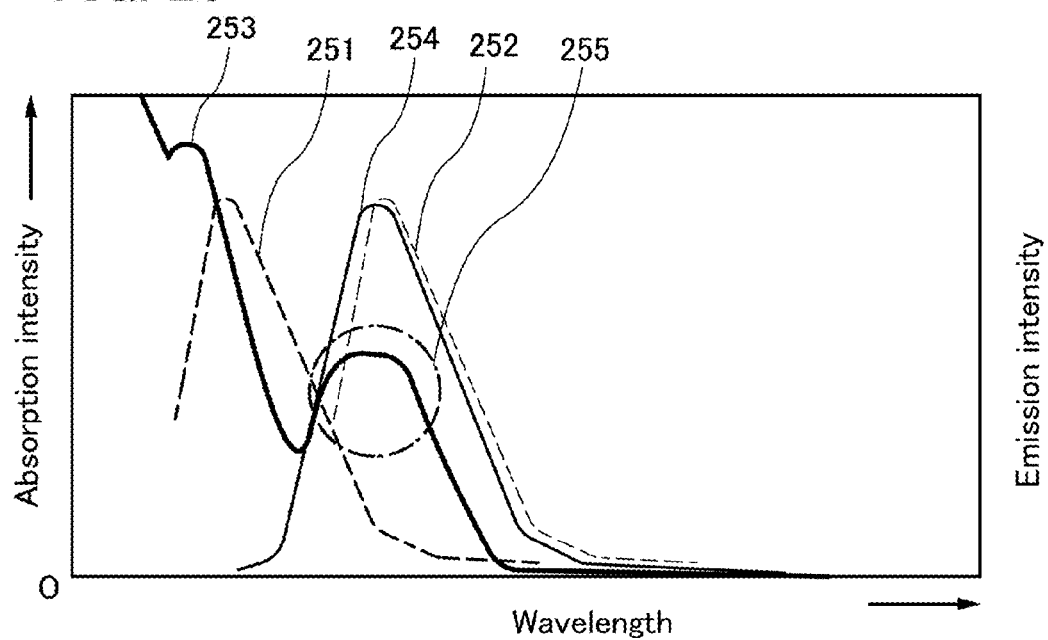
FIG. 25 shows the concept of an exciplex.

In this embodiment, a light-emitting element which includes a light-emitting layer containing a phosphorescent compound, an organic compound of one embodiment of the present invention, and two other organic compounds will be described with reference to FIG. 2 and FIG. 25.

Figure 2:
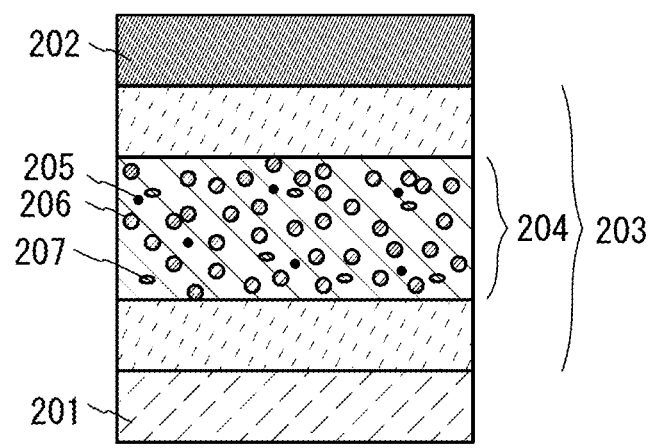
FIG. 2 illustrates a light-emitting element of one embodiment of the present invention.

A light-emitting element described in this embodiment includes an EL layer 203 between a pair of electrodes (a first electrode 201 and a second electrode 202) as illustrated in FIG. 2. Note that the EL layer 203 includes at least a light-emitting layer 204 and may include a hole-injection layer, a hole-transport layer, an electron-transport layer, an electron-injection layer, a charge-generation layer, and the like. Note that the substances given in Embodiment 1 can be used for the hole-injection layer, the hole-transport layer, the electron-transport layer, the electron-injection layer, and the charge-generation layer. Note that the first electrode 201 is used as an anode and the second electrode 202 is used as a cathode in this embodiment.

The light-emitting layer 204 described in this embodiment contains a phosphorescent compound 205, a first organic compound 206, and a second organic compound 207. Note that the phosphorescent compound 205 is a guest material in the light-emitting layer 204. Moreover, at least one of the first organic compound 206 and the second organic compound 207 contains the organic compound of one embodiment of the present invention, and the one with a higher content than the other in the light-emitting layer 204 is a host material in the light-emitting layer 204.

When the light-emitting layer 204 has the structure in which the guest material is dispersed in the host material, the crystallization of the light-emitting layer can be suppressed. Further, it is possible to suppress concentration quenching due to high concentration of the guest material; thus, the light-emitting element can have higher emission efficiency.

Note that it is preferable that a triplet excited energy level ($T_1$ level) of each of the first organic compound 206 and the second organic compound 207 be higher than that of the phosphorescent compound 205. This is because, when the $T_1$ level of the first organic compound 206 (or the second organic compound 207) is lower than that of the phosphorescent compound 205, the triplet excited energy of the phosphorescent compound 205, which is to contribute to light emission, is quenched by the first organic compound 206 (or the second organic compound 207) and accordingly the emission efficiency decreases.

Here, for improvement in efficiency of energy transfer from a host material to a guest material, Förster mechanism (dipole-dipole interaction) and Dexter mechanism (electron exchange interaction), which are known as mechanisms of energy transfer between molecules, are considered. According to the mechanisms, it is preferable that an emission spectrum of a host material (fluorescence spectrum in energy transfer from a singlet excited state, phosphorescence spectrum in energy transfer from a triplet excited state) largely overlap with an absorption spectrum of a guest material (specifically, spectrum in an absorption band on the longest wavelength (lowest energy) side). However, in general, it is difficult to obtain an overlap between a fluorescence spectrum of a host material and an absorption spectrum in an absorption band on the longest wavelength (lowest energy) side of a guest material. The reason for this is as follows: if the fluorescence spectrum of the host material overlaps with the absorption spectrum in the absorption band on the longest wavelength (lowest energy) side of the guest material, because a phosphorescence spectrum of the host material is located on a longer wavelength (lower energy) side than the fluorescence spectrum, the $T_1$ level of the host material becomes lower than the $T_1$ level of the phosphorescent compound and the above-described problem of quenching occurs; yet, when the host material is designed in such a manner that the $T_1$ level of the host material is higher than the $T_1$ level of the phosphorescent compound to avoid the problem of quenching, the fluorescence spectrum of the host material is shifted to the shorter wavelength (higher energy) side, and thus the fluorescence spectrum does not have any overlap with the absorption spectrum in the absorption band on the longest wavelength (lowest energy) side of the guest material. For this reason, in general, it is difficult to obtain an overlap between a fluorescence spectrum of a host material and an absorption spectrum in an absorption band on the longest wavelength (lowest energy) side of a guest material so as to maximize energy transfer from a singlet excited state of a host material.

Thus, in this embodiment, a combination of the first organic compound 206 and the second organic compound 207 preferably forms an excited complex (also referred to as exciplex). Thus, in the light-emitting layer 204, a fluorescence spectrum of the first organic compound 206 and that of the second organic compound 207 are observed as an emission spectrum of the exciplex which is located on a longer wavelength side. Moreover, when the first organic compound 206 and the second organic compound 207 are selected in such a manner that the emission spectrum of the exciplex largely overlaps with the absorption spectrum of the guest material (phosphorescent compound 205), energy transfer from a singlet excited state can be maximized (see FIG. 25). Note that also in the case of a triplet excited state, energy transfer from the exciplex, not the host material, is assumed to occur. FIG. 25 shows a fluorescent spectrum 251 of the first organic compound 206 (or the second organic compound 207), a phosphorescent spectrum 252 of the first organic compound 206 (or the second organic compound 207), an absorption spectrum 253 of the phosphorescent compound 205, an emission spectrum 254 of the exciplex, and an absorption band 255 positioned on the longest wavelength side.

As the phosphorescent compound 205, for example, a phosphorescent iridium metal complex or the like can be used. Examples of a material for blue light emission include bis[2-(4',6'-difluorophenyl)pyridinato-N,$C^{2'}$]iridium(III)tetrakis(1-pyrazolyl)borate (abbreviation: FIr6), bis[2-(4',6'-difluorophenyl)pyridinato-N,$C^{2'}$]iridium(III)picolinate (abbreviation: FIrpic),
bis{2-[3',5'-bis(trifluoromethyl)phenyl]pyridinato-N, $C^{2'}$}iridium(III)picolinate (abbreviation: Ir(CF$_3$ppy)$_2$(pic)), and
bis[2-(4',6'-difluorophenyl)pyridinato-N,$C^{2'}$]iridium(III) acetylacetonate (abbreviation: FIr(acac)). Examples of a material for green light emission include
tris(2-phenylpyridinato-N,$C^{2'}$)iridium(III) (abbreviation: Ir(ppy)$_3$),
bis(2-phenylpyridinato-N,$C^{2'}$)iridium(III)acetylacetonate (abbreviation: Ir(ppy)$_2$(acac)),
bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and tris(benzo[h]quinolinato)iridium(III) (abbreviation: Ir(bzq)$_3$). Examples of a material for yellow light emission include
bis(2,4-diphenyl-1,3-oxazolato-N,$C^{2'}$)iridium(III)acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)),
bis(2-phenylbenzothiazolato-N,$C^{2'}$)iridium(III)acetylacetonate (abbreviation: Ir(bt)$_2$(acac)),
(acetylacetonato)bis[2,3-bis(4-fluorophenyl)-5-methylpyrazinato]iridium(III) (abbreviation: Ir(Fdppr-Me)$_2$(acac)), and
(acetylacetonato)bis{2-(4-methoxyphenyl)-3,5-dimethylpyrazinato}iridium(III) (abbreviation: Ir(dmmoppr)$_2$(acac)). Examples of a material for orange light emission include tris(2-phenylquinolinato-N,$C^{2'}$)iridium(III) (abbreviation: Ir(pq)$_3$),
bis(2-phenylquinolinato-N,$C^{2'}$)iridium(III)acetylacetonate (abbreviation: Ir(pq)$_2$(acac)),
(acetylacetonato)bis(3,5-dimethyl-2-phenylpyrazinato)iridium(III) (abbreviation: Ir(mppr-Me)$_2$(acac)), and
(acetylacetonato)bis(5-isopropyl-3-methyl-2-phenylpyrazinato)iridium(III) (abbreviation: Ir(mppr-iPr)$_2$(acac)). Examples of a material for red light emission include organometallic complexes such as
bis[2-(2'-benzo[4,5-α]thienyl)pyridinato-N,$C^{3'}$]iridium(III) acetylacetonate (abbreviation: Ir(btp)$_2$(acac)),
bis(1-phenylisoquinolinato-N,$C^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)),
(acetylacetonato)bis(2,3,5-triphenylpyrazinato)iridium(III) (abbreviation: Ir(tppr)$_2$(acac)), (dipivaloylmethanato)bis (2,3,5-triphenylpyrazinato)iridium(III) (abbreviation: Ir(tppr)$_2$(dpm)), and
2,3,7,8,12,13,17,18-octaethyl-21H,23H-porphyrinplatinum (II) (abbreviation: PtOEP). Further, rare-earth metal complexes, such as tris(acetylacetonato) (monophenanthroline)terbium(III) (abbreviation: Tb(acac)$_3$(Phen)), tris(1, 3-diphenyl-1,3-propanedionato) (monophenanthroline) europium(III) (abbreviation: Eu(DBM)$_3$(Phen)), and tris [1-(2-thenoyl)-3,3,3-trifluoroacetonato] (monophenanthroline)europium(III) (abbreviation: Eu(TTA)$_3$(Phen)), exhibit light emission from rare-earth metal ions (electron transition between different multiplicities), and thus can be used as phosphorescent compounds. For the first organic compound 206 and the second organic compound 207, a combination of a compound which easily accepts electrons (a compound having an electron-trapping property) and a compound which easily accepts holes (a compound having a hole-trapping property) is preferably employed. Note that the organic compound of one embodiment of the present invention can be used as a compound which easily accepts holes.

Examples of a compound which easily accepts electrons include
2-[3-(dibenzothiophen-4-yl)phenyl]dibenzo[f,h]quinoxaline (abbreviation: 2mDBTPDBq-II), 2-[4-(3,6-diphenyl-9H-carbazol-9-yl)phenyl]dibenzo[f,h]quinoxaline (abbreviation: 2CzPDBq-III),
7-[3-(dibenzothiophen-4-yl)phenyl]dibenzo[f,h]quinoxaline (abbreviation:
7mDBTPDBq-II), and 6-[3-(dibenzothiophen-4-yl)phenyl]dibenzo[f,h]quinoxaline (abbreviation: 6mDBTPDBq-II).

The above-described combination of the first organic compound 206 and the second organic compound 207 is an example of the combination which enables an exciplex to be formed. The combination is determined so that the emission spectrum of the exciplex overlaps with the absorption spectrum of the phosphorescent compound 205 and that the peak of the emission spectrum of the exciplex has a longer wavelength than the peak of the absorption spectrum of the phosphorescent compound 205.

Note that in the case where a compound which easily accepts electrons and a compound which easily accepts holes are used for the first organic compound 206 and the second organic compound 207, carrier balance can be controlled by the mixture ratio of the compounds. Specifically, the ratio of the first organic compound to the second organic compound is preferably 1:9 to 9:1.

In the light-emitting element described in this embodiment, energy transfer efficiency can be improved owing to energy transfer utilizing an overlap between an emission spectrum of an exciplex and an absorption spectrum of a phosphorescent compound; accordingly, it is possible to achieve high external quantum efficiency of a light-emitting element.

Note that in another structure of the present invention, the light-emitting layer 204 can be formed using a host molecule having a hole-trapping property and a host molecule having an electron-trapping property as the two kinds of organic compounds other than the phosphorescent compound 205 (guest material) so that a phenomenon (guest coupled with complementary hosts: GCCH) occurs in which holes and electrons are introduced to guest molecules existing in the two kinds of host molecules and the guest molecules are brought into an excited state.

At this time, the host molecule having a hole-trapping property and the host molecule having an electron-trapping property can be respectively selected from the above-described compounds which easily accept holes and the above-described compounds which easily accept electrons.

Note that although the light-emitting element described in this embodiment is one structural example of a light-emitting element, a light-emitting element having another structure which is described in another embodiment can also be applied to a light-emitting device that is one embodiment of the present invention. Further, as a light-emitting device including the above light-emitting element, a passive matrix type light-emitting device and an active matrix type light-emitting device can be manufactured. It is also possible to manufacture a light-emitting device with a microcavity structure including a light-emitting element which is a different light-emitting element from the above light-emitting elements as described in another embodiment. Each of the above light-emitting devices is included in the present invention.

Note that there is no particular limitation on the structure of the TFT in the case of manufacturing the active matrix light-emitting device. For example, a staggered TFT or an inverted staggered TFT can be used as appropriate. Further, a driver circuit formed over a TFT substrate may be formed using both of an n-type TFT and a p-type TFT or only either an n-type TFT or a p-type TFT. Furthermore, there is no particular limitation on the crystallinity of a semiconductor film used for the TFT. For example, an amorphous semiconductor film, a crystalline semiconductor film, an oxide semiconductor film, or the like can be used.

Note that the structure described in this embodiment can be combined as appropriate with any of the structures described in the other embodiments.

(Embodiment 3)

In this embodiment, as one embodiment of the present invention, a light-emitting element (hereinafter referred to as tandem light-emitting element) in which a charge generation layer is provided between a plurality of EL layers will be described.

Figure 3A:
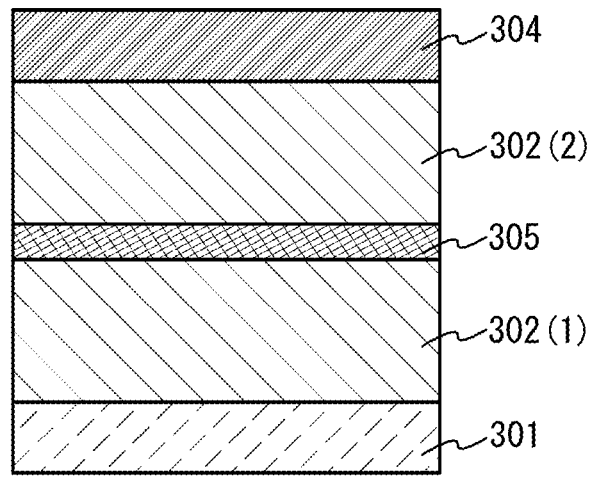
FIGS. 3A and 3B each illustrate a light-emitting element of one embodiment of the present invention.

A light-emitting element described in this embodiment is a tandem light-emitting element including a plurality of EL layers (a first EL layer 302(1) and a second EL layer 302(2)) between a pair of electrodes (a first electrode 301 and a second electrode 304), as illustrated in FIG. 3A.

In this embodiment, the first electrode 301 functions as an anode, and the second electrode 304 functions as a cathode. Note that the first electrode 301 and the second electrode 304 can have structures similar to those described in Embodiment 1. In addition, although the plurality of EL layers (the first EL layer 302(1) and the second EL layer 302(2)) may have structures similar to those described in Embodiment 1 or 2, any of the EL layers may have a structure similar to that described in Embodiment 1 or 2. In other words, the structures of the first EL layer 302(1) and the second EL layer 302(2) may be the same or different from each other and can be similar to those described in Embodiment 1 or 2.

Further, a charge-generation layer 305 is provided between the plurality of EL layers (the first EL layer 302(1) and the second EL layer 302(2)). The charge generation layer 305 has a function of injecting electrons into one of the EL layers and injecting holes into the other of the EL layers when a voltage is applied to the first electrode 301 and the second electrode 304. In this embodiment, when voltage is applied such that the potential of the first electrode 301 is higher than that of the second electrode 304, the charge-generation layer 305 injects electrons into the first EL layer 302(1) and injects holes into the second EL layer 302(2).

Note that in terms of light extraction efficiency, the charge-generation layer 305 preferably has a light-transmitting property with respect to visible light (specifically, the charge-generation layer 305 has a visible light transmittance of 40% or more). Further, the charge-generation layer 305 functions even if it has lower conductivity than the first electrode 301 or the second electrode 304.

The charge-generation layer 305 may have either a structure in which an electron acceptor (acceptor) is added to an organic compound having a high hole-transport property or a structure in which an electron donor (donor) is added to an organic compound having a high electron-transport property. Alternatively, both of these structures may be stacked.

In the case of the structure in which an electron acceptor is added to an organic compound having a high hole-transport property, as the organic compound having a high hole-transport property, for example, an aromatic amine compound such as NPB, TPD, TDATA, MTDATA, or 4,4'-bis[N-(spiro-9,9'-bifluoren-2-yl)-N-phenylamino]biphenyl (abbreviation: BSPB), or the like can be used. The substances given here are mainly ones having a hole mobility of $10^{-6}$ cm$^2$/Vs or higher. Note that any other substance may be used as long as the substance has a hole-transport property higher than an electron-transport property.

Further, as the electron acceptor, 7,7,8,8-tetracyano-2,3,5,6-tetrafluoroquinodimethane (abbreviation: F$_4$-TCNQ), chloranil, and the like can be given. In addition, a transition metal oxide can be given. In addition, an oxide of metals that belong to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of their high electron-accepting properties. Among these metal oxides, molybdenum oxide is especially preferable since it is stable in the air, has a low hygroscopic property, and is easily handled.

On the other hand, in the case of the structure in which an electron donor is added to an organic compound having a high electron-transport property, as the organic compound having a high electron-transport property, for example, a metal complex having a quinoline skeleton or a benzoquinoline skeleton, such as Alq, Almq$_3$, BeBq$_2$, or BAlq, or the like can be used. Alternatively, a metal complex having an oxazole-based ligand or a thiazole-based ligand, such as Zn(BOX)$_2$ or Zn(BTZ)$_2$ can be used. Other than metal complexes, PBD, OXD-7, TAZ, BPhen, BCP, or the like can be used. The substances given here are mainly ones having an electron mobility of $10^{-6}$ cm$^2$/Vs or higher. An organic compound having a pyrimidine skeleton may also be used. Note that any other substance may be used as long as the substance has an electron-transport property higher than a hole-transport property.

As the electron donor, an alkali metal, an alkaline earth metal, a rare earth metal, a metal belonging to Group 2 or Group 13 of the periodic table, or an oxide or carbonate thereof can be used. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may also be used as the electron donor.

Note that forming the charge-generation layer 305 by using any of the above materials can suppress an increase in driving voltage caused by the stack of the EL layers.

Figure 3B:
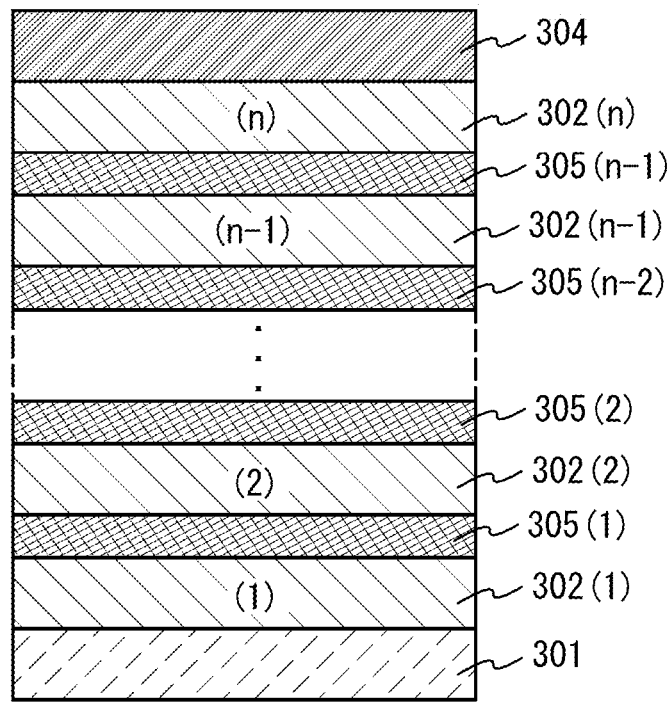

Although the light-emitting element having two EL layers is illustrated in FIG. 3A, the present invention can be similarly applied to a light-emitting element in which n EL layers (n is three or more) are stacked as illustrated in FIG. 3B. In the case where a plurality of EL layers are provided between a pair of electrodes as in the light-emitting element of this embodiment, by providing a charge-generation layer between the EL layers, the light-emitting element can emit light in a high luminance region while the current density is kept low. Since the current density can be kept low, the element can have a long lifetime. When the light-emitting element is applied to lighting, voltage drop due to resistance of an electrode material can be reduced, thereby achieving homogeneous light emission in a large area. Moreover, a light-emitting device which can be driven at low voltage and has low power consumption can be achieved.

By making the EL layers emit light of different colors from each other, the light-emitting element can provide light emission of a desired color as a whole. For example, by forming a light-emitting element having two EL layers such that the emission color of the first EL layer and the emission color of the second EL layer are complementary colors, the light-emitting element can provide white light emission as a whole. Note that "complementary colors" refer to colors which produce an achromatic color when mixed. In other words, when lights obtained from substances which emit light of complementary colors are mixed, white emission can be obtained.

Further, the same can be applied to a light-emitting element having three EL layers. For example, the light-emitting element as a whole can provide white light emission when the emission color of the first EL layer is red, the emission color of the second EL layer is green, and the emission color of the third EL layer is blue.

Note that the structure described in this embodiment can be combined as appropriate with any of the structures described in the other embodiments.

(Embodiment 4)

In this embodiment, a light-emitting device which includes a light-emitting element in which a phosphorescent compound and an organic compound of one embodiment of the present invention are contained in a light-emitting layer will be described with reference to FIG. 4.

A light-emitting device described in this embodiment has a micro optical resonator (microcavity) structure in which a light resonant effect between a pair of electrodes is utilized. The light-emitting device includes a plurality of light-emitting elements each of which includes at least an EL layer 455 between a pair of electrodes (a reflective electrode 451 and a semi-transmissive and semi-reflective electrode 452) as illustrated in FIG. 4. Further, the EL layer 455 includes at least a first light-emitting layer 454R, a second light-emitting layer 454G, and a third light-emitting layer 454B, each of which serves as a light-emitting region. The EL layer 455 may further include a hole-injection layer, a hole-transport layer, an electron-transport layer, an electron-injection layer, a charge generating layer, and the like. Note that a phosphorescent compound and an organic compound of one embodiment of the present invention are contained in at least one of the first light-emitting layer 454R, the second light-emitting layer 454G and the third light-emitting layer 454B.

Figure 4:
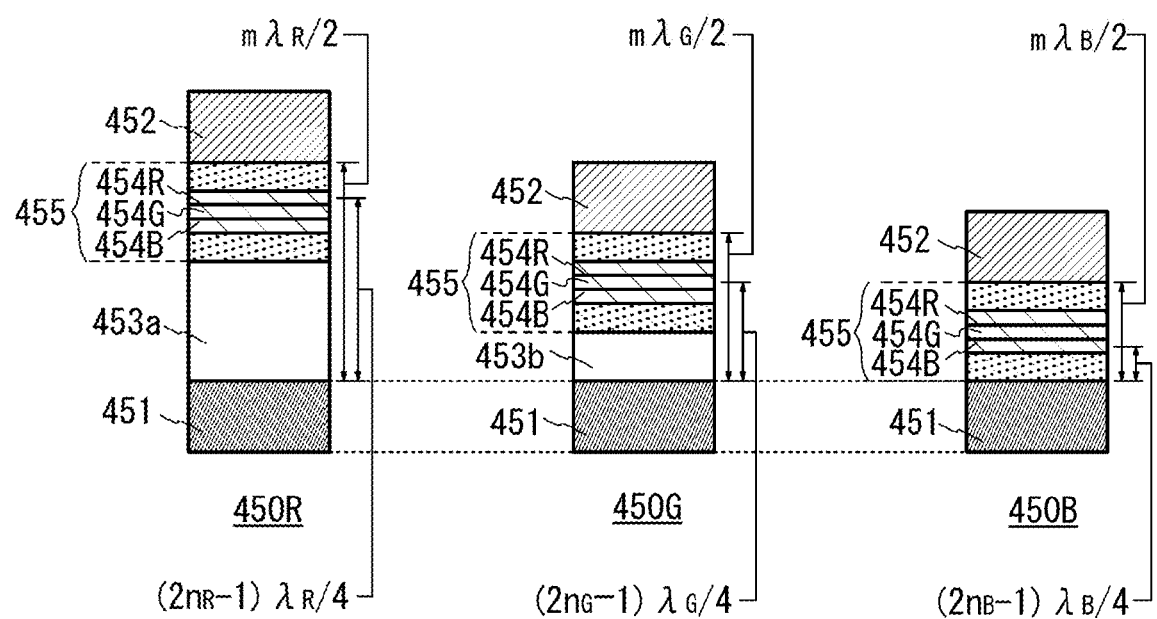
FIG. 4 illustrates light-emitting elements of one embodiment of the present invention.

In this embodiment, a light-emitting device which includes light-emitting elements (a first light-emitting element 450R, a second light-emitting element 450G and a third light-emitting element 450B) having different structures as illustrated in FIG. 4 is described.

The first light-emitting element 450R has a structure in which a first transparent conductive layer 453a, the EL layer 455, the semi-transmissive and semi-reflective electrode 452 are sequentially stacked over the reflective electrode 451. The second light-emitting element 450G has a structure in which a second transparent conductive layer 453b, the EL layer 455, and the semi-transmissive and semi-reflective electrode 452 are sequentially stacked over the reflective electrode 451. The third light-emitting element 450B has a structure in which the EL layer 455 and the semi-transmissive and semi-reflective electrode 452 are sequentially stacked over the reflective electrode 451.

Note that the reflective electrode 451, the EL layer 455, and the semi-transmissive and semi-reflective electrode 452 are common to the light-emitting elements (the first light-emitting element 450R, the second light-emitting element 450G, and the third light-emitting element 450B).

The EL layer 455 includes the first light-emitting layer 454R, the second light-emitting layer 454G, and the third light-emitting layer 454B. The first light-emitting layer 454R, the second light-emitting layer 454G, and the third light-emitting layer 454B emit a light ($\lambda_R$) having a peak in a wavelength range from 600 nm to 760 nm, a light ($\lambda_G$) having a peak in a wavelength range from 500 nm to 550 nm, and a light ($\lambda_B$) having a peak in a wavelength range from 420 nm to 480 nm, respectively. Thus, in each of the light-emitting elements (the first light-emitting element 450R, the second light-emitting element 450G and the third light-emitting element 450B), the lights emitted from the first light-emitting layer 454R, the second light-emitting layer 454G, and the third light-emitting layer 454B overlap with each other; accordingly, light having a broad emission spectrum that covers a visible light range can be emitted. Note that the above wavelengths satisfy the relation of $\lambda_B < \lambda_G < \lambda_R$.

Each of the light-emitting elements described in this embodiment has a structure in which the EL layer 455 is interposed between the reflective electrode 451 and the semi-transmissive and semi-reflective electrode 452. The lights emitted in all directions from the light-emitting layers included in the EL layer 455 are resonated by the reflective electrode 451 and the semi-transmissive and semi-reflective electrode 452 which function as a micro optical resonator (microcavity). Note that the reflective electrode 451 is formed using a conductive material having reflectivity, and a film whose visible light reflectivity is 40% to 100%, preferably 70% to 100%, and whose resistivity is $1 \times 10^{-2}$ Ωcm or lower is used. In addition, the semi-transmissive and semi-reflective electrode 452 is formed using a conductive material having reflectivity and a conductive material having a light-transmitting property, and a film whose visible light reflectivity is 20% to 80%, preferably 40% to 70%, and whose resistivity is $1 \times 10^{-2}$ Ωcm or lower is used.

In this embodiment, the thicknesses of the transparent conductive layers (the first transparent conductive layer 453a and the second transparent conductive layer 453b) provided in the first light-emitting element 450R and the second light-emitting element 450G respectively, are varied between the light-emitting elements, whereby the light-emitting elements differ in the optical path length from the reflective electrode 451 to the semi-transmissive and semi-reflective electrode 452. In other words, in light having a broad emission spectrum, which is emitted from the light-emitting layers of each of the light-emitting elements, light with a wavelength that is resonated between the reflective electrode 451 and the semi-transmissive and semi-reflective electrode 452 can be enhanced while light with a wavelength that is not resonated therebetween can be attenuated. Thus, when the elements differ in the optical path length from the reflective electrode 451 to the semi-transmissive and semi-reflective electrode 452, light with different wavelengths can be extracted.

Note that the optical path length (also referred to as optical distance) is expressed as a product of an actual distance and a refractive index, and in this embodiment, is a product of an actual thickness and n (refractive index). That is, the following relation is satisfied: optical path length=actual thickness×n.

Further, the optical path length from the reflective electrode 451 to the semi-transmissive and semi-reflective electrode 452 is set to $m\lambda_R/2$ (m is a natural number of 1 or more) in the first light-emitting element 450R; the optical path length from the reflective electrode 451 to the semi-transmissive and semi-reflective electrode 452 is set to $m\lambda_G/2$ (m is a natural number of 1 or more) in the second light-emitting element 450G; and the optical path length from the reflective electrode 451 to the semi-transmissive and semi-reflective electrode 452 is set to $m\lambda_B/2$ (m is a natural number of 1 or more) in the third light-emitting element 450B.

In this manner, the light ($\lambda_R$) emitted from the first light-emitting layer 454R included in the EL layer 455 is mainly extracted from the first light-emitting element 450R, the light ($\lambda_G$) emitted from the second light-emitting layer 454G included in the EL layer 455 is mainly extracted from the second light-emitting element 450G, and the light ($\lambda_B$) emitted from the third light-emitting layer 454B included in the EL layer 455 is mainly extracted from the third light-emitting element 450B. Note that the light extracted from each of the light-emitting elements is emitted through the semi-transmissive and semi-reflective electrode 452 side.

Further, strictly speaking, the optical path length from the reflective electrode 451 to the semi-transmissive and semi-reflective electrode 452 can be the distance from a reflection region in the reflective electrode 451 to a reflection region in the semi-transmissive and semi-reflective electrode 452. However, it is difficult to precisely determine the positions of the reflection regions in the reflective electrode 451 and the semi-transmissive and semi-reflective electrode 452; therefore, it is assumed that the above effect can be sufficiently obtained wherever the reflection regions may be set in the reflective electrode 451 and the semi-transmissive and semi-reflective electrode 452.

Next, the optical path length from the reflective electrode 451 to the first light-emitting layer 454R is adjusted to $(2n_R-1)\lambda_R/4$ ($n_R$ is a natural number of 1 or more) because in the first light-emitting element 450R, light (first reflected light) that is reflected by the reflective electrode 451 of the light emitted from the first light-emitting layer 454R interferes with light (first incident light) that directly enters the semi-transmissive and semi-reflective electrode 452 from the first light-emitting layer 454R. By adjusting the optical path length, the phases of the first reflected light and the first incident light can be aligned with each other and the light emitted from the first light-emitting layer 454R can be amplified.

Note that, strictly speaking, the optical path length from the reflective electrode 451 to the first light-emitting layer 454R can be the optical path length from a reflection region in the reflective electrode 451 to a light-emitting region in the first light-emitting layer 454R. However, it is difficult to precisely determine the positions of the reflection region in the reflective electrode 451 and the light-emitting region in the first light-emitting layer 454R; therefore, it is assumed that the above effect can be sufficiently obtained wherever the reflection region and the light-emitting region may be set in the reflective electrode 451 and the first light-emitting layer 454R, respectively.

Next, the optical path length from the reflective electrode 451 to the second light-emitting layer 454G is adjusted to $(2n_G-1)\lambda_G/4$ ($n_G$ is a natural number of 1 or more) because in the second light-emitting element 450G light (second reflected light) that is reflected by the reflective electrode 451 of the light emitted from the second light-emitting layer 454G interferes with light (second incident light) that directly enters the semi-transmissive and semi-reflective electrode 452 from the second light-emitting layer 454G By adjusting the optical path length, the phases of the second reflected light and the second incident light can be aligned with each other and the light emitted from the second light-emitting layer 454G can be amplified.

Note that, strictly speaking, the optical path length from the reflective electrode 451 to the second light-emitting layer 454G can be the optical path length from a reflection region in the reflective electrode 451 to a light-emitting region in the second light-emitting layer 454G However, it is difficult to precisely determine the positions of the reflection region in the reflective electrode 451 and the light-emitting region in the second light-emitting layer 454G; therefore, it is assumed that the above effect can be sufficiently obtained wherever the reflection region and the light-emitting region may be set in the reflective electrode 451 and the second light-emitting layer 454G, respectively.

Next, the optical path length from the reflective electrode 451 to the third light-emitting layer 454B is adjusted to $(2n_B-1)\lambda_B/4$ ($n_B$ is a natural number of 1 or more) because in the third light-emitting element 450B, light (third reflected light) that is reflected by the reflective electrode 451 of the light emitted from the third light-emitting layer 454B interferes with light (third incident light) that directly enters the semi-transmissive and semi-reflective electrode 452 from the third light-emitting layer 454B. By adjusting the optical path length, the phases of the third reflected light and the third incident light can be aligned with each other and the light emitted from the third light-emitting layer 454B can be amplified.

Note that, strictly speaking, the optical path length from the reflective electrode 451 to the third light-emitting layer 454B can be the optical path length from a reflection region in the reflective electrode 451 to a light-emitting region in the third light-emitting layer 454B. However, it is difficult to precisely determine the positions of the reflection region in the reflective electrode 451 and the light-emitting region in the third light-emitting layer 454B; therefore, it is assumed that the above effect can be sufficiently obtained wherever the reflection region and the light-emitting region may be set in the reflective electrode 451 and the third light-emitting layer 454B, respectively.

Note that although each of the light-emitting elements in the above-described structure includes a plurality of light-emitting layers in the EL layer, the present invention is not limited thereto; for example, the structure of the tandem (stacked type) light-emitting element which is described in Embodiment 3 can be combined, in which case a plurality of EL layers is provided so that a charge generating layer is interposed therebetween in one light-emitting element and one or more light-emitting layers are formed in each of the EL layers.

The light-emitting device described in this embodiment has a microcavity structure, in which light with wavelengths which differ depending on the light-emitting elements can be extracted even when they include the same EL layers, so that it is not necessary to form light-emitting elements for the colors of R, G, and B. Therefore, the above structure is advantageous for full color display owing to easiness in achieving higher resolution display or the like. In addition, emission intensity with a predetermined wavelength in the front direction can be increased, whereby power consumption can be reduced. The above structure is particularly useful in the case of being applied to a color display (image display device) including pixels of three or more colors but may also be applied to lighting or the like.

Note that the structure described in this embodiment can be combined as appropriate with any of the structures described in the other embodiments.

(Embodiment 5)

In this embodiment, a light-emitting device which includes a light-emitting element including a phosphorescent compound and an organic compound of one embodiment of the present invention will be described with reference to FIGS. 5A and 5B.

The light-emitting device including the light-emitting element of one embodiment of the present invention can be either a passive matrix light-emitting device or an active matrix light-emitting device. Note that any of the light-emitting elements described in the other embodiments can be applied to the light-emitting device described in this embodiment.

In this embodiment, as a light-emitting device including the light-emitting element according to one embodiment of the present invention, an active matrix light-emitting device is described with reference to FIGS. 5A and 5B.

Figure 5A:
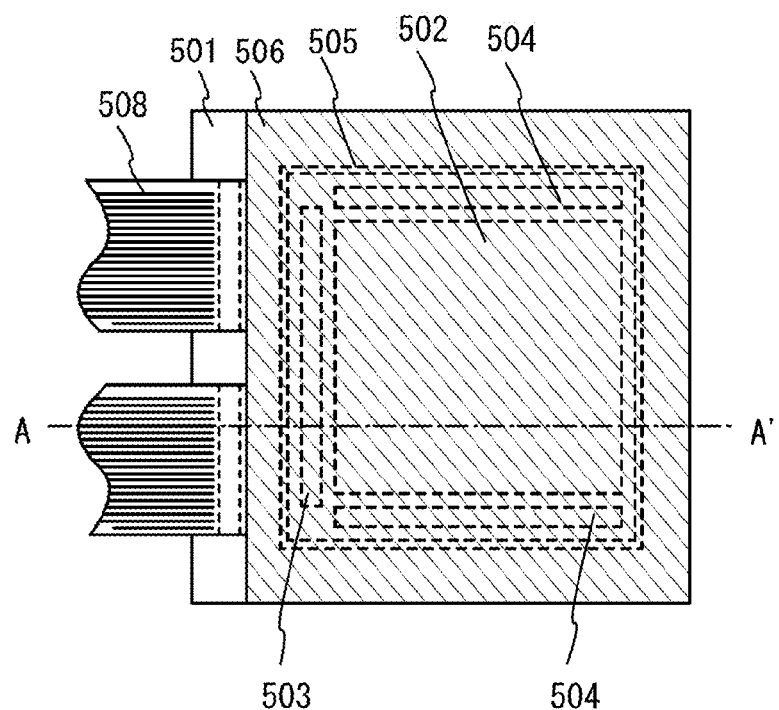
FIGS. 5A and 5B illustrate a light-emitting device of one embodiment of the present invention.
Figure 5B:
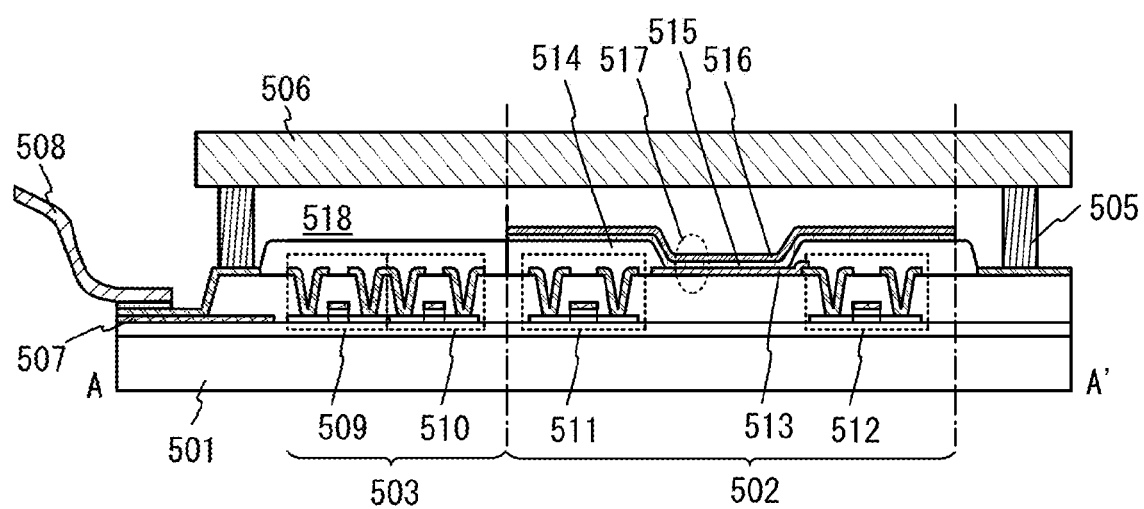

Note that FIG. 5A is a top view illustrating a light-emitting device and FIG. 5B is a cross-sectional view taken along A-A' in FIG. 5A. The active matrix light-emitting device according to this embodiment includes a pixel portion 502 provided over an element substrate 501, a driver circuit portion (a source line driver circuit) 503, and a driver circuit portion (a gate line driver circuit) 504. The pixel portion 502, the driver circuit portion 503, and the driver circuit portion 504 are sealed with a sealant 505 between the element substrate 501 and a sealing substrate 506.

In addition, over the element substrate 501, a lead wiring 507 for connecting an external input terminal, through which a signal (e.g., a video signal, a clock signal, a start signal, a reset signal, or the like) or electric potential from the outside is transmitted to the driver circuit portion 503 and the driver circuit portion 504, is provided. Here, an example in which an FPC 508 is provided as the external input terminal is described. Although only the FPC 508 is illustrated here, a printed wiring board (PWB) may be attached to the FPC 508. The light-emitting device in this specification includes, in its category, not only the light-emitting device itself but also the light-emitting device provided with the FPC or the PWB.

Next, a cross-sectional structure is described with reference to FIG. 5B. The driver circuit portion and the pixel portion are formed over the element substrate 501, and illustrated the driver circuit portion 503 which is the source line driver circuit and the pixel portion 502.

An example in which a CMOS circuit which is a combination of an n-channel TFT 509 and a p-channel TFT 510 is formed as the driver circuit portion 503 is illustrated. Note that a circuit included in the driver circuit portion may be formed using any of various circuits, such as a CMOS circuit, a PMOS circuit, or an NMOS circuit. In this embodiment, although a driver-integrated type structure in which a driver circuit is formed over a substrate is described, a driver circuit is not necessarily formed over a substrate but can be formed outside a substrate.

The pixel portion 502 is formed of a plurality of pixels each of which includes a switching TFT 511, a current control TFT 512, and a first electrode 513 which is electrically connected to a wiring (a source electrode or a drain electrode) of the current control TFT 512. An insulator 514 is formed so as to cover an edge portion of the first electrode 513. In this embodiment, the insulator 514 is formed using a positive photosensitive acrylic resin. Note that the first electrode 513 is used as an anode and a second electrode 516 is used as a cathode in this embodiment.

In addition, in order to obtain favorable coverage with a film which is to be stacked over the insulator 514, the insulator 514 is preferably formed so as to have a curved surface with curvature at an upper edge portion or a lower edge portion. For example, in the case of using a positive photosensitive acrylic resin as a material for the insulator 514, the insulator 514 is preferably formed so as to have a curved surface with a curvature radius (0.2 μm to 3 μm) at the upper edge portion. Note that the insulator 514 can be formed using either a negative photosensitive resin or a positive photosensitive resin. It is possible to use, without limitation to an organic compound, either an organic compound or an inorganic compound such as silicon oxide or silicon oxynitride.

An EL layer 515 and a second electrode 516 are stacked over the first electrode 513. In the EL layer 515, at least a light-emitting layer is provided, and the light-emitting layer contains a phosphorescent compound and an organic compound of one embodiment of the present invention. Further, in the EL layer 515, a hole-injection layer, a hole-transport layer, an electron-transport layer, an electron-injection layer, a charge-generation layer, and the like can be provided as appropriate in addition to the light-emitting layer.

A light-emitting element 517 is formed of a stacked structure of the first electrode 513, the EL layer 515, and the second electrode 516. For the first electrode 513, the EL layer 515, and the second electrode 516, the materials described in Embodiment 1 can be used. Although not illustrated, the second electrode 516 is electrically connected to an FPC 508 which is an external input terminal.

In addition, although the cross-sectional view of FIG. 5B illustrates only one light-emitting element 517, a plurality of light-emitting elements are arranged in matrix in the pixel portion 502. Light-emitting elements that emit light of three kinds of colors (R, G, and B) are selectively formed in the pixel portion 502, whereby a light-emitting device capable of full color display can be obtained. Alternatively, a light-emitting device which is capable of full color display may be manufactured by a combination with color filters.

Further, the sealing substrate 506 is attached to the element substrate 501 with the sealant 505, whereby a light-emitting element 517 is provided in a space 518 surrounded by the element substrate 501, the sealing substrate 506, and the sealant 505. Note that the space 518 may be filled with an inert gas (such as nitrogen and argon) or the sealant 505.

An epoxy-based resin is preferably used for the sealant 505. Such a material preferably allows as little moisture and oxygen as possible to penetrate. As the sealing substrate 506, a plastic substrate formed of fiberglass-reinforced plastics (FRP), polyvinyl fluoride (PVF), polyester, acrylic resin, or the like can be used besides a glass substrate or a quartz substrate.

As described above, an active matrix light-emitting device utilizing phosphorescence can be obtained.

Note that the structure described in this embodiment can be combined as appropriate with any of the structures described in the other embodiments.

(Embodiment 6)

In this embodiment, an electronic device which partly includes the light-emitting device of one embodiment of the present invention which is described in the above embodiments will be described. Examples of the electronic device include cameras such as video cameras and digital cameras, goggle type displays, navigation systems, audio replay devices (e.g., car audio systems and audio systems), computers, game machines, portable information terminals (e.g., mobile computers, mobile phones, smartphones, portable game machines, e-book readers, and tablet terminals), and image replay devices in which a recording medium is provided (specifically, devices that are capable of replaying recording media such as digital versatile discs (DVDs) and equipped with a display device that can display an image). Specific examples of these electronic devices will be described with reference to FIGS. 6A to 6D and FIGS. 7A-1 to 7B.

FIG. 6A illustrates a television set according to one embodiment of the present invention, which includes a housing 611, a supporting base 612, a display portion 613, speaker portions 614, video input terminals 615, and the like. In this television set, the light-emitting device of one embodiment of the present invention can be applied to the display portion 613. Since the light-emitting device of one embodiment of the present invention is driven at low voltage and has high current efficiency, by the application of the light-emitting device of one embodiment of the present invention, a television set with reduced power consumption can be obtained.

FIG. 6B illustrates a computer according to one embodiment of the present invention, which includes a main body 621, a housing 622, a display portion 623, a keyboard 624, an external connection port 625, a pointing device 626, and the like. In this computer, the light-emitting device of one embodiment of the present invention can be applied to the display portion 623. Since the light-emitting device of one embodiment of the present invention is driven at low voltage and has high current efficiency, by the application of the light-emitting device of one embodiment of the present invention, a computer with reduced power consumption can be obtained.

FIG. 6C illustrates a mobile phone according to one embodiment of the present invention, which includes a main body 631, a housing 632, a display portion 633, an audio input portion 634, an audio output portion 635, operation keys 636, an external connection port 637, an antenna 638, and the like. In this mobile phone, the light-emitting device of one embodiment of the present invention can be applied to the display portion 633. Since the light-emitting device of one embodiment of the present invention is driven at low voltage and has high current efficiency, by the application of the light-emitting device of one embodiment of the present invention, a mobile phone with reduced power consumption can be obtained.

FIG. 6D illustrates a camera according to one embodiment of the present invention, which includes a main body 641, a display portion 642, a housing 643, an external connection port 644, a remote control receiving portion 645, an image receiving portion 646, a battery 647, an audio input portion 648, operation keys 649, an eyepiece portion 650, and the like. In this camera, the light-emitting device of one embodiment of the present invention can be applied to the display portion 642. Since the light-emitting device of one embodiment of the present invention is driven at low voltage and has high current efficiency, by the application of the light-emitting device of one embodiment of the present invention, a camera with reduced power consumption can be obtained.

Figures 1, 2, 3, 7A:
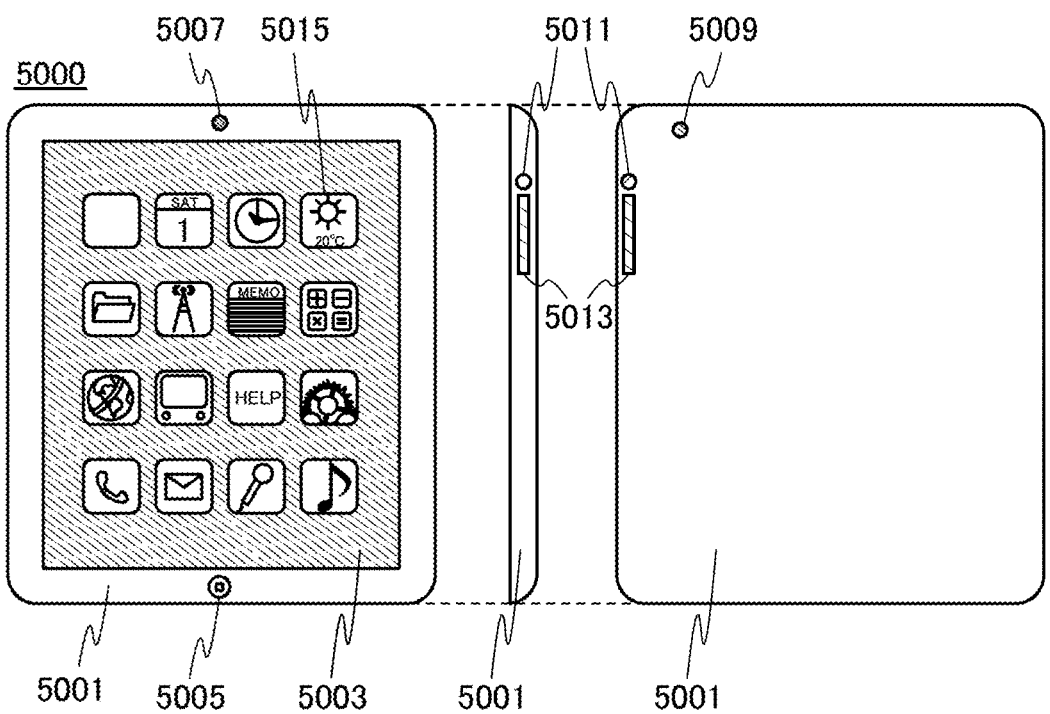
Figure 7B:
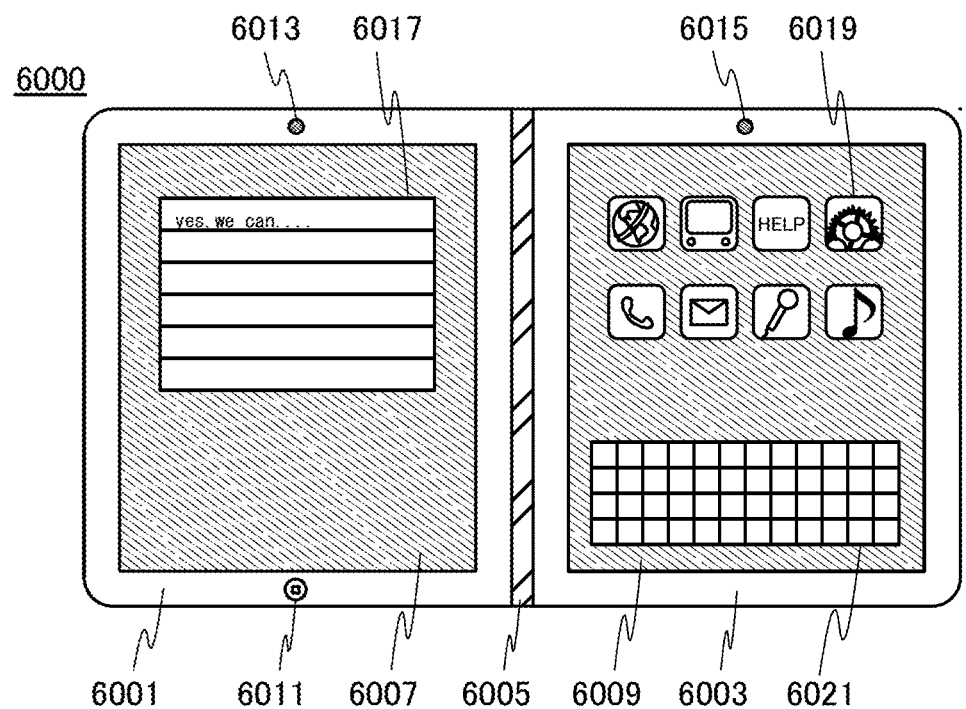

FIGS. 7A-1 to 7B illustrate examples of tablet terminals according to one embodiment of the present invention. FIGS. 7A-1, 7A-2, and 7A-3 illustrate a tablet PC 5000, and FIG. 7B illustrates a tablet PC 6000.

FIGS. 7A-1, 7A-2, and 7A-3 are a front view, a side view, and a rear view of the tablet PC 5000, respectively. FIG. 7B is a front view of the tablet PC 6000.

The tablet PC 5000 includes a housing 5001, a display portion 5003, a power button 5005, a front camera 5007, a rear camera 5009, a first external connection terminal 5011, a second external connection terminal 5013, and the like.

In addition, the display portion 5003 is incorporated in the housing 5001 and can be used as a touch panel. For example, e-mailing or schedule management can be performed by touching an icon 5015 and the like on the display portion 5003. Further, the front camera 5007 is incorporated on the front side of the housing 5001, whereby an image on the user's side can be taken. The rear camera 5009 is incorporated in the rear side of the housing 5001, whereby an image on the opposite side of the user can be taken. Further, the housing 5001 includes the first external connection terminal 5011 and the second external connection terminal 5013. For example, sound can be output to an earphone or the like through the first external connection terminal 5011, and data can be moved through the second external connection terminal 5013.

The tablet PC 6000 in FIG. 7B includes a first housing 6001, a second housing 6003, a hinge portion 6005, a first display portion 6007, a second display portion 6009, a power button 6011, a first camera 6013, a second camera 6015, and the like.

The first display portion 6007 is incorporated in the first housing 6001. The second display portion 6009 is incorporated in the second housing 6003. For example, the first display portion 6007 and the second display portion 6009 are used as a display panel and a touch panel, respectively. A user can select images, enter characters, and so on by touching an icon 6019 displayed on the second display portion 6009 or a keyboard 6021 (actually, a keyboard image displayed on the second display portion 6009) while looking at a text icon 6017 displayed on the first display portion 6007. Alternatively, the first display portion 6007 and the second display portion 6009 may be a touch panel and a display panel, respectively; the first display portion 6007 and the second display portion 6009 may be touch panels.

The first housing 6001 and the second housing 6003 are connected to each other and open and close on the hinge portion 6005. In such a structure, the first display portion 6007 incorporated in the first housing 6001 and the second display portion 6009 incorporated in the second housing 6003 are preferably made to face each other, in which case the surfaces of the first display portion 6007 and the second display portion 6009 (e.g., plastic substrates) can be protected.

Alternatively, the first housing 6001 and the second housing 6003 may be separated by the hinge portion 6005 (so-called convertible type). Thus, the application range of the tablet PC 6000 can be extended: for example, the first housing 6001 is used in a vertical orientation and the second housing 6003 is used in a horizontal orientation.

Further, the first camera 6013 and the second camera 6015 can take 3D images.

The tablet PC 5000 and the tablet PC 6000 may send and receive data wirelessly. For example, through wireless internet connection, desired data can be purchased and downloaded.

The tablet PCs 5000 and 6000 can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs). A detector such as a photodetector capable of optimizing display luminance in accordance with the amount of outside light or a sensor for detecting inclination, like a gyroscope or an acceleration sensor, can be included.

The light-emitting device of one embodiment of the present invention can be applied to the display portion 5003 of the tablet PC 5000, the first display portion 6007 of the tablet PC 6000, and/or the second display portion 6009 of the tablet PC 6000. Since the light-emitting device of one embodiment of the present invention is driven at low voltage and has high current efficiency, by the application of the light-emitting device of one embodiment of the present invention, a tablet terminal with reduced power consumption can be obtained.

As described above, the applicable range of the light-emitting device of one embodiment of the present invention is so wide that the light-emitting device can be applied to electronic devices in a variety of fields. With the use of the light-emitting device of one embodiment of the present invention, an electronic device with reduced power consumption can be obtained.

The light-emitting device of one embodiment of the present invention can also be used as a lighting device. Specific examples of the lighting device are described with reference to FIGS. 8A to 8C.

Figure 8A:
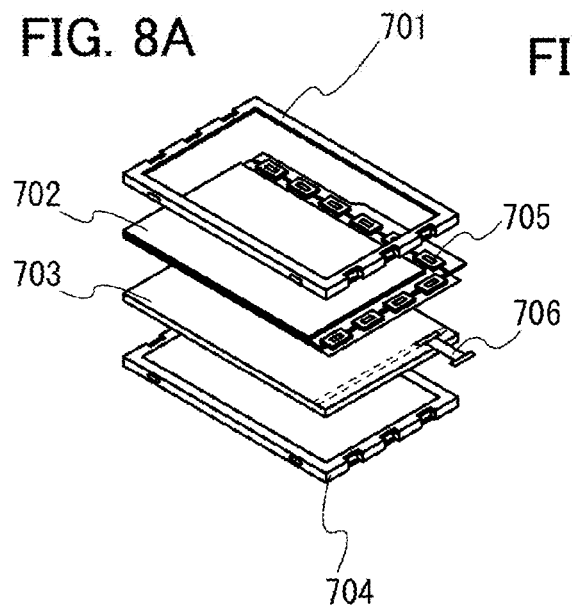
FIGS. 8A to 8C illustrate lighting devices of one embodiment of the present invention.

FIG. 8A illustrates an example of a liquid crystal display device using the light-emitting device of one embodiment of the present invention as a backlight. The liquid crystal display device illustrated in FIG. 8A includes a housing 701, a liquid crystal layer 702, a backlight 703, and a housing 704. The liquid crystal layer 702 is connected to a driver IC 705. The light-emitting device of one embodiment of the present invention is used as the backlight 703, and current is supplied through a terminal 706. By using the light-emitting device of one embodiment of the present invention as a backlight of a liquid crystal display device as described above, a backlight with low power consumption can be obtained. Moreover, since the light-emitting device of one embodiment of the present invention is a lighting device for surface light emission and the enlargement of the light-emitting device is possible, the backlight can be made larger. Thus, a larger-area liquid crystal display device with low power consumption can be obtained.

Figure 8B:
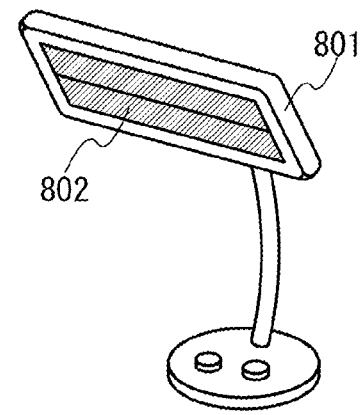

Next, FIG. 8B illustrates an example in which the light-emitting device of one embodiment of the present invention is used for a desk lamp which is a lighting device. The desk lamp illustrated in FIG. 8B includes a housing 801 and a light source 802, and the light-emitting device of one embodiment of the present invention is used as the light source 802. Since the light-emitting device of one embodiment of the present invention is driven at low voltage and has high current efficiency, by the application of the light-emitting device of one embodiment of the present invention, a desk lamp with reduced power consumption can be obtained.

Figure 8C:
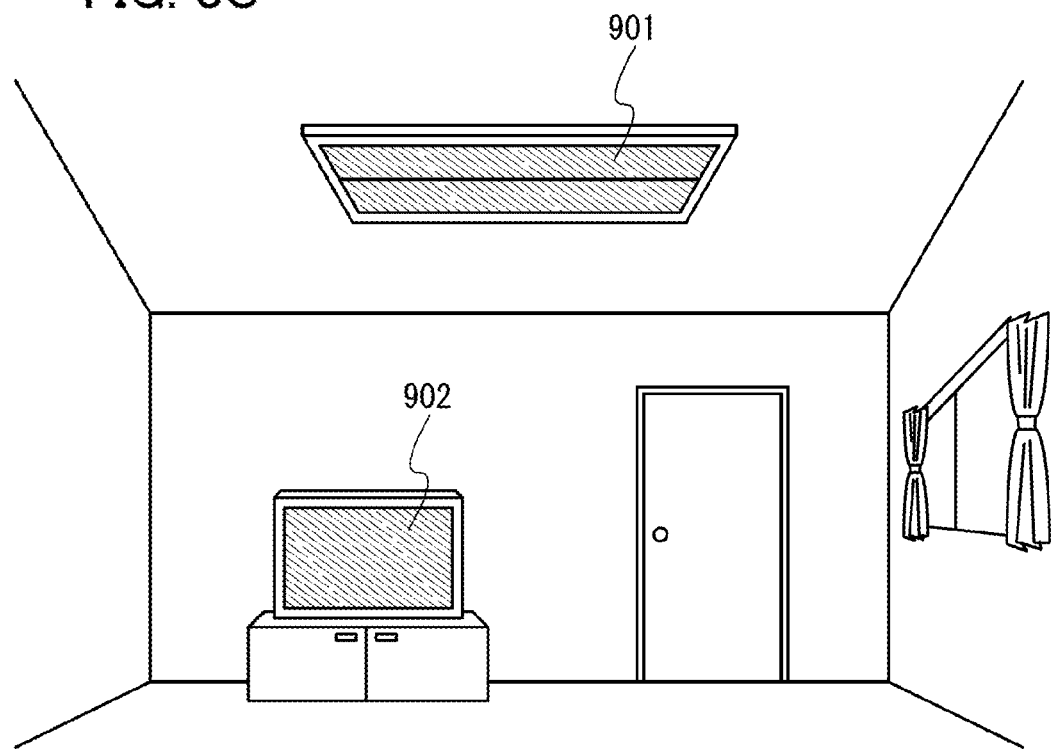

FIG. 8C illustrates an example in which the light-emitting device of one embodiment of the present invention is used for an indoor lighting device 901. Since the light-emitting device of an embodiment of the present invention can also have a larger area, the light-emitting device of an embodiment of the present invention can be used as a lighting system having a large area. Since the light-emitting device of one embodiment of the present invention is driven at low voltage and has high current efficiency, by the application of the light-emitting device of one embodiment of the present invention, a lighting device with reduced power consumption can be obtained. In a room where the light-emitting device of one embodiment of the present invention is used for the indoor lighting device 901 as described above, a television set 902 of one embodiment of the present invention as described with reference to FIG. 6A can be installed so that public broadcasting and movies can be watched.

Note that this embodiment can be combined with any of the other embodiments as appropriate.

EXAMPLE 1

In this example, a synthesis method of 4-(dibenzo[f,h]quinoxalin-2-yl)-4'-(9-phenyl-9H-carbazol-3-yl)triphenylamine (abbreviation: PCBAPDBq), which is represented by Structural Formula (100) in Embodiment 1, as an organic compound of one embodiment of the present invention will be described.

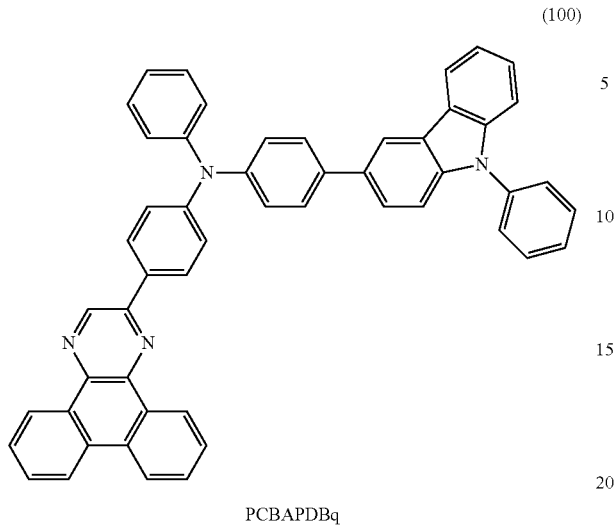

PCBAPDBq (100)

Synthesis of 4-(Dibenzo[f,h]quinoxalin-2-yl)-4'-(9-phenyl-9H-carbazol-3-yl)triphenylamine (abbreviation: PCBAPDBq)

A synthesis scheme of 4-(dibenzo[f,h]quinoxalin-2-yl)-4'-(9-phenyl-9H-carbazol-3-yl)triphenylamine (abbreviation: PCBAPDBq) is shown in (B-1).

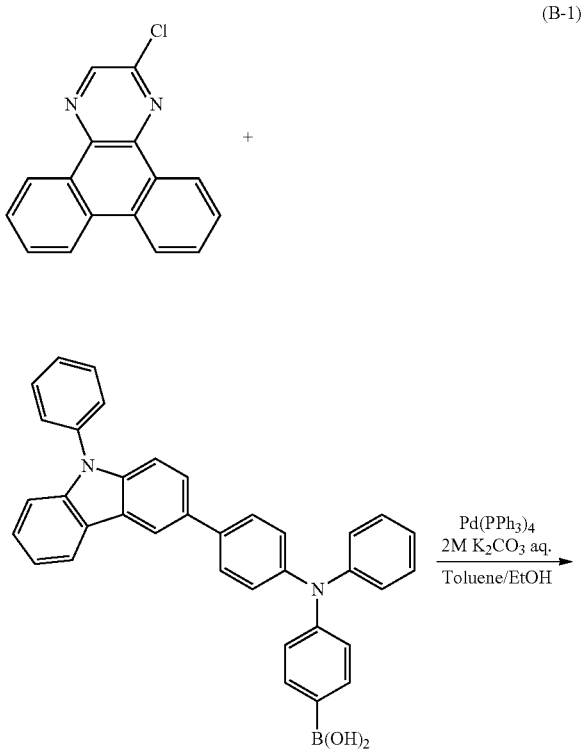

(B-1)

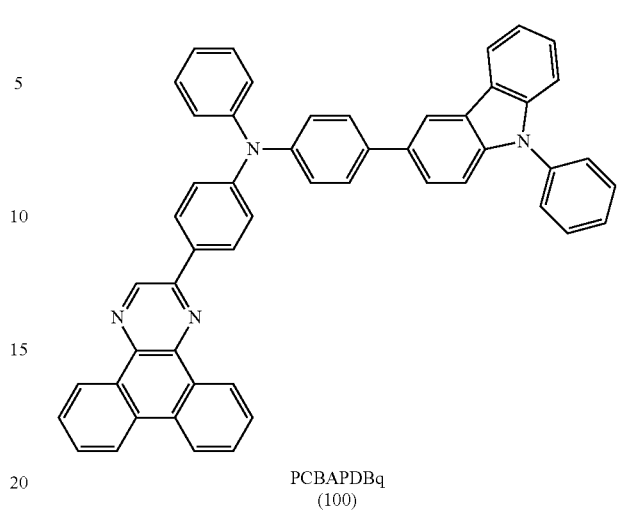

PCBAPDBq (100)

In a 50 mL three-neck flask were put 0.23 g (0.87 mmol) of 2-chlorodibenzo[f,h]quinoxaline, 0.50 g (0.94 mmol) of 4-{N-[4-(9-phenyl-9H-carbazol-3-yl)phenyl]-N-phenylamino}phenylboronic acid, 5 mL of toluene, 1 mL of ethanol, and 1.5 mL of a 2 M aqueous solution of potassium carbonate. This mixture was degassed by being stirred under reduced pressure, and the air in the flask was replaced with nitrogen. To this mixture was added 20 mg (17 µmol) of tetrakis(triphenylphosphine)palladium(0). This mixture was stirred at 80° C. under a nitrogen stream for 20 hours. After predetermined time passed, water and toluene were added to this mixture to extract the obtained aqueous layer with toluene. The solution of the obtained extract and the organic layer were combined and washed with a saturated aqueous solution of sodium hydrogen carbonate and saturated saline, and the organic layer was dried over magnesium sulfate. The obtained mixture was gravity-filtered to give filtrate, and the filtrate was concentrated to give a solid. The obtained solid was purified by silica gel column chromatography (toluene:hexane=1:1) and recrystallization from toluene and methanol was performed to give the target substance as 0.53 g of yellow powder in a yield of 85%.

By a train sublimation method, 0.52 g of the obtained powder of 4-(dibenzo[f,h]quinoxalin-2-yl)-4'-(9-phenyl-9H-carbazol-3-yl)triphenylamine was purified. In the purification, 4-(dibenzo[f,h]quinoxalin-2-yl)-4'-(9-phenyl-9H-carbazol-3-yl)triphenylamine was heated at 320° C. under the conditions that the pressure was 4.2 Pa and the argon flow rate was 5.0 mL/min. After the purification, 0.43 g of yellow powder of 4-(dibenzo[f,h]quinoxalin-2-yl)-4'-(9-phenyl-9H-carbazol-3-yl)triphenylamine was obtained at a collection rate of 83%.

A nuclear magnetic resonance spectrometry ($^1$H NMR) identified this compound as 4-(dibenzo[f,h]quinoxalin-2-yl)-4'-(9-phenyl-9H-carbazol-3-yl)triphenylamine (abbreviation: PCBAPDBq) which was the target substance.

$^1$H NMR data of the obtained substance are as follows: $^1$H NMR (CDCl$_3$, 300 MHz): δ=7.14 (t, J=7.2 Hz, 1H), 7.29-

7.83 (m, 24H), 8.20 (d, J=7.8 Hz, 1H), 8.27 (d, J=8.7 Hz, 2H), 8.37 (s, 1H), 8.66 (d, J=8.1 Hz, 2H), 9.20-9.24 (m, 1H), 9.36 (s, 1H), 9.40 (d, J=7.2 Hz, 1H).

Figure 9A:
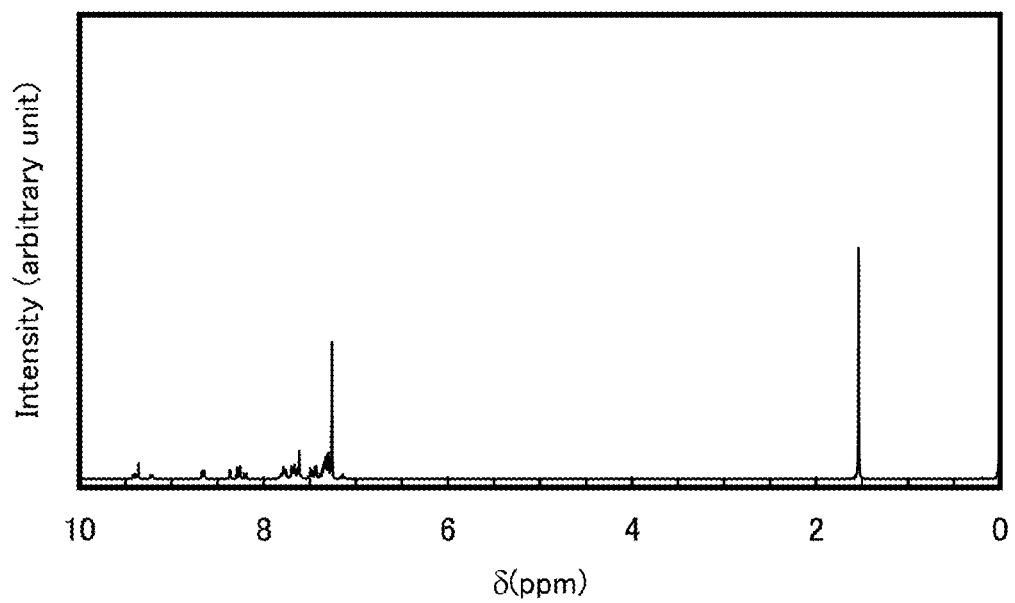
FIGS. 9A and 9B are $^1$H NMR charts of 4-(dibenzo[f,h]quinoxalin-2-yl)-4'-(9-phenyl-9H-carbazol-3-yl)triphenylamine (abbreviation: PCBAPDBq).
Figure 9B:
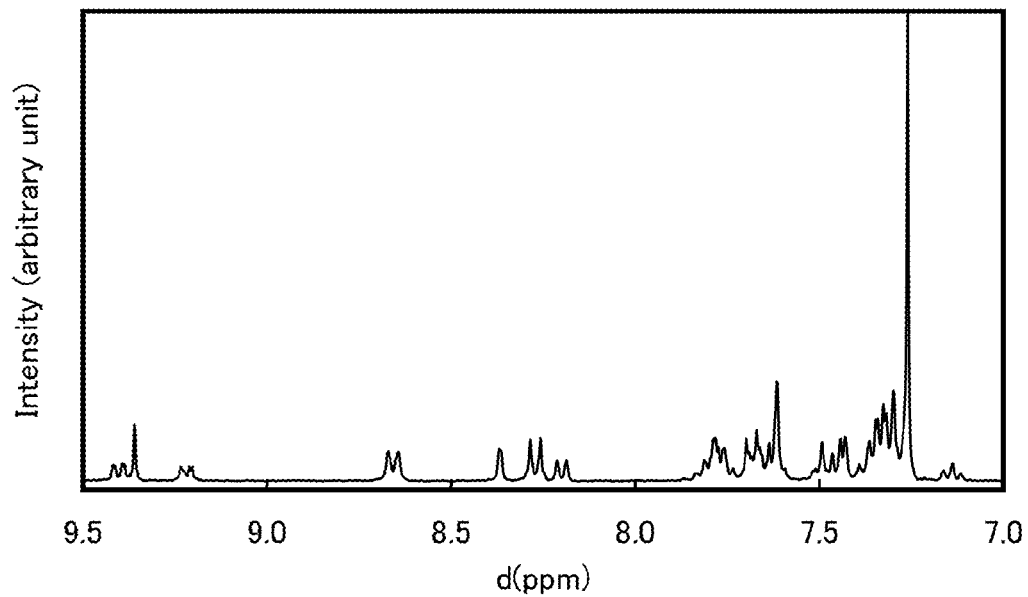

FIGS. 9A and 9B are $^1$H-NMR charts. Note that FIG. 9B is a chart where the range of from 7.0 ppm to 9.5 ppm in FIG. 9A is enlarged.

Figure 10A:
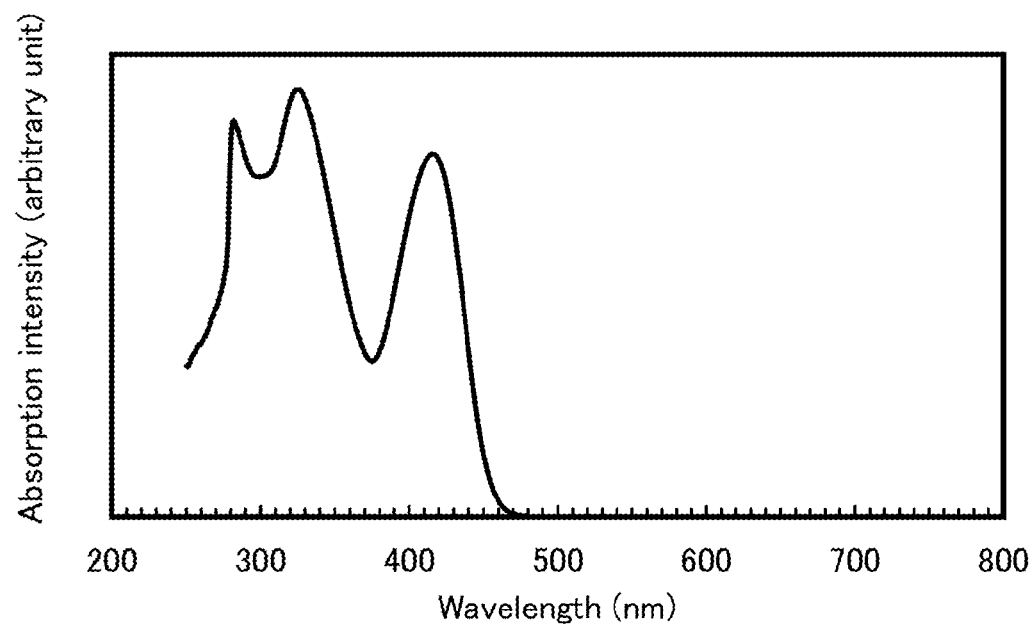
FIGS. 10A and 10B show an absorption spectrum and an emission spectrum, respectively, of PCBAPDBq in a toluene solution of PCBAPDBq.
Figure 10B:
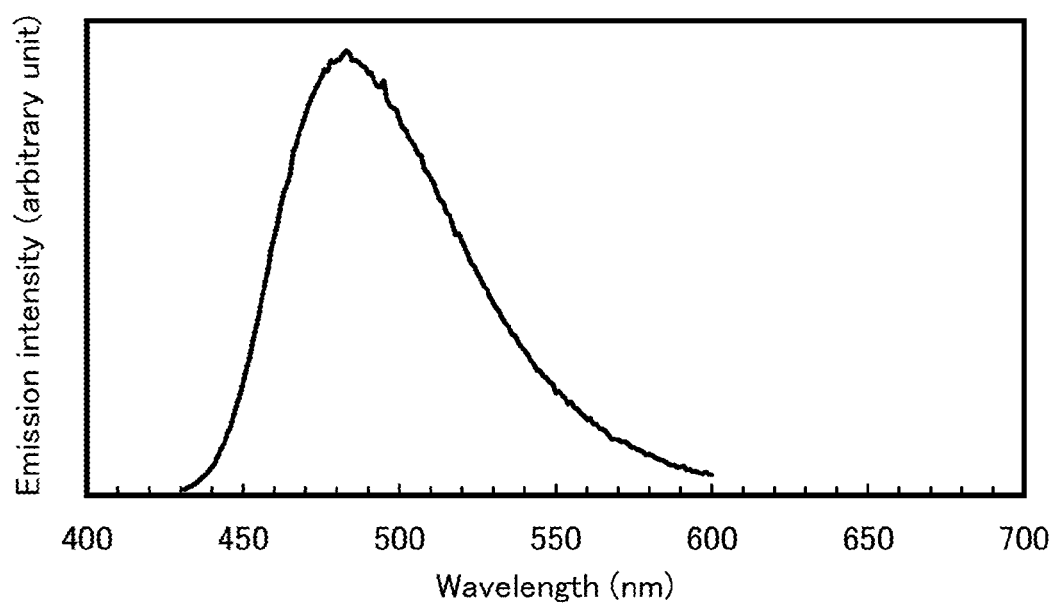
Figure 11A:
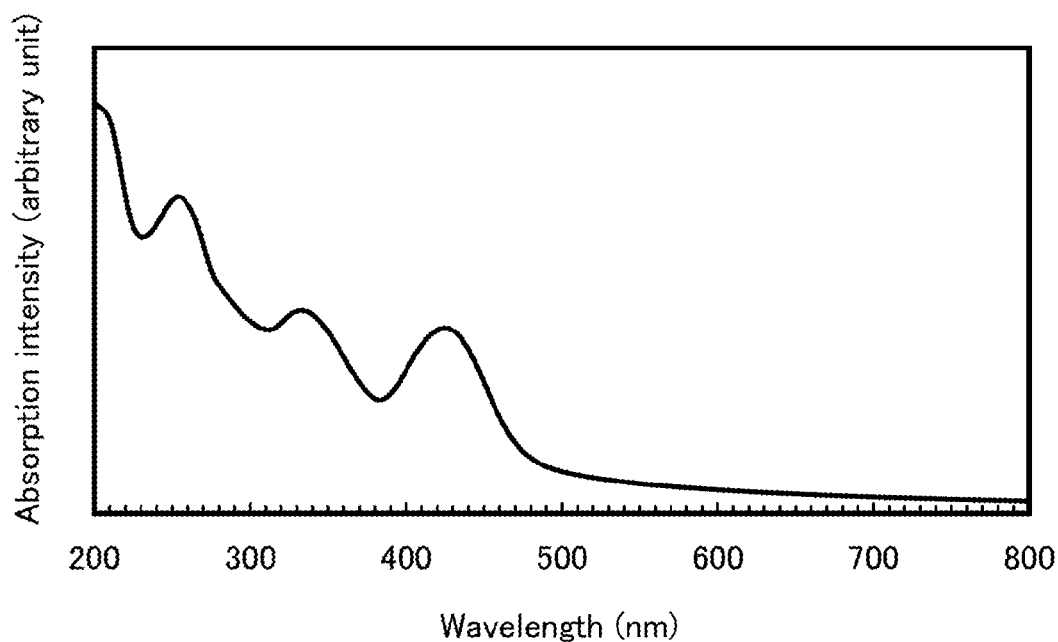
FIGS. 11A and 11B show an absorption spectrum and an emission spectrum, respectively, of a thin film of PCBAPDBq.
Figure 11B:
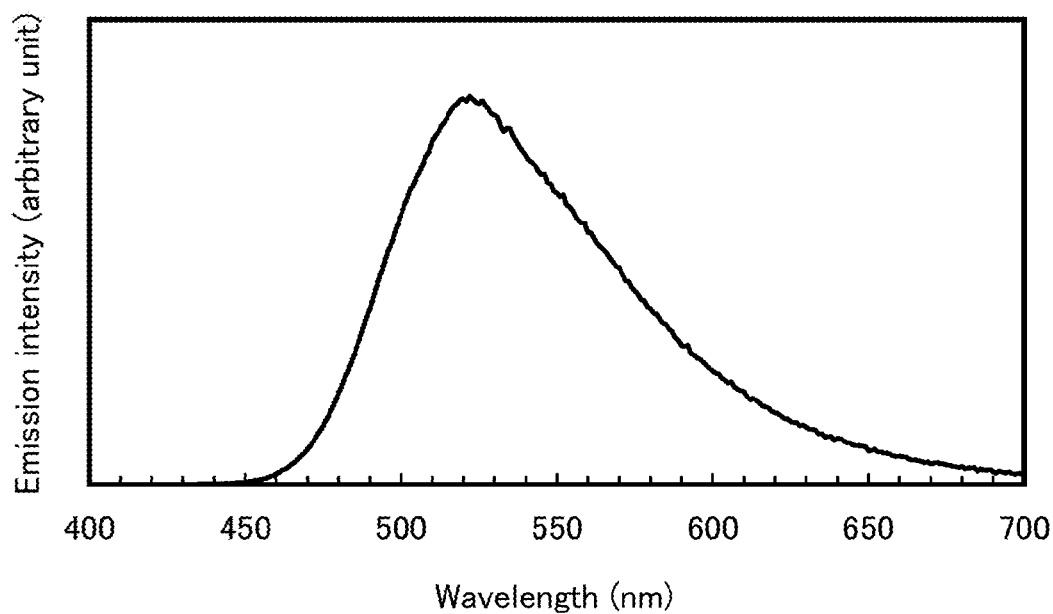

FIGS. 10A and 10B show an absorption spectrum and an emission spectrum, respectively, of PCBAPDBq in a toluene solution of PCBAPDBq. FIGS. 11A and 11B show an absorption spectrum and an emission spectrum, respectively, of a thin film of PCBAPDBq. The absorption spectrum was measured with a UV-visible spectrophotometer (V550, produced by JASCO Corporation). The measurements were performed with samples prepared in such a manner that the toluene solution was put in a quartz cell and the thin film was obtained by deposition of PCBAPDBq on a quartz substrate by evaporation. The absorption spectrum of PCBAPDBq in the toluene solution of PCBAPDBq was obtained by subtracting the absorption spectra of quartz and toluene from those of quartz and the toluene solution, and the absorption spectrum of the thin film of PCBAPDBq was obtained by subtracting the absorption spectrum of the quartz substrate from those of the quartz substrate and the thin film.

In each of FIGS. 10A, 10B, 11A, and 11B, the horizontal axis represents wavelength (nm) and the vertical axis represents intensity (arbitrary unit). In the case of the toluene solution, the absorption peaks are around 282 nm, 325 nm, and 416 nm, and the emission wavelength peak is around 483 nm. In the case of the thin film, the absorption peaks are around 254 nm, 333 nm, and 425 nm, and the emission wavelength peak is around 522 nm.

EXAMPLE 2

In this example, a synthesis method of 3-(dibenzo[f,h]quinoxalin-2-yl)-4'-(9H-carbazol-9-yl)triphenylamine (abbreviation: mYGAPDBq), which is an organic compound of one embodiment of the present invention and represented by Structural Formula (201) in Embodiment 1, will be described.

(201)

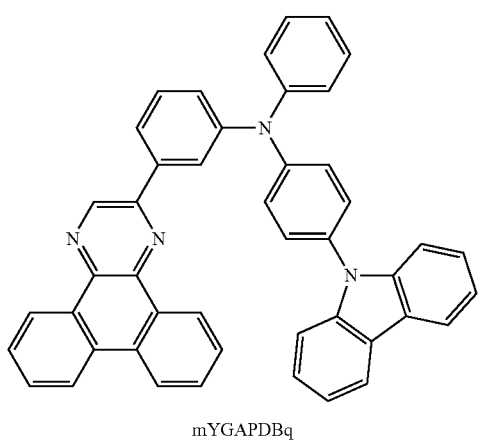

mYGAPDBq

Synthesis of 3-(Dibenzo[f,h]quinoxalin-2-yl)-4'-(9H-carbazol-9-yl)triphenylamine (abbreviation: mYGAPDBq)

A synthesis scheme of 3-(dibenzo[f,h]quinoxalin-2-yl)-4'-(9H-carbazol-9-yl)triphenylamine (abbreviation: mYGAPDBq) is shown in (C-1).

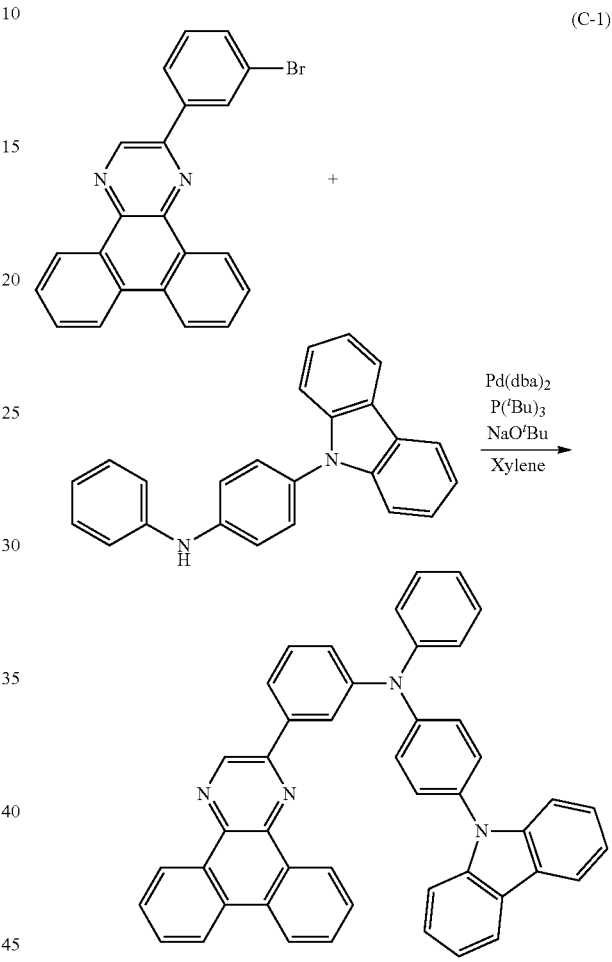

(C-1)

In a 200 mL three-neck flask were put 1.1 g (2.9 mmol) of 2-(3-bromophenyl)dibenzo[f,h]quinoxaline, 1.0 g (3.0 mmol) of 9-[4-(N-phenylamino)phenyl]-9H-carbazole, and 0.60 g (6.2 mmol) of sodium tert-butoxide. The air in the flask was replaced with nitrogen under reduced pressure. To this mixture was added 30 mL of xylene, and the mixture was degassed by being stirred under reduced pressure. To this mixture were added 0.2 mL of tri(tert-butyl)phosphine (10 wt % hexane solution) and 55 g (96 μmol) of bis(dibenzylideneacetone)palladium(0). This mixture was refluxed at 140° C. under a nitrogen stream for 7 hours. After predetermined time passed, water was added to the obtained mixture to extract an aqueous layer with toluene. The solution of the obtained extract and the organic layer were combined and washed with a saturated aqueous solution of sodium carbonate and saturated saline, and the resulting organic layer was dried with magnesium sulfate. The obtained mixture was gravity filtered, and the filtrate was concentrated to give an oily substance. The obtained oily substance was purified by silica gel column chromatography (toluene: hexane=1:2) to give an oily substance. Methanol was added to the obtained oily substance, followed by irradiation with ultrasonic waves. The precipitated solid was collected by suction filtration to give the target substance as 0.57 g of yellow powder in a yield of 30%.

By a train sublimation method, 0.55 g of the obtained yellow powder of 2-(3-{N-[4-(9H-carbazol-9-yl)phenyl]-N-phenylamino}phenyl)dibenzo[f,h]quinoxaline was purified. In the purification, 2-(3-{N-[4-(9H-carbazol-9-yl)phenyl]-N-phenylamino}phenyl)dibenzo[f,h]quinoxaline was heated at 300° C. under the conditions that the pressure was 3.0 Pa and the argon flow rate was 5.0 mL/min for 16 hours. After the purification, 0.45 g of yellow glass-like substance of 2-(3-{N-[4-(9H-carbazol-9-yl)phenyl]-N-phenylamino}phenyl) dibenzo[f,h]quinoxaline was obtained at a collection rate of 82%.

A nuclear magnetic resonance spectrometry ($^1$H-NMR) identified this compound as 3-(dibenzo[f,h]quinoxalin-2-yl)-4'-(9H-carbazol-9-yl)triphenylamine (abbreviation: mYGAPDBq) which was the target substance.

$^1$H NMR data of the obtained substance are as follows: $^1$H NMR (DMSO-d$_6$, 300 MHz): δ=7.21-7.51 (m, 14H), 7.60-7.73 (m, 4H), 7.81-7.92 (m, 3H), 8.18 (d, J=7.8 Hz, 1H), 8.25-8.30 (m, 3H), 8.88 (d, J=8.4 Hz, 2H), 9.08 (d, J=7.8 Hz, 1H), 9.15 (d, J=7.8 Hz, 1H), 9.65 (s, 1H).

Figure 26A:
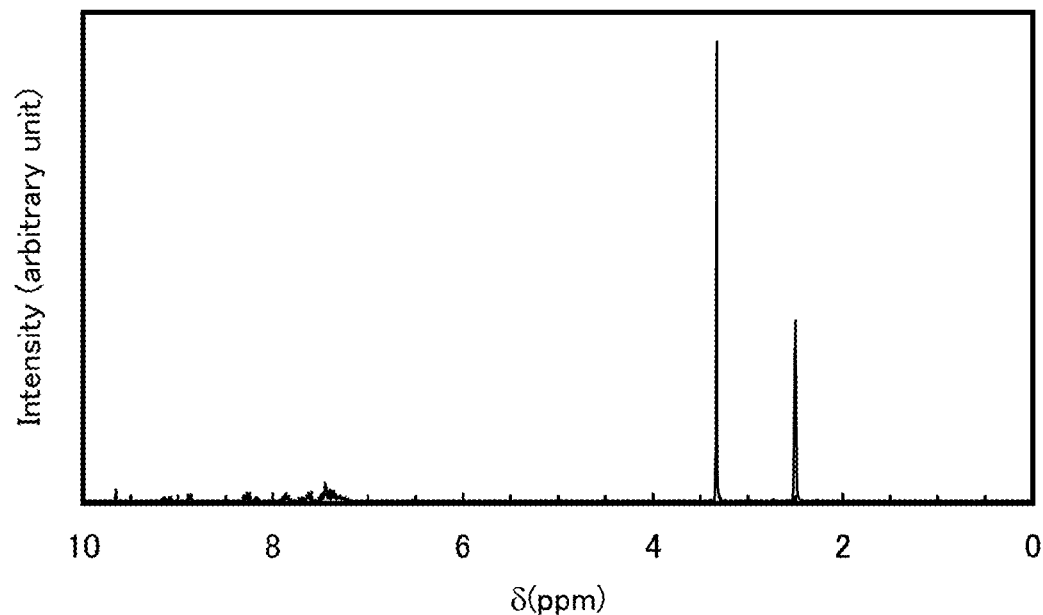
FIGS. 26A and 26B are $^1$H NMR charts of 3-(dibenzo[f,h]quinoxalin-2-yl)-4'-(9H-carbazol-9-yl)triphenylamine (abbreviation: mYGAPDBq).
Figure 26B:
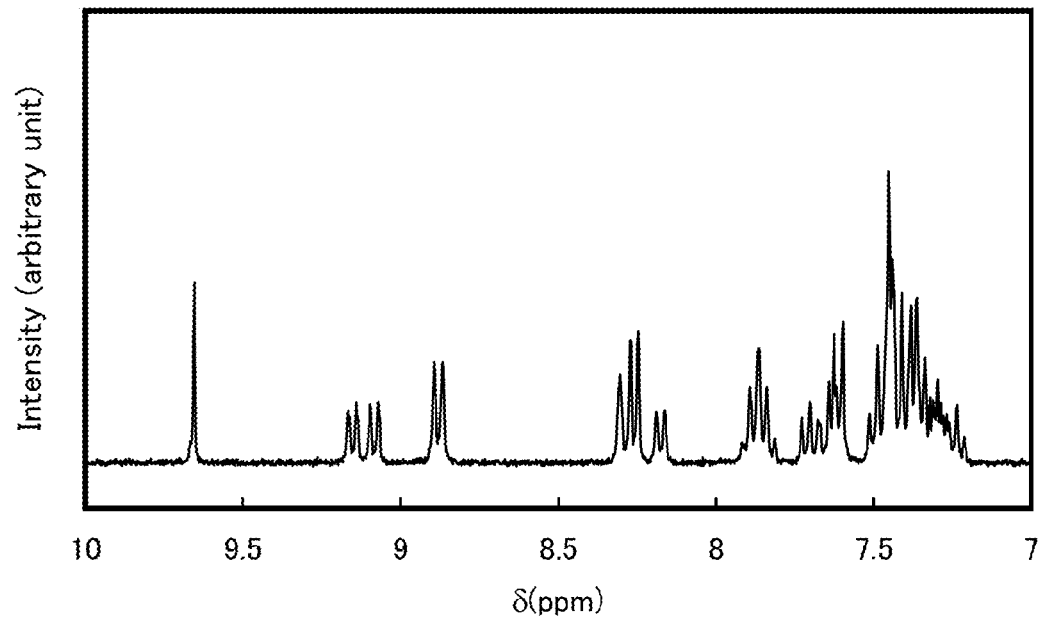

FIGS. 26A and 26B are $^1$H-NMR charts. Note that FIG. 26B is a chart where the range of from 7.0 ppm to 10.0 ppm in FIG. 26A is enlarged.

Figure 27A:
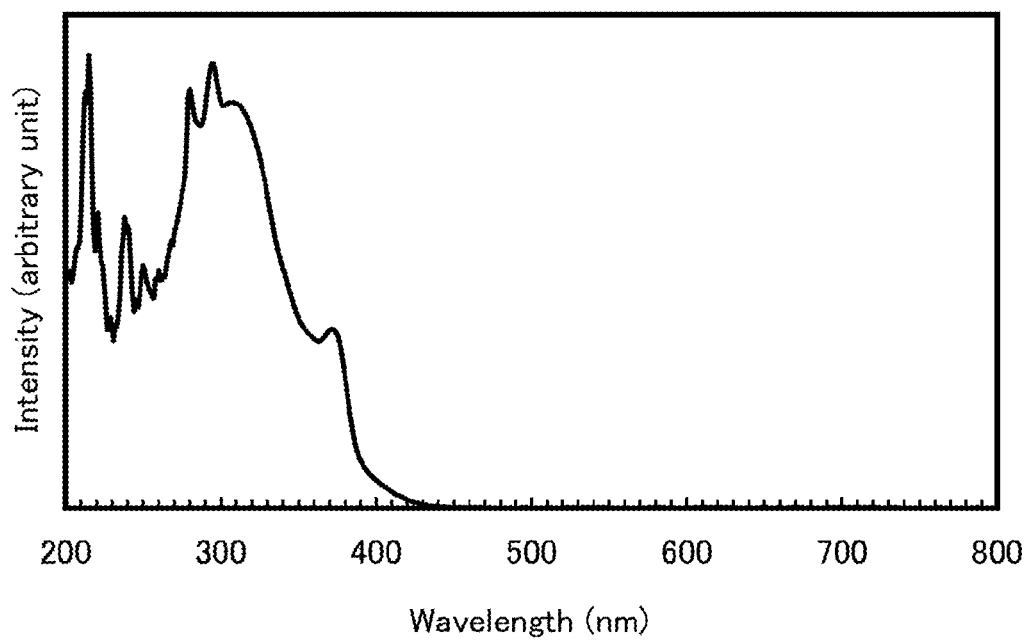
FIGS. 27A and 27B show an absorption spectrum and an emission spectrum, respectively, of mYGAPDBq in a toluene solution of mYGAPDBq.
Figure 27B:
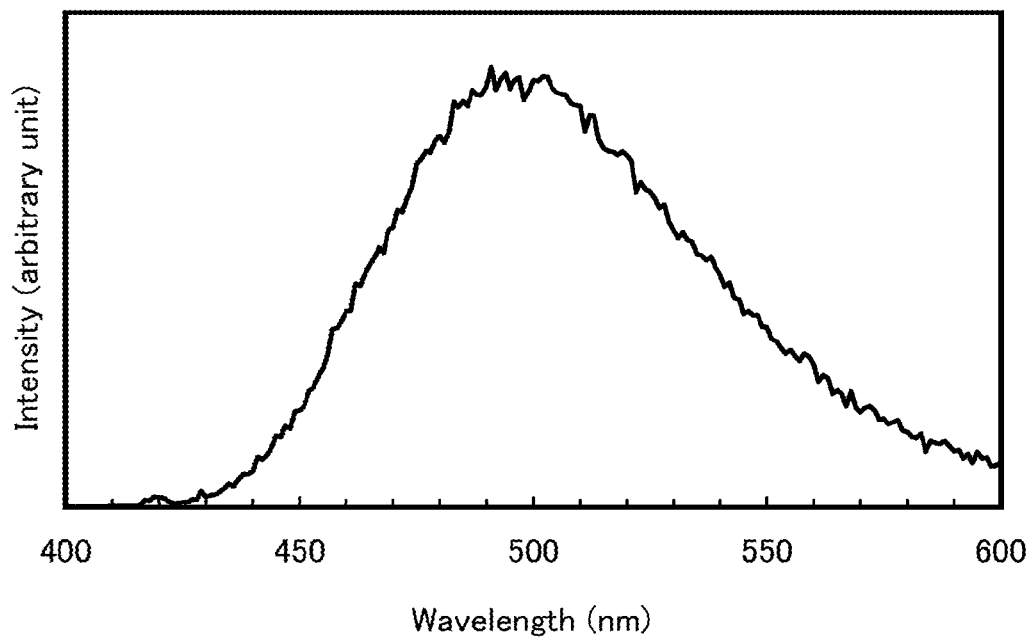
Figure 28A:
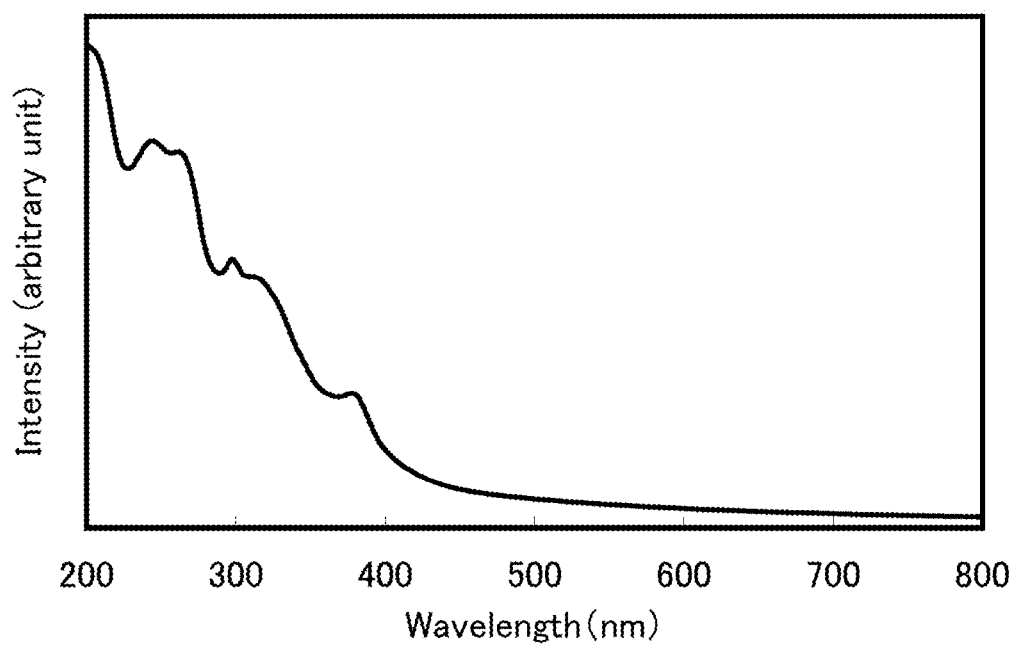
FIGS. 28A and 28B show an absorption spectrum and an emission spectrum, respectively, of a thin film of mYGAPDBq.
Figure 28B:
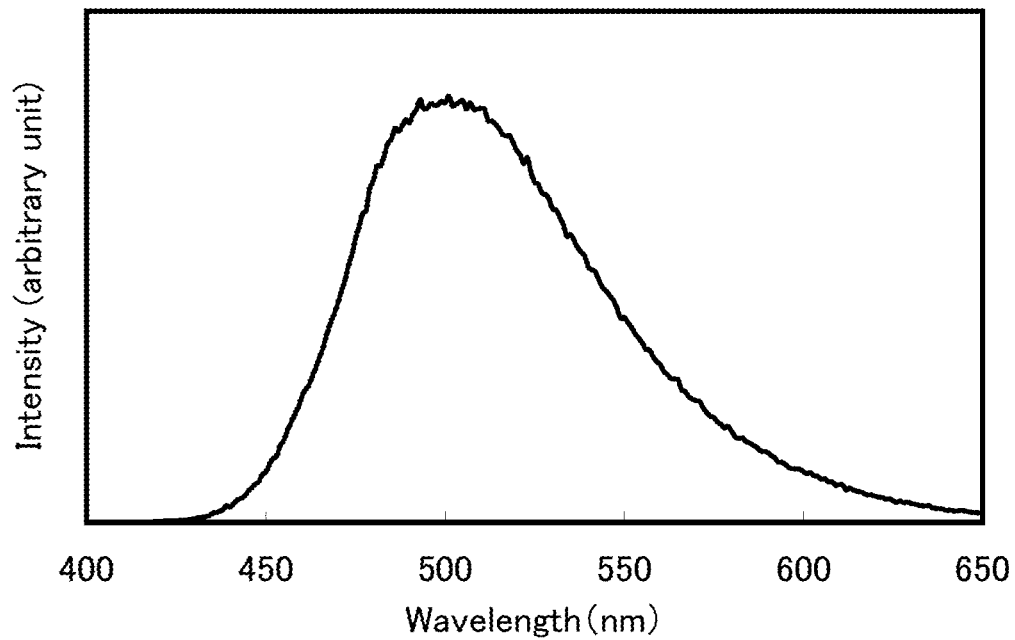

FIGS. 27A and 27B show an absorption spectrum and an emission spectrum, respectively, of mYGAPDBq in a toluene solution of mYGAPDBq. FIGS. 28A and 28B show an absorption spectrum and an emission spectrum, respectively, of a thin film of mYGAPDBq. The absorption spectrum was measured with a UV-visible spectrophotometer (V550, produced by JASCO Corporation). The measurements were performed with samples prepared in such a manner that the toluene solution was put in a quartz cell and the thin film was obtained by deposition of mYGAPDBq on a quartz substrate. The absorption spectrum of mYGAPDBq in the toluene solution of mYGAPDBq was obtained by subtracting the absorption spectra of quartz and toluene from those of quartz and the toluene solution, and the absorption spectrum of the thin film of mYGAPDBq was obtained by subtracting the absorption spectrum of the quartz substrate from those of the quartz substrate and the thin film.

In each of FIGS. 27A, 27B, 28A, and 28B, the horizontal axis represents wavelength (nm) and the vertical axis represents intensity (arbitrary unit). In the case of the toluene solution, the absorption peaks are around 215 nm, 280 nm, 293 nm, and 372 nm, and the emission wavelength peak is around 502 nm. In the case of the thin film, the absorption peaks are around 244 nm, 261 nm, 288 nm, 313 nm, and 377 nm, and the emission wavelength peak is around 500 nm.

Next, mYGAPDBq obtained in this example was analyzed by liquid chromatography mass spectrometry (LC/MS).

The LC/MS analysis was carried out with Acquity UPLC (produced by Waters Corporation) and Xevo G2 T of MS (produced by Waters Corporation).

In the MS analysis, ionization was carried out by an electrospray ionization (ESI) method. At this time, the capillary voltage and the sample cone voltage were set to 3.0 kV and 30 V, respectively, and detection was performed in a positive mode. A component which underwent the ionization under the above-described conditions was collided with an argon gas in a collision cell to dissociate into product ions. Energy (collision energy) for the collision with argon was 70 eV. The mass range for the measurement was m/z=100 to 1200.

Figure 29:
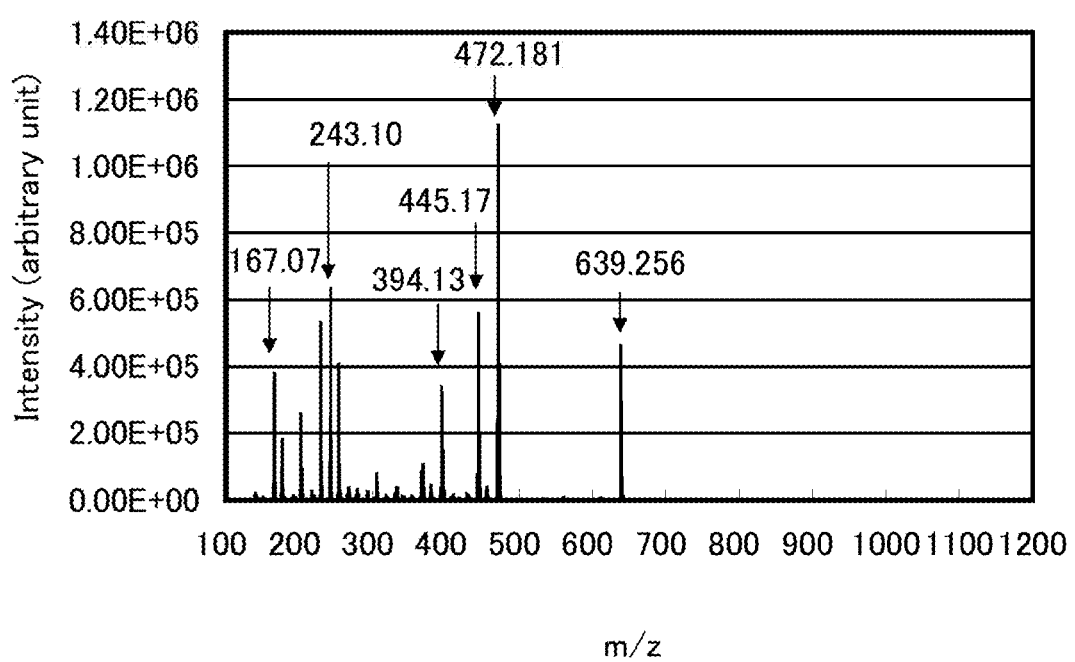
FIG. 29 shows results of LC/MS analysis of mYGAPDBq.

FIG. 29 shows results of the MS analysis. The results in FIG. 29 show that as for mYGAPDBq which is one embodiment of the present invention, peaks of product ions are detected mainly around m/z=167, m/z=243, m/z=394, m/z=445, and m/z=472, and a peak derived from a precursor ion is detected around m/z=639. Here, "around" is used to indicate changes in values of product ions and precursor ions due to the existence and absence of hydrogen ions and the existence of isotopes and to indicate that these changes in values are in an acceptable range. Note that the results shown in FIG. 29 show characteristics derived from mYGAPDBq and therefore can be regarded as important data for identifying mYGAPDBq contained in the mixture.

EXAMPLE 3

In this example, a light-emitting element 1 which includes a light-emitting layer containing a phosphorescent compound and the organic compound which is described in Embodiment 1 and Example 1 and is represented by Structural Formula (100) was evaluated. Chemical formulae of materials used in this example are shown below.

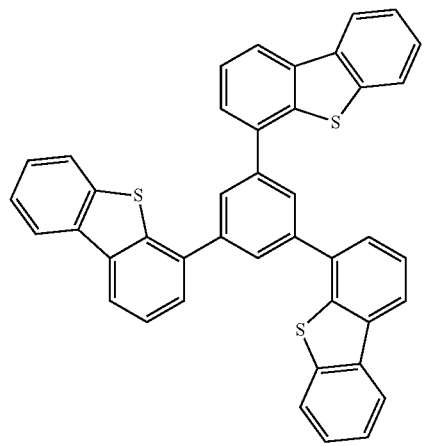

DBT3P-II

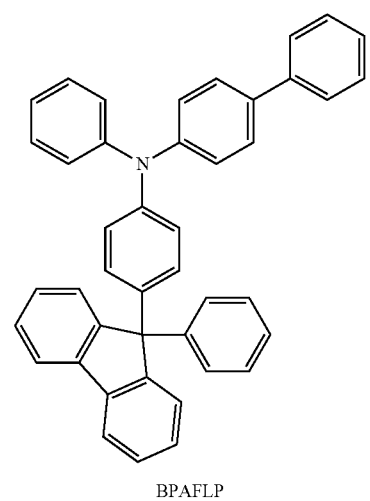

BPAFLP

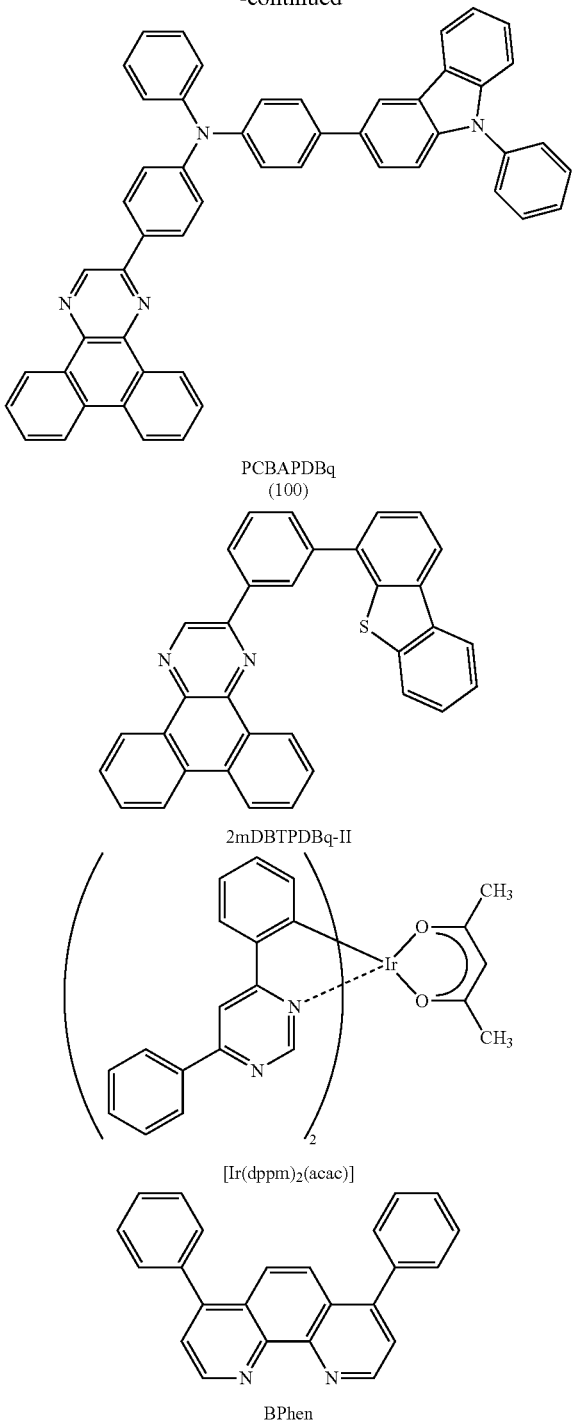

PCBAPDBq
(100)

2mDBTPDBq-II

[Ir(dppm)₂(acac)]

BPhen

Figure 12:
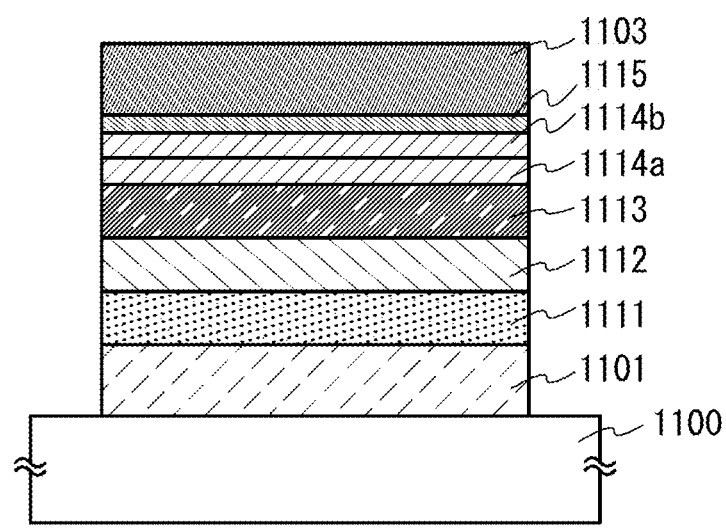
FIG. 12 is illustrates light-emitting elements of Examples.

The light-emitting element 1 is described with reference to FIG. 12. A manufacturing method of the light-emitting element 1 of this example is described below.

(Light-Emitting Element 1)

First, an indium oxide-tin oxide compound containing silicon or silicon oxide (ITO—SiO$_2$, hereinafter abbreviated to ITSO) was deposited by a sputtering method over a substrate 1100, whereby a first electrode 1101 was formed. Note that the composition ratio of In$_2$O$_3$ to SnO$_2$ and SiO$_2$ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus. Then, the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, 4,4',4"-(1,3,5-benzenetriyl)tri(dibenzothiophene) (abbreviation: DBT3P-II) and molybdenum oxide were co-evaporated to form a hole-injection layer 1111 on the first electrode 1101. The thickness of the hole-injection layer 1111 was set to 40 nm, and the weight ratio of DBT3P-II to molybdenum oxide was adjusted to 4:2 (=DBT3P-II: molybdenum oxide). Note that the co-evaporation method refers to an evaporation method in which evaporation is carried out from a plurality of evaporation sources at the same time in one treatment chamber.

Next, on the hole-injection layer 1111, a film of 4-phenyl-4'-(9-phenylfluoren-9-yl)triphenylamine (abbreviation: BPAFLP) was formed to a thickness of 20 nm, whereby a hole-transport layer 1112 was formed.

Further, 4-(dibenzo[f,h]quinoxalin-2-yl)-4'-(9-phenyl-9H-carbazol-3-yl)triphenylamine (abbreviation: PCBAPDBq) synthesized in Example 1 and (acetylacetonato)bis(4,6-diphenylpyrimidinato)iridium(III) (another name: bis[2-(6-phenyl-4-pyrimidinyl-$_K$N3)phenyl-$_K$C](2,4-pentanedionato-$_K^2$O,O')iridium(III)) (abbreviation: [Ir(dppm)$_2$(acac)]) were co-evaporated, whereby a light-emitting layer 1113 was formed on the hole-transport layer 1112. Here, the weight ratio of PCBAPDBq to [Ir(dppm)$_2$(acac)] was adjusted to 1:0.05 (=PCBAPDBq: [Ir(dppm)$_2$(acac)]). The thickness of the light-emitting layer 1113 was set to 40 nm.

Note that [Ir(dppm)$_2$(acac)] is a phosphorescent compound and a guest material (dopant) in the light-emitting layer 1113. Further, PCBAPDBq is a host material in the light-emitting layer 1113.

Next, on the light-emitting layer 1113, a film of 2-[3-(dibenzothiophen-4-yl)phenyl]dibenzo[f,h]quinoxaline (abbreviation: 2mDBTPDBq-II) was formed to a thickness of 10 nm, whereby a first electron-transport layer 1114a was formed.

Next, a film of bathophenanthroline (abbreviation: BPhen) was formed to a thickness of 20 nm on the first electron-transport layer 1114a, whereby a second electron-transport layer 1114b was formed.

Further, a film of lithium fluoride (LiF) was formed to a thickness of 1 nm on the second electron-transport layer 1114b by evaporation, whereby an electron-injection layer 1115 was formed.

Lastly, a film of aluminum was formed to a thickness of 200 nm by evaporation, whereby a second electrode 1103 functioning as a cathode was formed. Thus, the light-emitting element 1 of this example was manufactured.

Table 1 shows an element structure of the light-emitting element 1 obtained as described above.

TABLE 1

| | First electrode | Hole-injection layer | Hole-transport layer | Light-emitting layer | First electron-transport layer | Second electron-transport layer | Electron-injection layer | Second electrode |
|---|---|---|---|---|---|---|---|---|
| Light-emitting element 1 | ITSO 110 nm | DBT3P-II:MoOx (=4:2) 40 nm | BPAFLP 20 nm | PCBAPDBq:Ir(dppm)$_2$acac (=1:0.05) 40 nm | 2mDBTPDBq-II 10 nm | BPhen 20 nm | LiF 1 nm | Al 200 nm |

Next, in a glove box containing a nitrogen atmosphere, the light-emitting element 1 was sealed so as not to be exposed to the air (a sealant was applied onto an outer edge of the element and heat treatment was performed at 80° C. for one hour at the time of sealing). After that, operation characteristics of the light-emitting element 1 were measured. Note that the measurement was carried out at room temperature (in an atmosphere kept at 25° C.).

Figure 13:
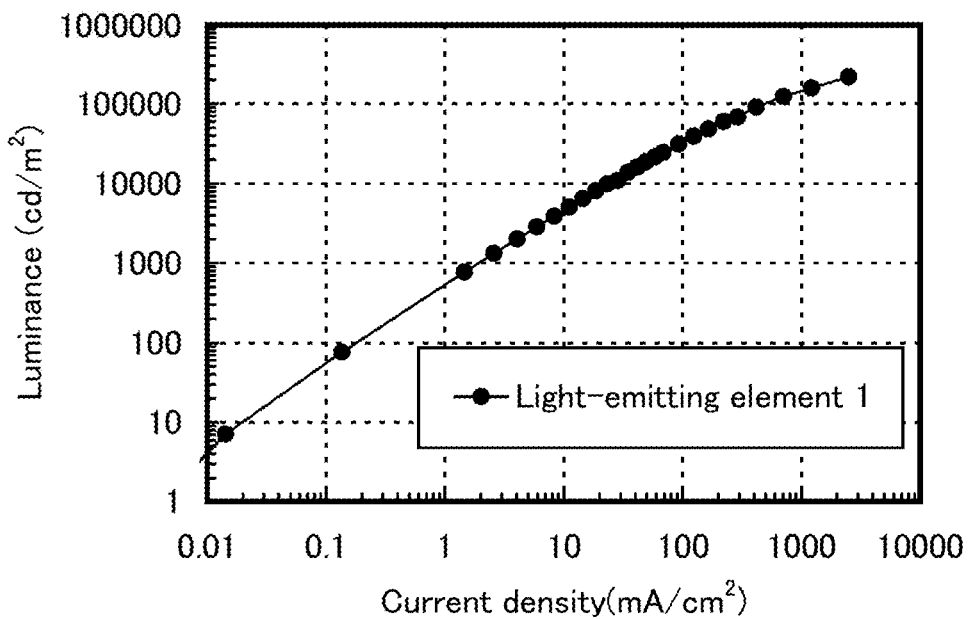
FIG. 13 shows luminance versus current density characteristics of a light-emitting element 1.
Figure 14:
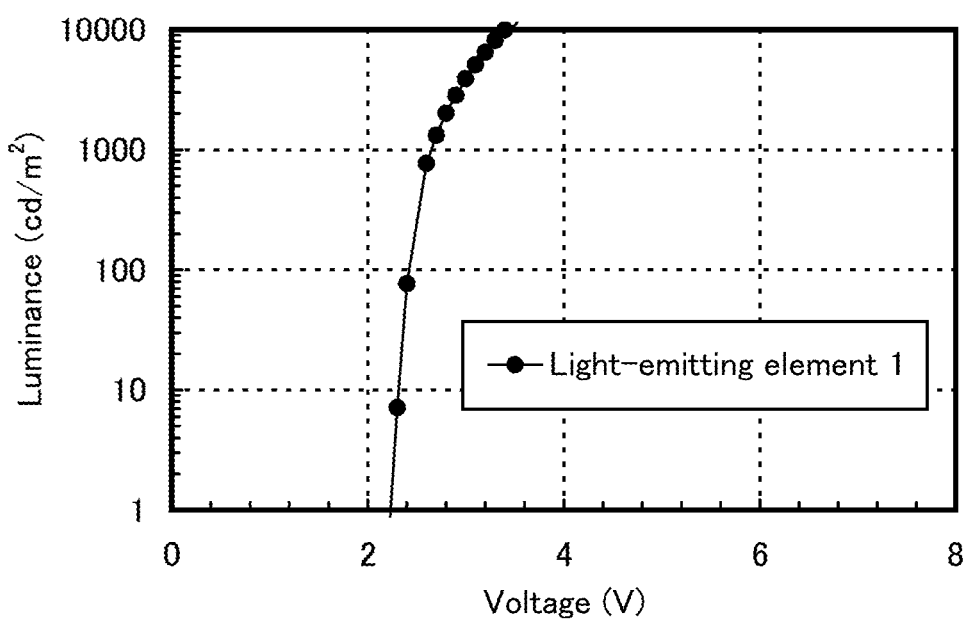
FIG. 14 shows luminance versus voltage characteristics of the light-emitting element 1.
Figure 15:
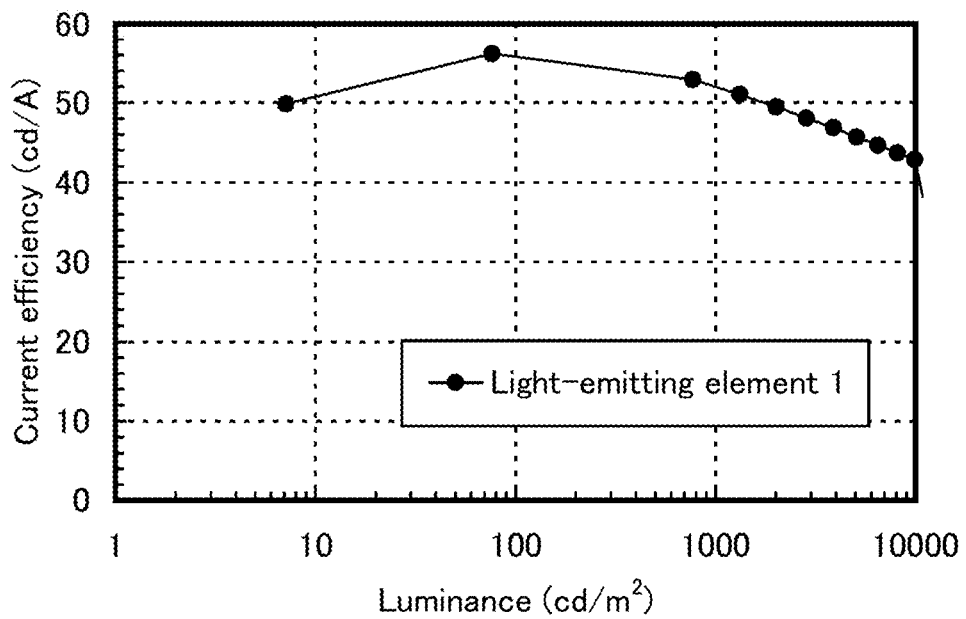
FIG. 15 shows current efficiency versus luminance characteristics of the light-emitting element 1.
Figure 16:
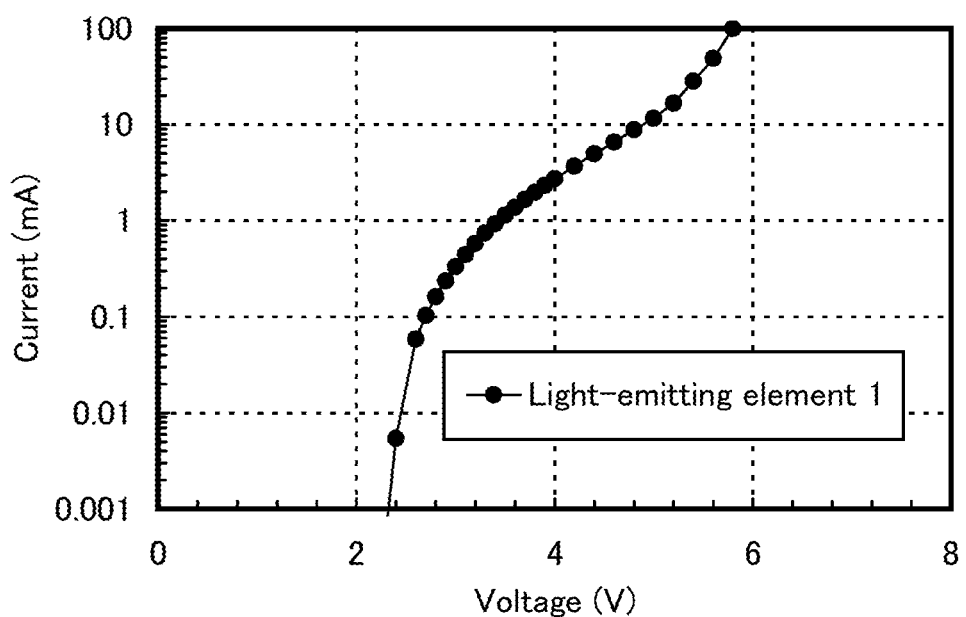
FIG. 16 shows current versus voltage characteristics of the light-emitting element 1.

FIG. 13 shows luminance versus current density characteristics of the light-emitting element 1. In FIG. 13, the horizontal axis represents current density (mA/cm$^2$) and the vertical axis represents luminance (cd/m$^2$). FIG. 14 shows luminance versus voltage characteristics of the light-emitting element 1. In FIG. 14, the horizontal axis represents voltage (V) and the vertical axis represents luminance (cd/m$^2$). FIG. 15 shows current efficiency versus luminance characteristics of the light-emitting element 1. In FIG. 15, the horizontal axis represents luminance (cd/m$^2$) and the vertical axis represents current efficiency (cd/A). FIG. 16 shows current versus voltage characteristics of the light-emitting element 1. In FIG. 16, the horizontal axis represents voltage (V) and the vertical axis represents current (mA).

FIG. 13 and FIG. 15 show that the light-emitting element 1 has high efficiency. FIG. 13, FIG. 14, and FIG. 16 show that the light-emitting element 1 has low driving voltage and low power consumption.

Table 2 shows the voltage (V), current density (mA/cm$^2$), CIE chromaticity coordinates (x, y), luminance (cd/m$^2$), current efficiency (cd/A), and external quantum efficiency (%) of the light-emitting element 1 at a luminance of 770 cd/m$^2$.

TABLE 2

| | Voltage (V) | Current density (mA/cm$^2$) | Chromaticity x | Chromaticity y | Luminance (cd/m$^2$) | Current efficiency (cd/A) | External quantum efficiency(%) |
|---|---|---|---|---|---|---|---|
| Light-emitting element 1 | 2.6 | 1.5 | 0.56 | 0.43 | 770 | 53 | 20 |

Figure 17:
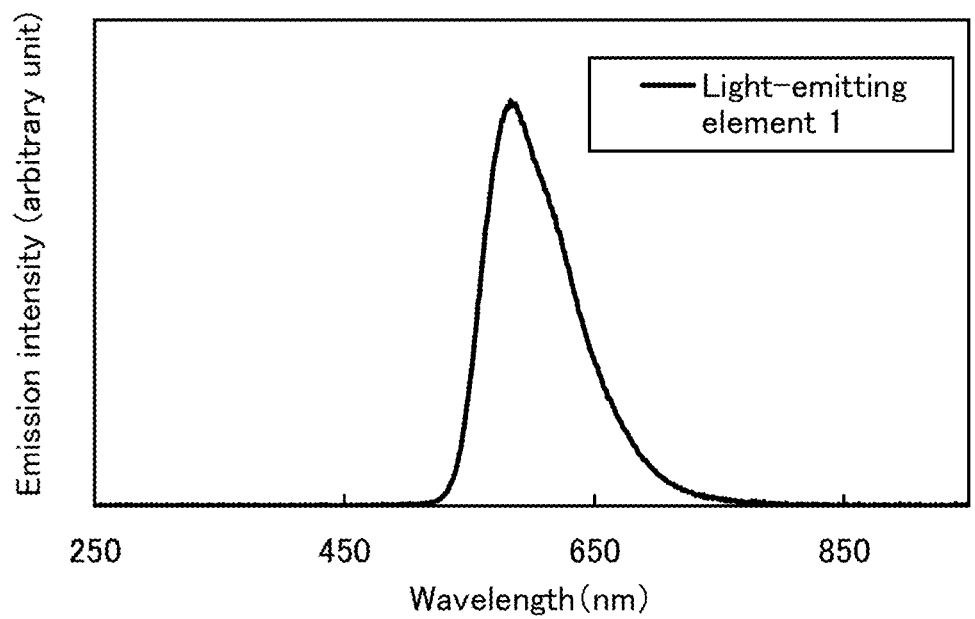
FIG. 17 shows an emission spectrum of the light-emitting element 1.

FIG. 17 shows an emission spectrum at a current density of the light-emitting element 1 of 2.5 mA/cm$^2$. As shown in FIG. 17, the emission spectrum of the light-emitting element 1 has a peak at 583 nm.

As shown in Table 2, the CIE chromaticity coordinates of the light-emitting element 1 at a luminance of 770 cd/m$^2$ were (x, y)=(0.56, 0.43). The results show that light emanating from the dopant was obtained.

As described above, the light-emitting element 1 in which the phosphorescent compound and PCBAPDBq which is the organic compound of one embodiment of the present invention are contained in the light-emitting layer can efficiently emit light in the orange wavelength range. It can be said that PCBAPDBq is suitable as a host material for a material emitting light with a wavelength equal to or longer than that of orange light.

Figure 18:
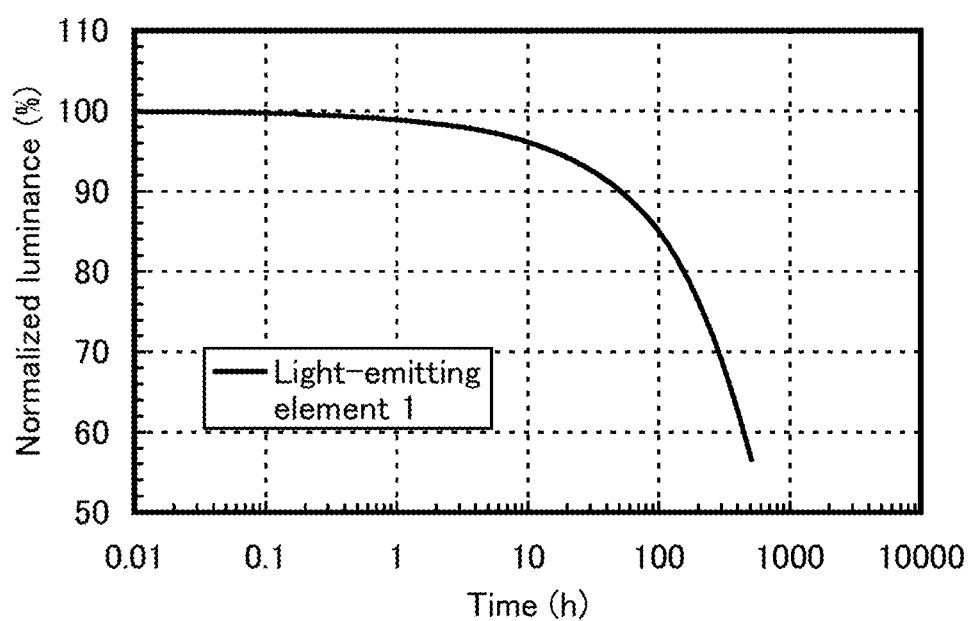
FIG. 18 shows normalized luminance versus driving time characteristics of the light-emitting element 1.

Next, a reliability test was performed on the light-emitting element 1. FIG. 18 shows results of the reliability test.

In the reliability test, the light-emitting element 1 was driven under the conditions where the initial luminance was 5000 cd/m$^2$ and the current density was constant. The results are shown in FIG. 18. The horizontal axis represents driving time (h) of the element and the vertical axis represents normalized luminance (%) on the assumption that the initial luminance is 100%. According to FIG. 18, it takes about 510 hours for the normalized luminance of the light-emitting element 1 to decline to 57%.

FIG. 18 shows that the light-emitting element 1 has a long lifetime.

The above results show that the light-emitting element 1 which includes the light-emitting layer containing the phosphorescent compound and PCBAPDBq which is the organic compound of one embodiment of the present invention has high efficiency, low driving voltage, low power consumption, and a long lifetime.

EXAMPLE 4

In this example, a light-emitting element 2 which includes a light-emitting layer containing a phosphorescent compound and the organic compound which is described in Embodiment 1 and Example 1 and is represented by Structural Formula (100) was evaluated. Note that the light-emitting layer of the light-emitting element 2 described in this example has a different structure from the light-emitting layer of the light-emitting element 1 described in Example 3. Chemical formulae of materials used in this example are shown below.

81

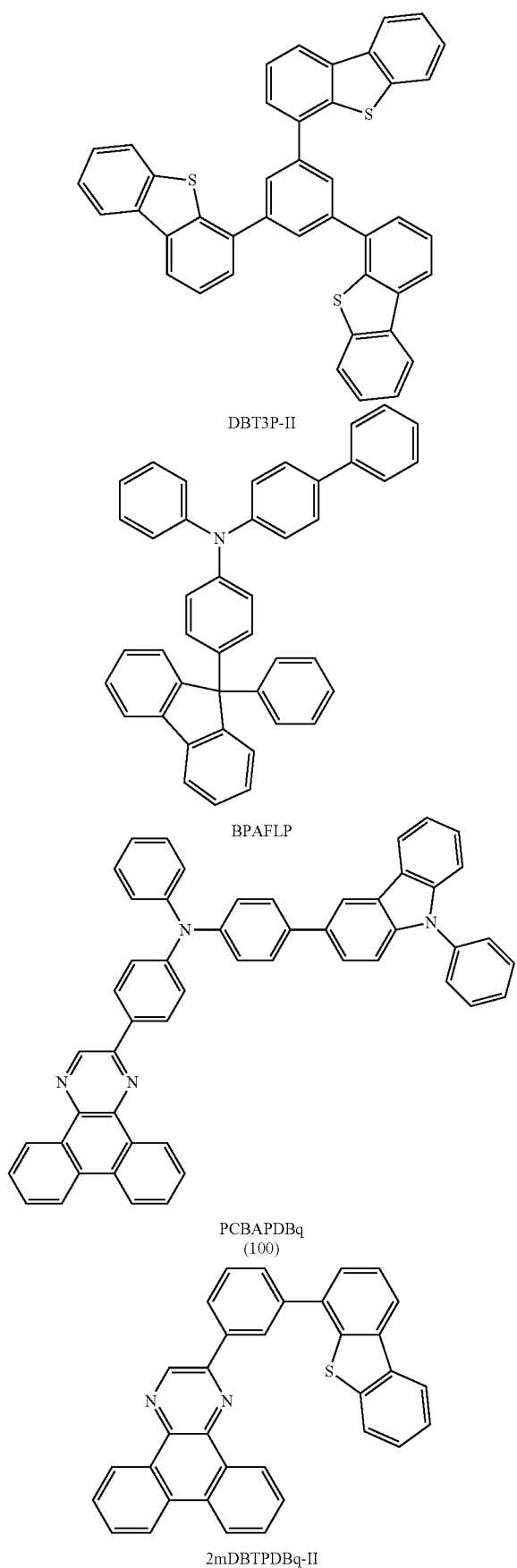

82

-continued

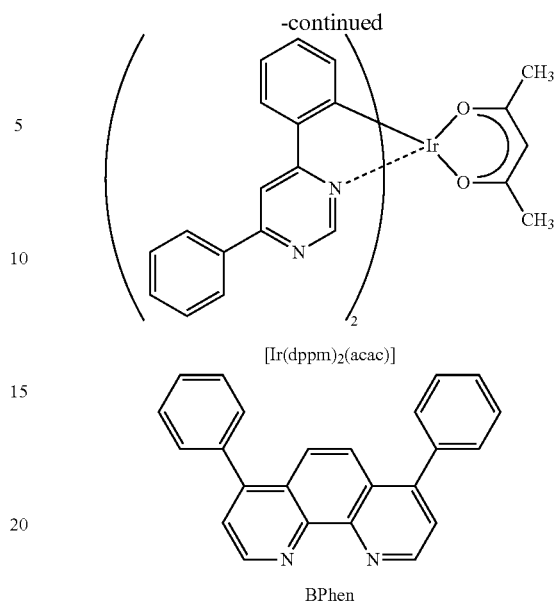

[Ir(dppm)₂(acac)]

BPhen

The light-emitting element 2 is described with reference to FIG. 12. A manufacturing method of the light-emitting element 2 of this example is described below.

(Light-Emitting Element 2)

First, an indium oxide-tin oxide compound containing silicon or silicon oxide (ITO—SiO₂, hereinafter abbreviated to ITSO) was deposited by a sputtering method over a substrate 1100, whereby a first electrode 1101 was formed. Note that the composition ratio of In₂O₃ to SnO₂ and SiO₂ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately 10⁻⁴ Pa, and subjected to vacuum baking at 170° C. for 30 minutes in a heating chamber of the vacuum evaporation apparatus. Then, the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about 10⁻⁴ Pa. Then, 4,4′,4″-(1,3,5-benzenetriyl)tri(dibenzothiophene) (abbreviation: DBT3P-II) and molybdenum oxide were co-evaporated to form a hole-injection layer 1111 on the first electrode 1101. The thickness of the hole-injection layer 1111 was set to 40 nm, and the weight ratio of DBT3P-II to molybdenum oxide was adjusted to 4:2 (=DBT3P-II: molybdenum oxide).

Next, on the hole-injection layer 1111, a film of 4-phenyl-4′-(9-phenylfluoren-9-yl)triphenylamine (abbreviation: BPAFLP) was formed to a thickness of 20 nm, whereby a hole-transport layer 1112 was formed.

Further, 2-[3-(dibenzothiophen-4-yl)phenyl]dibenzo[f,h]quinoxaline (abbreviation: 2mDBTPDBq-II), 4-(dibenzo[f,h]quinoxalin-2-yl)-4′-(9-phenyl-9H-carbazol-3-yl)triphenylamine (abbreviation: PCBAPDBq) synthesized in Example 1, (acetylacetonato)bis(4,6-diphenylpyrimidinato)iridium (III) (another name: bis[2-(6-phenyl-4-pyrimidinyl-$_\kappa$N3)phenyl-$_\kappa$C](2,4-pentanedionato-$_\kappa{}^2$O,O')iridium(III)) (abbreviation: [Ir(dppm)$_2$(acac)]) were co-evaporated, whereby a light-emitting layer 1113 was formed on the hole-transport layer 1112. Here, the weight ratio of 2mDBTPDBq-II to PCBAPDBq and [Ir(dppm)$_2$(acac)] was adjusted to 0.6:0.4: 0.05 (=2mDBTPDBq-II: PCBAPDBq: [Ir(dppm)$_2$(acac)]). The thickness of the light-emitting layer 1113 was set to 40 nm.

Note that [Ir(dppm)$_2$(acac)] is a phosphorescent compound and a guest material (dopant) in the light-emitting layer 1113. Further, 2mDBTPDBq-II is a host material in the light-emitting layer 1113. Further, PCBAPDBq is an assist material in the light-emitting layer 1113.

Figure 20:
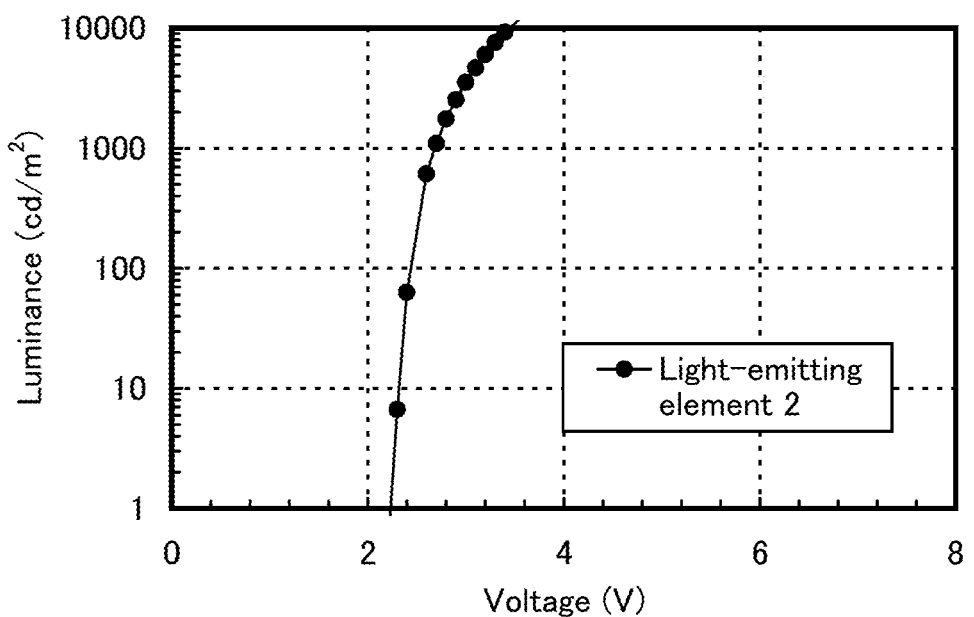
FIG. 20 shows luminance versus voltage characteristics of the light-emitting element 2.
Figure 21:
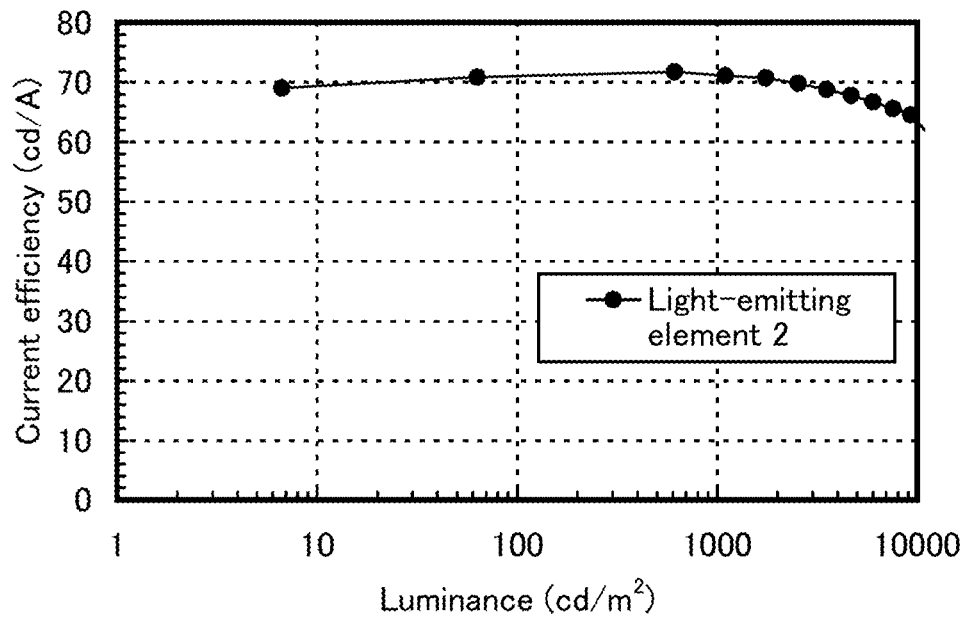
FIG. 21 shows current efficiency versus luminance characteristics of the light-emitting element 2.
Figure 22:
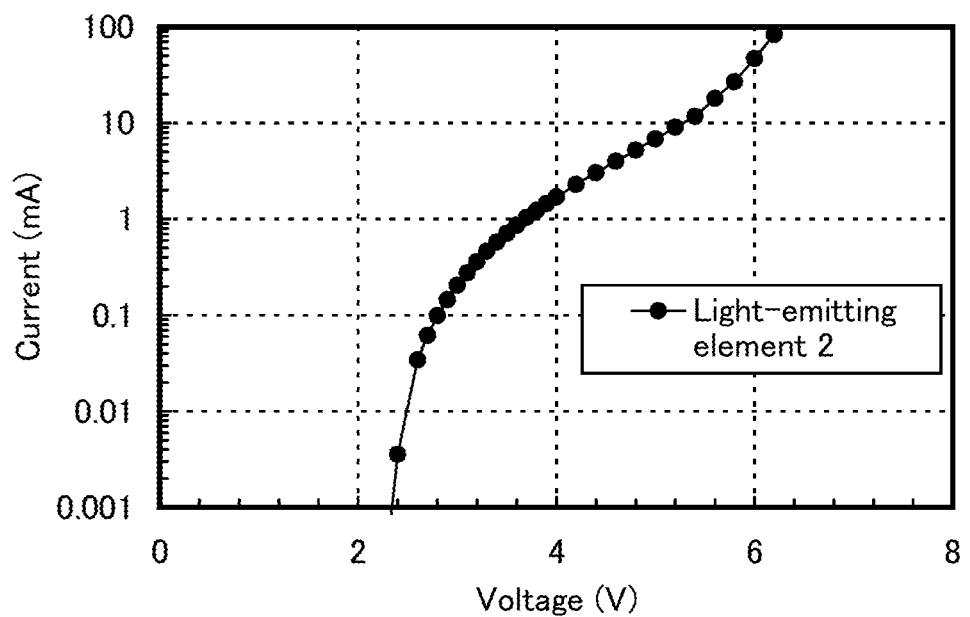
FIG. 22 shows current versus voltage characteristics of the light-emitting element 2.

Next, a film of 2mDBTPDBq-II was formed to a thickness of 10 nm on the light-emitting layer 1113, whereby a first electron-transport layer 1114a was formed.

versus voltage characteristics of the light-emitting element 2. In FIG. 20, the horizontal axis represents voltage (V) and the vertical axis represents luminance (cd/m$^2$). FIG. 21 shows current efficiency versus luminance characteristics of the light-emitting element 2. In FIG. 21, the horizontal axis represents luminance (cd/m$^2$) and the vertical axis represents current efficiency (cd/A). FIG. 22 shows current versus voltage characteristics of the light-emitting element 2. In FIG. 22, the horizontal axis represents voltage (V) and the vertical axis represents current (mA).

Figure 19:
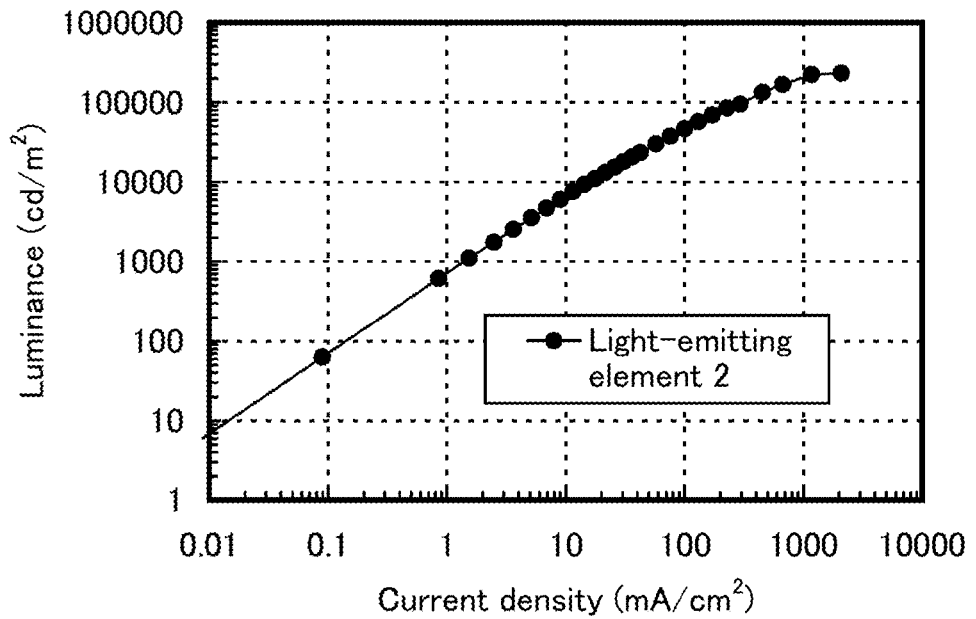
FIG. 19 shows luminance versus current density characteristics of a light-emitting element 2.

FIG. 19 and FIG. 21 show that the light-emitting element 2 has high efficiency. FIG. 19, FIG. 20, and FIG. 22 show that the light-emitting element 2 has low driving voltage and low power consumption.

Table 4 shows the voltage (V), current density (mA/cm$^2$), CIE chromaticity coordinates (x, y), luminance (cd/m$^2$), current efficiency (cd/A), and external quantum efficiency (%) of the light-emitting element 2 at a luminance of 1097 cd/m$^2$.

TABLE 4

| | Voltage (V) | Current density (mA/cm$^2$) | Chromaticity | | Luminance (cd/m$^2$) | Current efficiency (cd/A) | External quantum efficiency(%) |
|---|---|---|---|---|---|---|---|
| | | | x | y | | | |
| Light-emitting element 2 | 2.7 | 1.5 | 0.56 | 0.44 | 1097 | 71 | 27 |

Next, a film of bathophenanthroline (abbreviation: BPhen) was formed to a thickness of 20 nm on the first electron-transport layer 1114a, whereby a second electron-transport layer 1114b was formed.

Further, a film of lithium fluoride (LiF) was formed to a thickness of 1 nm on the second electron-transport layer 1114b by evaporation, whereby an electron-injection layer 1115 was formed.

Lastly, a film of aluminum was formed to a thickness of 200 nm by evaporation, whereby a second electrode 1103 functioning as a cathode was formed. Thus, the light-emitting element 2 of this example was manufactured.

Table 3 shows an element structure of the light-emitting element 2 obtained as described above.

Figure 23:
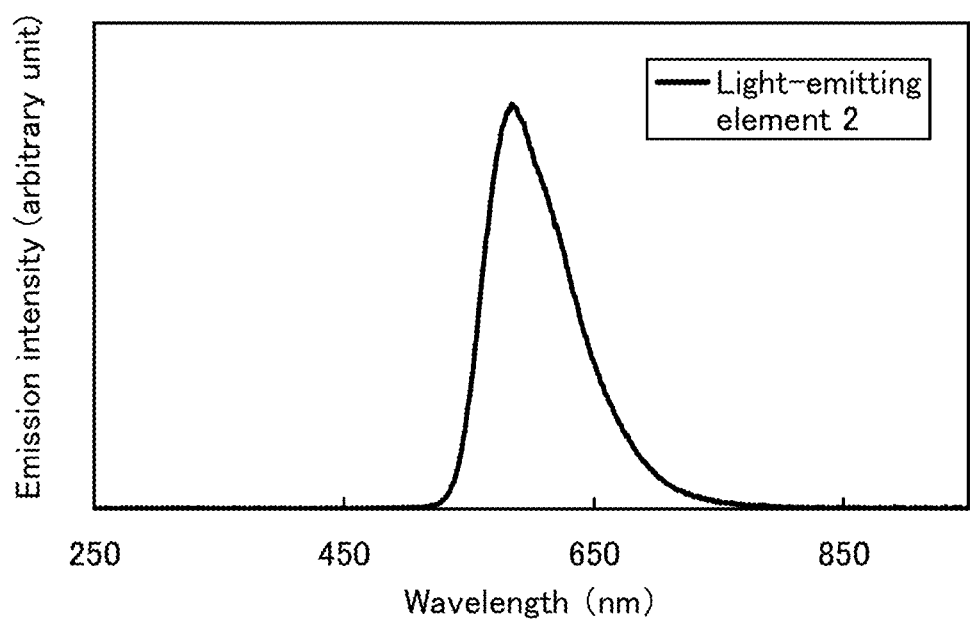
FIG. 23 shows an emission spectrum of the light-emitting element 2.

FIG. 23 shows an emission spectrum at a current density of the light-emitting element 2 of 2.5 mA/cm$^2$. As shown in FIG. 23, the emission spectrum of the light-emitting element 2 has a peak at 584 nm.

As shown in Table 4, the CIE chromaticity coordinates of the light-emitting element 2 at a luminance of 1097 cd/m$^2$ were (x, y)=(0.56, 0.44). The results show that light emanating from the dopant was obtained.

As described above, the light-emitting element 2 which includes the light-emitting layer containing the phosphorescent compound and PCBAPDBq which is the organic compound of one embodiment of the present invention can efficiently emit light in the orange wavelength range. It can be

TABLE 3

| | First electrode | Hole-injection layer | Hole-transport layer | Light-emitting layer | First electron-transport layer | Second electron-transport layer | Electron-injection layer | Second electrode |
|---|---|---|---|---|---|---|---|---|
| Light-emitting element 2 | ITSO 110 nm | DBT3P-II:MoOx (=4:2) 40 nm | BPAFLP 20 nm | 2mDBTPDBq-II:PCBAPDBq:Ir(dppm)$_2$acac (=0.6:0.4:0.05) 40 nm | 2mDBTPDBq- II 10 nm | BPhen 20 nm | LiF 1 nm | Al 200 nm |

Next, in a glove box containing a nitrogen atmosphere, the light-emitting element 2 was sealed so as not to be exposed to the air (a sealant was applied onto an outer edge of the element and heat treatment was performed at 80° C. for one hour at the time of sealing). After that, operation characteristics of the light-emitting element 2 were measured. Note that the measurement was carried out at room temperature (in an atmosphere kept at 25° C.).

FIG. 19 shows luminance versus current density characteristics of the light-emitting element 2. In FIG. 19, the horizontal axis represents current density (mA/cm$^2$) and the vertical axis represents luminance (cd/m$^2$). FIG. 20 shows luminance said that PCBAPDBq is suitable as an assist material for a material emitting light with a wavelength equal to or longer than that of orange light.

Figure 24:
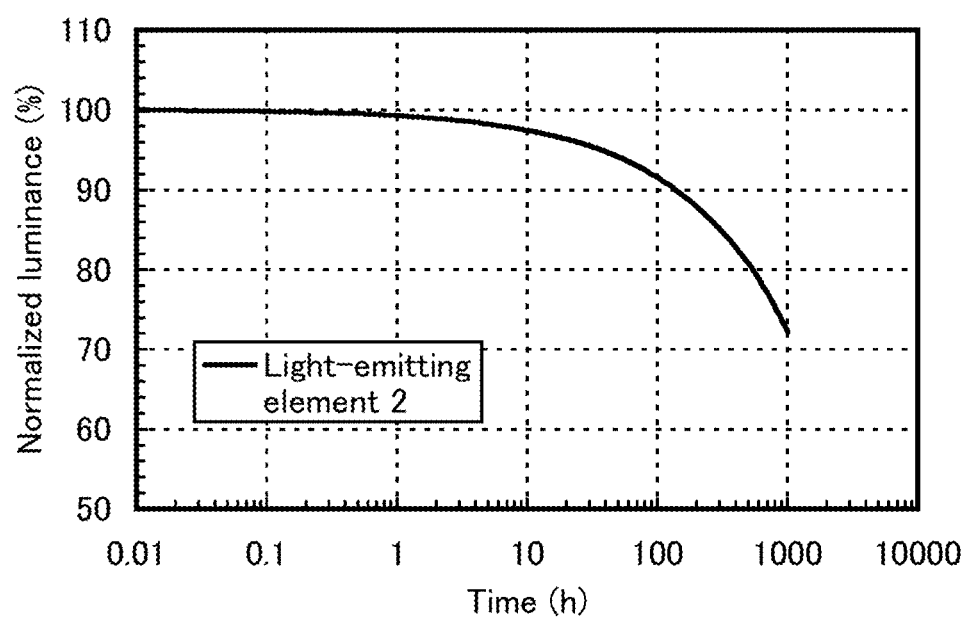
FIG. 24 shows normalized luminance versus driving time characteristics of the light-emitting element 2.

Next, a reliability test was performed on the light-emitting element 2. FIG. 24 shows results of the reliability test.

In the reliability test, the light-emitting element 2 was driven under the conditions where the initial luminance was 5000 cd/m$^2$ and the current density was constant. The results are shown in FIG. 24. The horizontal axis represents driving time (h) of the element and the vertical axis represents normalized luminance (%) on the assumption that the initial luminance is 100%. According to FIG. 24, it takes about 1000 hours for the normalized luminance of the light-emitting element 2 to decline to 72%.

FIG. 24 shows that the light-emitting element 2 has a long lifetime.

The above results show that the light-emitting element 2 which includes the light-emitting layer containing the phosphorescent compound and PCBAPDBq which is the organic compound of one embodiment of the present invention has high efficiency, low driving voltage, low power consumption, and a long lifetime.

EXAMPLE 5

In this example, a light-emitting element 3 which includes a light-emitting layer containing a phosphorescent compound and the organic compound which is described in Embodiment 1 and Example 1 and is represented by Structural Formula (100) and a comparative light-emitting element 4 for comparison were evaluated. Chemical formulae of materials used in this example are shown below.

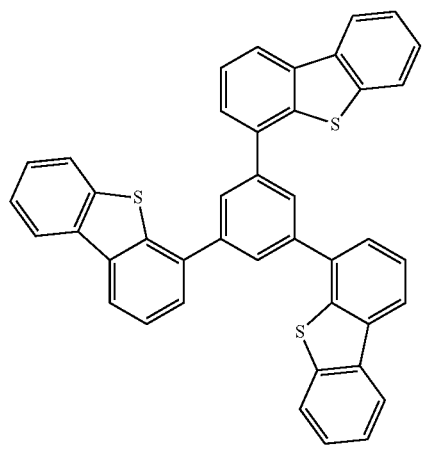

DBT3P-II

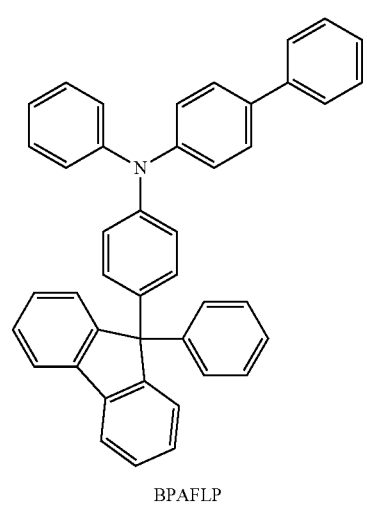

BPAFLP

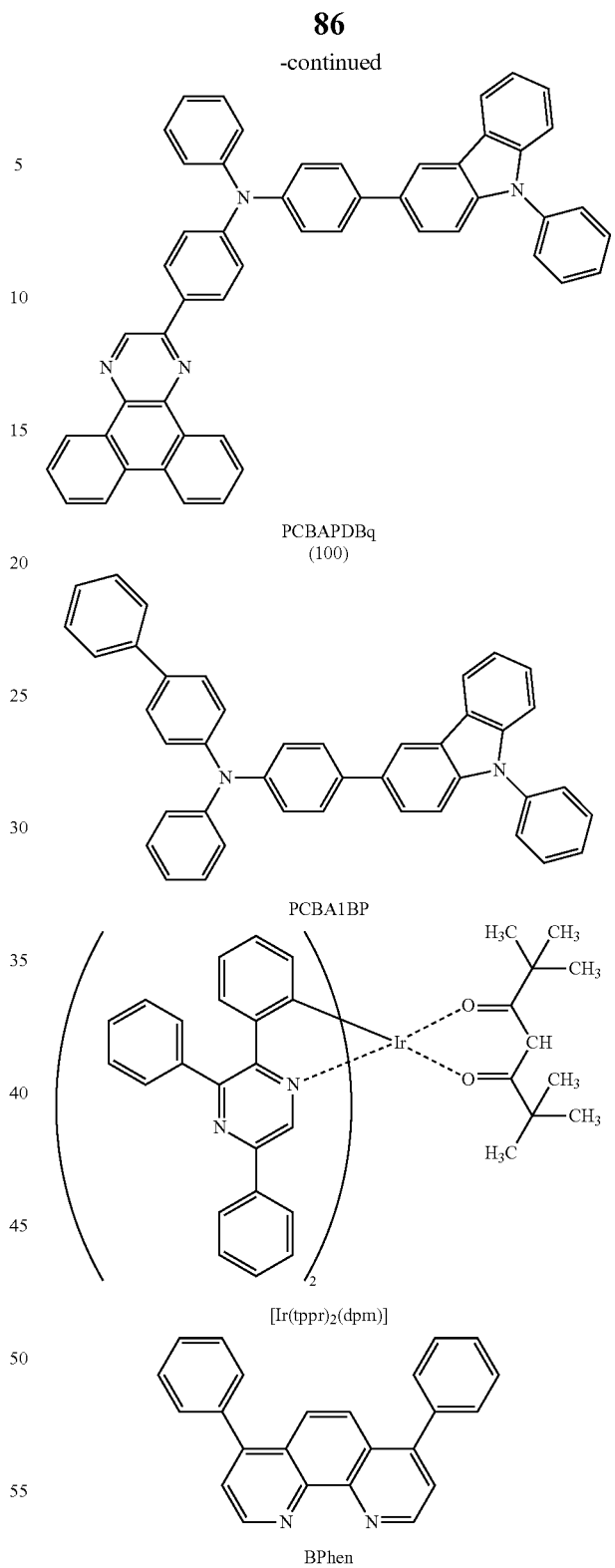

-continued

PCBAPDBq
(100)

PCBA1BP

[Ir(tppr)$_2$(dpm)]

BPhen

First, the light-emitting element 3 is described with reference to FIG. 12. A manufacturing method of the light-emitting element 3 of this example is described below.

(Light-Emitting Element 3)

First, an indium oxide-tin oxide compound containing silicon or silicon oxide (ITSO) was deposited by a sputtering method over a substrate 1100, whereby a first electrode 1101 was formed. Note that the composition ratio of $In_2O_3$ to $SnO_2$ and $SiO_2$ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus. Then, the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, DBT3P-II (abbreviation) and molybdenum oxide were co-evaporated to form a hole-injection layer 1111 on the first electrode 1101. The thickness of the hole-injection layer 1111 was set to 30 nm, and the weight ratio of DBT3P-II to molybdenum oxide was adjusted to 4:2 (=DBT3P-II: molybdenum oxide).

Next, on the hole-injection layer 1111, a film of BPAFLP (abbreviation) was formed to a thickness of 20 nm, whereby a hole-transport layer 1112 was formed.

Next, PCBAPDBq (abbreviation) synthesized in Example 1 and (dipivaloylmethanato)bis(2,3,5-triphenylpyrazinato) iridium(III) (abbreviation: $Ir(tppr)_2(dpm)$) were co-evaporated, whereby a light-emitting layer 1113 was formed on the hole-transport layer 1112. Here, the weight ratio of PCBAPDBq to $Ir(tppr)_2(dpm)$ was adjusted to 1:0.05 (=PCBAPDBq: $Ir(tppr)_2(dpm)$). The thickness of the light-emitting layer 1113 was set to 40 nm.

Note that $Ir(tppr)_2(dpm)$ is a phosphorescent compound and a guest material (dopant) in the light-emitting layer 1113. Further, PCBAPDBq is a host material in the light-emitting layer 1113.

Next, a film of PCBAPDBq was formed to a thickness of 20 nm on the light-emitting layer 1113, whereby a first electron-transport layer 1114a was formed.

Next, a film of BPhen (abbreviation) was formed to a thickness of 20 nm on the first electron-transport layer 1114a, whereby a second electron-transport layer 1114b was formed.

Next, a film of lithium fluoride (LiF) was formed to a thickness of 1 nm on the second electron-transport layer 1114b by evaporation, whereby an electron-injection layer 1115 was formed.

Lastly, a film of aluminum was formed to a thickness of 200 nm by evaporation, whereby a second electrode 1103 functioning as a cathode was formed. Thus, the light-emitting element 3 of this example was manufactured.

(Comparative Light-Emitting Element 4)

As for the comparative light-emitting element 4, 4-phenyl-4'-(9-phenyl-9H-carbazol-3-yl)triphenylamine (abbreviation: PCBA1BP) and $Ir(tppr)_2(dpm)$ (abbreviation) were co-evaporated, whereby a light-emitting layer 1113 was formed on the hole-transport layer 1112. Here, the weight ratio of PCBA1BP to $Ir(tppr)_2(dpm)$ was adjusted to 1:0.05 (=PCBA1BP: $Ir(tppr)_2(dpm)$). The thickness of the light-emitting layer 1113 was set to 40 nm.

Note that the comparative light-emitting element 4 was manufactured in a manner similar to that of the light-emitting element 3 other than the light-emitting layer 1113.

Table 5 shows element structures of the light-emitting element 3 and the comparative light-emitting element 4 which were obtained as described above.

TABLE 5

| | First electrode | Hole-injection layer | Hole-transport layer | Light-emitting layer | First electron-transport layer | Second electron-transport layer | Electron-injection layer | Second electrode |
|---|---|---|---|---|---|---|---|---|
| Light-emitting element 3 | ITSO 110 nm | DBT3P-II:MoOx (=4:2) 30 nm | BPAFLP 20 nm | PCBAPDBq:Ir(tppr)₂(dpm) (=1:0.05) 40 nm | PCBAPDBq 20 nm | BPhen 20 nm | LiF 1 nm | Al 200 nm |
| Comparative light-emitting element 4 | ITSO 110 nm | DBT3P-II:MoOx (=4:2) 30 nm | BPAFLP 20 nm | PCBA1BP:Ir(tppr)₂(dpm) (=1:0.05) 40 nm | PCBAPDBq 20 nm | BPhen 20 nm | LiF 1 nm | Al 200 nm |

Next, in a glove box containing a nitrogen atmosphere, the light-emitting element 3 and the comparative light-emitting element 4 were sealed so as not to be exposed to the air (a sealant was applied onto an outer edge of the element and heat treatment was performed at 80° C. for one hour at the time of sealing). After that, operation characteristics of the light-emitting element 3 and the comparative light-emitting element 4 were measured. Note that the measurement was carried out at room temperature (in an atmosphere kept at 25° C.).

Figure 30:
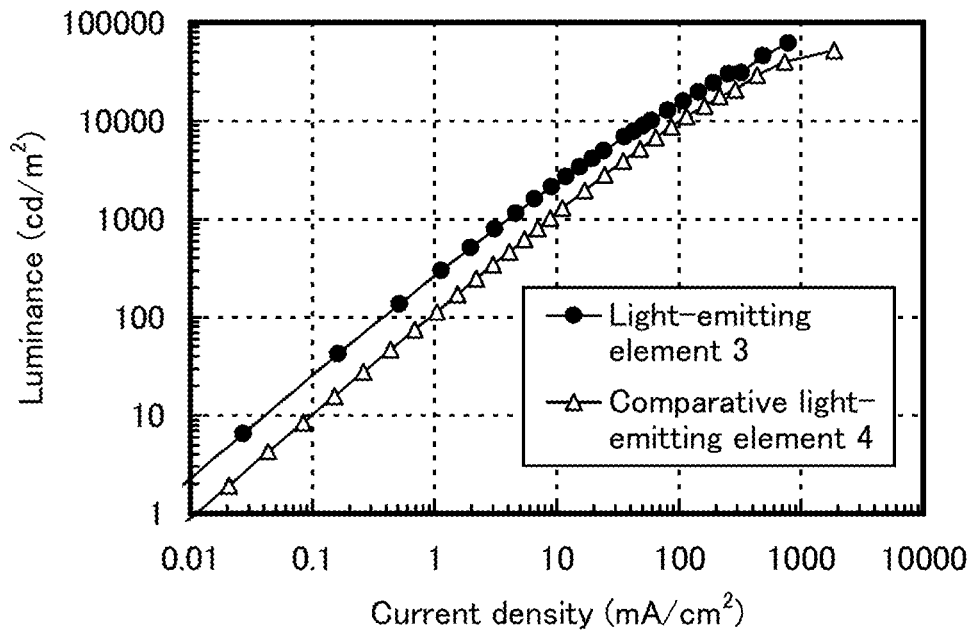
FIG. 30 shows luminance versus current density characteristics of a light-emitting element 3 and a light-emitting element 4.
Figure 31:
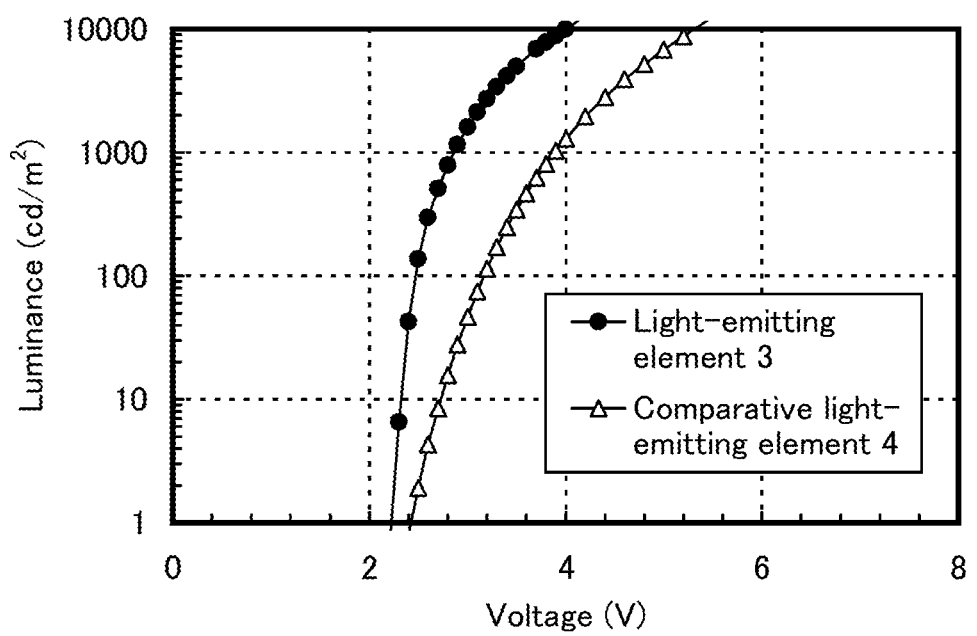
FIG. 31 shows luminance versus voltage characteristics of the light-emitting element 3 and the light-emitting element 4.
Figure 32:
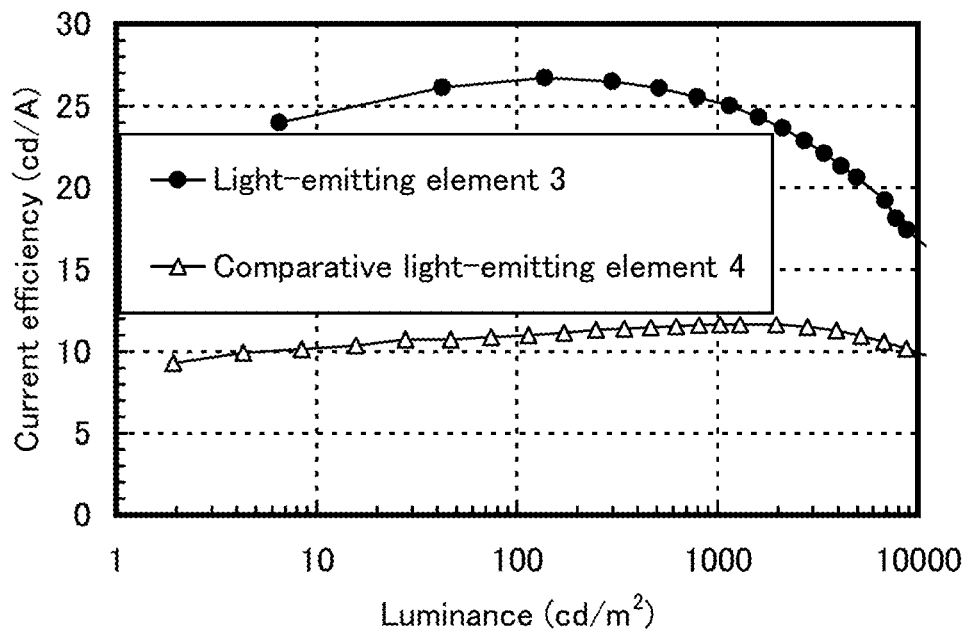
FIG. 32 shows current efficiency versus luminance characteristics of the light-emitting element 3 and the light-emitting element 4.
Figure 33:
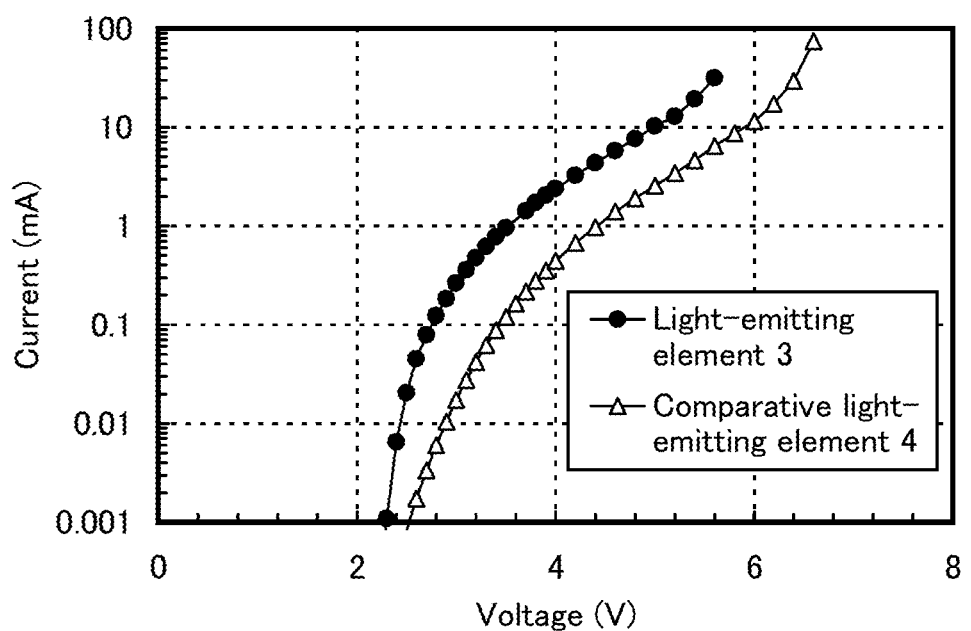
FIG. 33 shows current versus voltage characteristics of the light-emitting element 3 and the light-emitting element 4.

FIG. 30 shows luminance versus current density characteristics of the light-emitting element 3 and the comparative light-emitting element 4. In FIG. 30, the horizontal axis represents current density ($mA/cm^2$) and the vertical axis represents luminance ($cd/m^2$). FIG. 31 shows luminance versus voltage characteristics of the light-emitting element 3 and the comparative light-emitting element 4. In FIG. 31, the horizontal axis represents voltage (V) and the vertical axis represents luminance ($cd/m^2$). FIG. 32 shows current efficiency versus luminance characteristics of the light-emitting element 3 and the comparative light-emitting element 4. In FIG. 32, the horizontal axis represents luminance ($cd/m^2$) and the vertical axis represents current efficiency (cd/A). FIG. 33 shows current versus voltage characteristics of the light-emitting element 3 and the comparative light-emitting element 4. In FIG. 33, the horizontal axis represents voltage (V) and the vertical axis represents current (mA).

FIG. 30 and FIG. 32 show that the light-emitting element 3 has higher efficiency than the comparative light-emitting element 4. FIG. 30, FIG. 31, and FIG. 33 show that the light-emitting element 3 has lower driving voltage and lower power consumption than the comparative light-emitting element 4.

Table 6 shows the voltage (V), current density ($mA/cm^2$), CIE chromaticity coordinates (x, y), luminance ($cd/m^2$), current efficiency (cd/A), and external quantum efficiency (%) of the light-emitting element 3 and the comparative light-emitting element 4 at a luminance of around 1000 $cd/m^2$.

TABLE 6

| | Voltage (V) | Current density (mA/cm$^2$) | Chromaticity | | Luminance (cd/m$^2$) | Current efficiency (cd/A) | External quantum efficiency(%) |
|---|---|---|---|---|---|---|---|
| | | | x | y | | | |
| Light-emitting element 3 | 2.9 | 4.6 | 0.65 | 0.34 | 1152 | 25 | 21 |
| Comparative light-emitting element 4 | 3.9 | 8.8 | 0.44 | 0.46 | 1029 | 12 | 5 |

As shown in Table 6, the CIE chromaticity coordinates of the light-emitting element 3 at a luminance of 1152 cd/m$^2$ were (x, y)=(0.65, 0.34). Further, the CIE chromaticity coordinates of the comparative light-emitting element 4 at a luminance of 1029 cd/m$^2$ were (x, y)=(0.44, 0.46). The results show that light emanating from the dopant was obtained from the light-emitting element 3 of one embodiment of the present invention.

As described above, the light-emitting element 3 which includes the light-emitting layer containing the phosphorescent compound and PCBAPDBq which is the organic compound of one embodiment of the present invention can efficiently emit light in the red wavelength range. It can be said that PCBAPDBq is suitable as a host material for a material emitting light with a wavelength equal to or longer than that of orange light.

Figure 34:
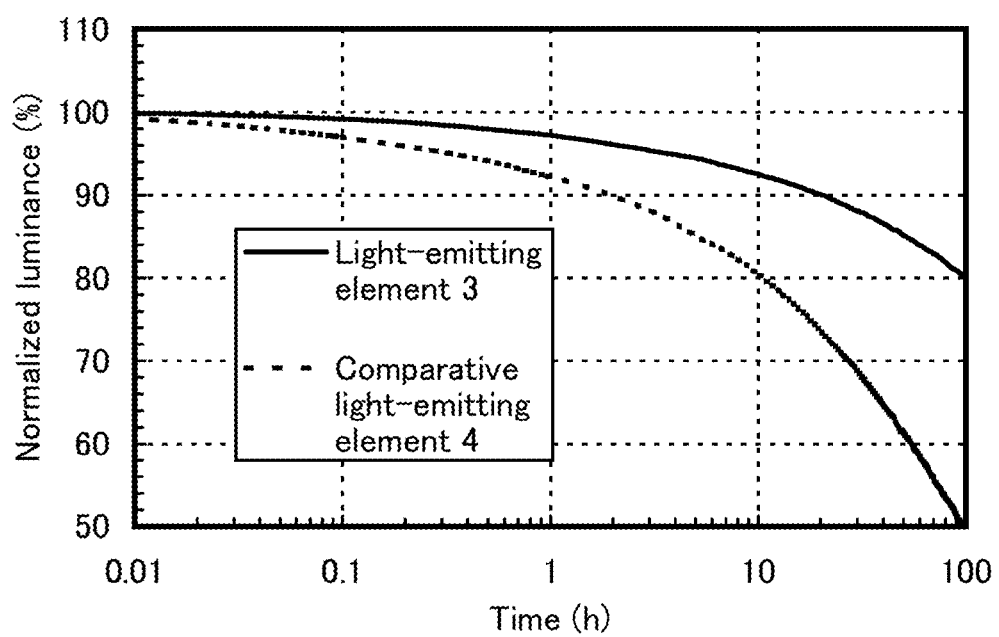
FIG. 34 shows normalized luminance versus driving time characteristics of the light-emitting element 3 and the light-emitting element 4.

Next, reliability tests were performed on the light-emitting element 3 and the comparative light-emitting element 4. FIG. 34 shows results of the reliability test.

In the reliability test, the light-emitting element 3 and the light-emitting element 4 were driven under the conditions where the initial luminance was 5000 cd/m$^2$ and the current density was constant. The results are shown in FIG. 34. The horizontal axis represents driving time (h) of the element and the vertical axis represents normalized luminance (%) on the assumption that the initial luminance is 100%. According to FIG. 34, it takes about 97 hours for the normalized luminance of the light-emitting element 3 to decline to 80%. Further, it takes about 95 hours for the normalized luminance of the comparative light-emitting element 4 to decline to 50%.

FIG. 34 shows that the light-emitting element 3 has a longer lifetime than the comparative light-emitting element 4.

The above results show that the light-emitting element 3 which includes the light-emitting layer containing the phosphorescent compound and PCBAPDBq which is the organic compound of one embodiment of the present invention has high efficiency, low driving voltage, low power consumption, and a long lifetime.

EXAMPLE 6

In this example, a light-emitting element 5 which includes a light-emitting layer containing a phosphorescent compound and the organic compound which is described in Embodiment 1 and Example 1 and is represented by Structural Formula (100) and a comparative light-emitting element 6 for comparison were evaluated. Chemical formulae of materials used in this example are shown below.

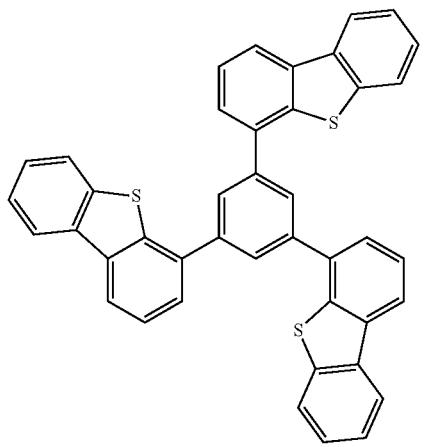

DBT3P-II

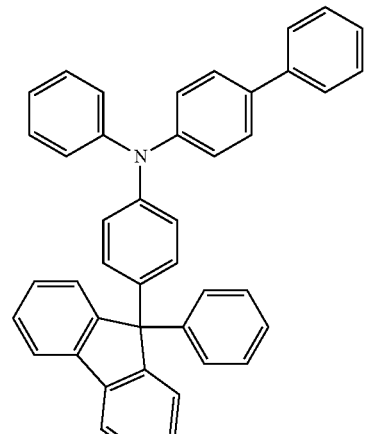

BPAFLP

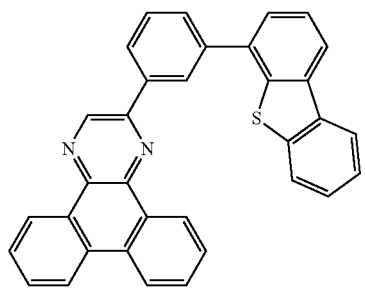

2mDBTPDBq-II

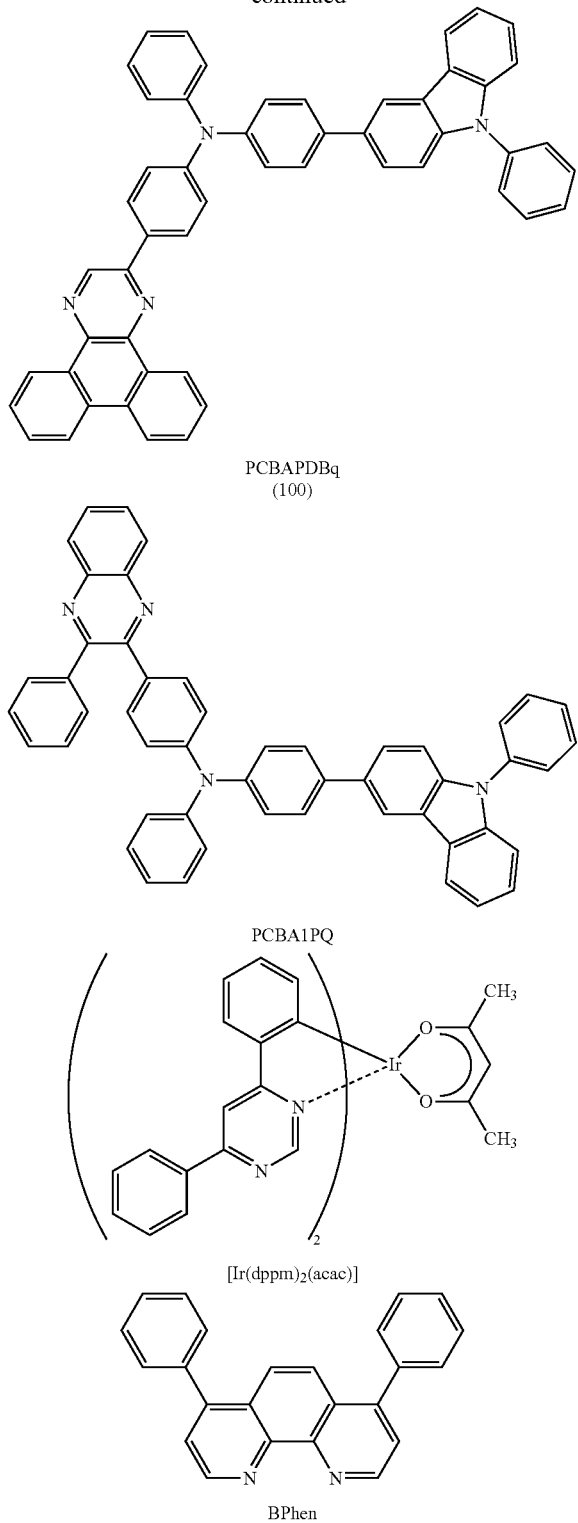

First, the light-emitting element 5 is described with reference to FIG. 12. A manufacturing method of the light-emitting element 5 of this example is described below.
(Light-Emitting Element 5)

First, an indium oxide-tin oxide compound containing silicon or silicon oxide (ITSO) was deposited by a sputtering method over a substrate 1100, whereby a first electrode 1101 was formed. Note that the composition ratio of $In_2O_3$ to $SnO_2$ and $SiO_2$ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus. Then, the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, DBT3P-II (abbreviation) and molybdenum oxide were co-evaporated to form a hole-injection layer 1111 on the first electrode 1101. The thickness of the hole-injection layer 1111 was set to 40 nm, and the weight ratio of DBT3P-II to molybdenum oxide was adjusted to 4:2 (=DBT3P-II: molybdenum oxide).

Next, on the hole-injection layer 1111, a film of BPAFLP (abbreviation) was formed to a thickness of 20 nm, whereby a hole-transport layer 1112 was formed.

Next, 2mDBTPDBq-II (abbreviation), PCBAPDBq (abbreviation) synthesized in Example 1, and [Ir(dppm)$_2$(acac)] (abbreviation) were co-evaporated, whereby a light-emitting layer 1113 was formed on the hole-transport layer 1112. Here, the weight ratio of 2mDBTPDBq-II to PCBAPDBq and [Ir(dppm)$_2$(acac)] was adjusted to 0.8:0.2:0.05 (=2mDBTP-DBq-II: PCBAPDBq: [Ir(dppm)$_2$(acac)]). The thickness of the light-emitting layer 1113 was set to 40 nm.

Note that [Ir(dppm)$_2$(acac)] is a phosphorescent compound and a guest material (dopant) in the light-emitting layer 1113. Further, 2mDBTPDBq-II is a host material in the light-emitting layer 1113. Further, PCBAPDBq is an assist material in the light-emitting layer 1113.

Next, a film of 2mDBTPDBq-II was formed to a thickness of 10 nm on the light-emitting layer 1113, whereby a first electron-transport layer 1114a was formed.

Next, a film of BPhen (abbreviation) was formed to a thickness of 20 nm on the first electron-transport layer 1114a, whereby a second electron-transport layer 1114b was formed.

Next, a film of lithium fluoride (LiF) was formed to a thickness of 1 nm on the second electron-transport layer 1114b by evaporation, whereby an electron-injection layer 1115 was formed.

Lastly, a film of aluminum was formed to a thickness of 200 nm by evaporation, whereby a second electrode 1103 functioning as a cathode was formed. Thus, the light-emitting element 5 of this example was manufactured.
(Comparative Light-Emitting Element 6)

As for the comparative light-emitting element 6, 2mDBT-PDBq-II, 4-(9-phenyl-9H-carbazol-3-yl)-4'-(3-phenylqunoxalin-2-yl)triphenylamine (abbreviation: PCBA1PQ), and [Ir(dppm)$_2$(acac)] were co-evaporated, whereby a light-emitting layer 1113 was formed on the hole-transport layer 1112. Here, the weight ratio of 2mDBTPDBq-II to PCBA1PQ and [Ir(dppm)$_2$(acac)] was adjusted to 0.8:0.2:0.05 (=2mDBTPDBq-II: PCBA1PQ: [Ir(dppm)$_2$(acac)]). The thickness of the light-emitting layer 1113 was set to 40 nm.

Note that the comparative light-emitting element 6 was manufactured in a manner similar to that of the light-emitting element 5 other than the light-emitting layer 1113.

Table 7 shows element structures of the light-emitting element 5 and the comparative light-emitting element 6 which were obtained as described above.

Figure 37:
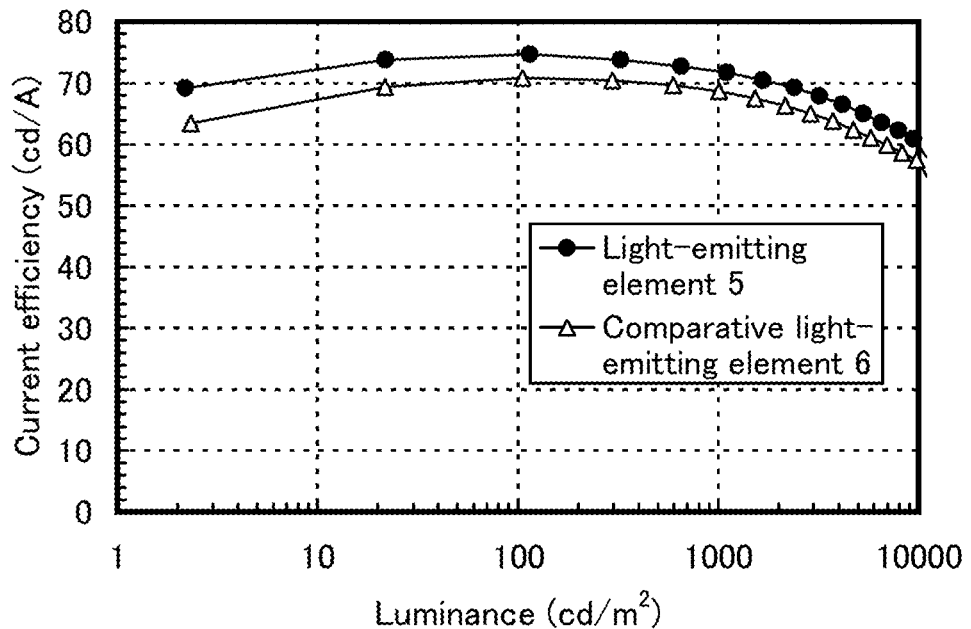
FIG. 37 shows current efficiency versus luminance characteristics of the light-emitting element 5 and the light-emitting element 6.

FIG. 37 shows that the light-emitting element 5 has higher current efficiency than the comparative light-emitting element 6.

Table 8 shows the voltage (V), current density (mA/cm$^2$), CIE chromaticity coordinates (x, y), luminance (cd/m$^2$), current efficiency (cd/A), and external quantum efficiency (%) of

TABLE 7

| | First electrode | Hole-injection layer | Hole-transport layer | Light-emitting layer | First electron-transport layer | Second electron-transport layer | Electron-injection layer | Second electrode |
|---|---|---|---|---|---|---|---|---|
| Light-emitting element 5 | ITSO 110 nm | DBT3P-II:MoOx (=4:2) 40 nm | BPAFLP 20 nm | 2mDBTPDBq-II:PCBAPDBq:Ir(dppm)$_2$acac (=0.8:0.2:0.05) 40 nm | 2mDBTPDBq-II 10 nm | BPhen 20 nm | LiF 1 nm | Al 200 nm |
| Comparative light-emitting element 6 | ITSO 110 nm | DBT3P-II:MoOx (=4:2) 30 nm | BPAFLP 20 nm | 2mDBTPDBq-II:PCBA1PQ:Ir(dppm)$_2$acac (=0.8:0.2:0.05) 40 nm | 2mDBTPDBq-II 10 nm | BPhen 20 nm | LiF 1 nm | Al 200 nm |

Next, in a glove box containing a nitrogen atmosphere, the light-emitting element 5 and the comparative light-emitting element 6 were sealed so as not to be exposed to the air (a sealant was applied onto an outer edge of the element and heat treatment was performed at 80° C. for one hour at the time of sealing). After that, operation characteristics of the light-emitting element 5 and the comparative light-emitting element 6 were measured. Note that the measurement was carried out at room temperature (in an atmosphere kept at 25° C.).

Figure 35:
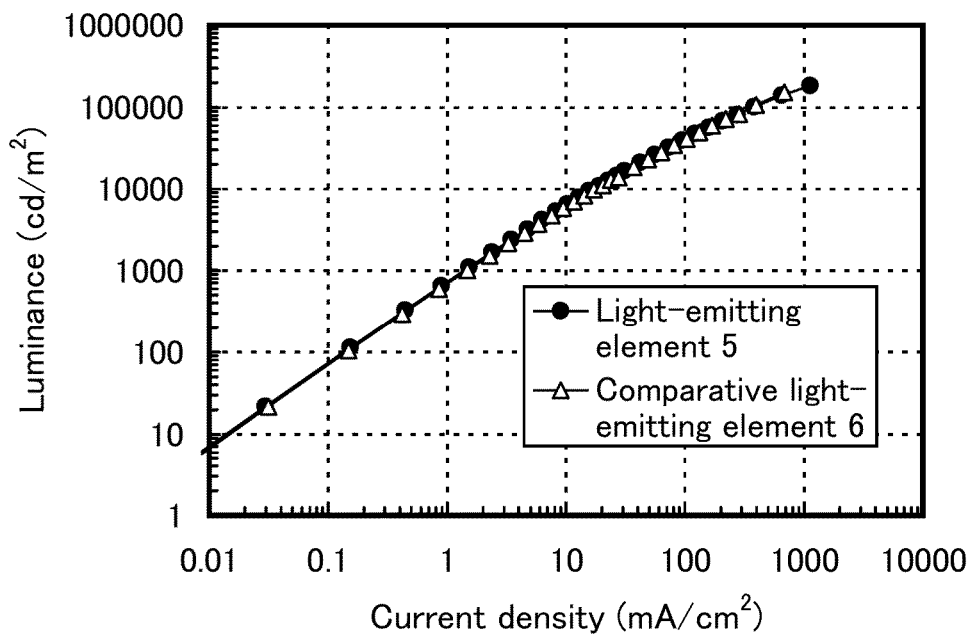
FIG. 35 shows luminance versus current density characteristics of a light-emitting element 5 and a light-emitting element 6.
Figure 36:
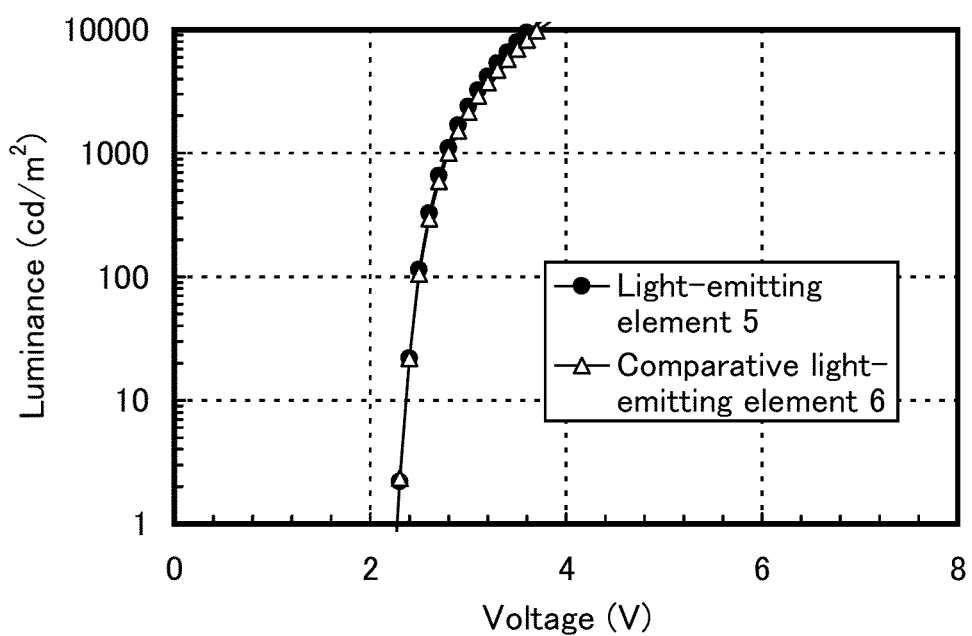
FIG. 36 shows luminance versus voltage characteristics of the light-emitting element 5 and the light-emitting element 6.
Figure 38:
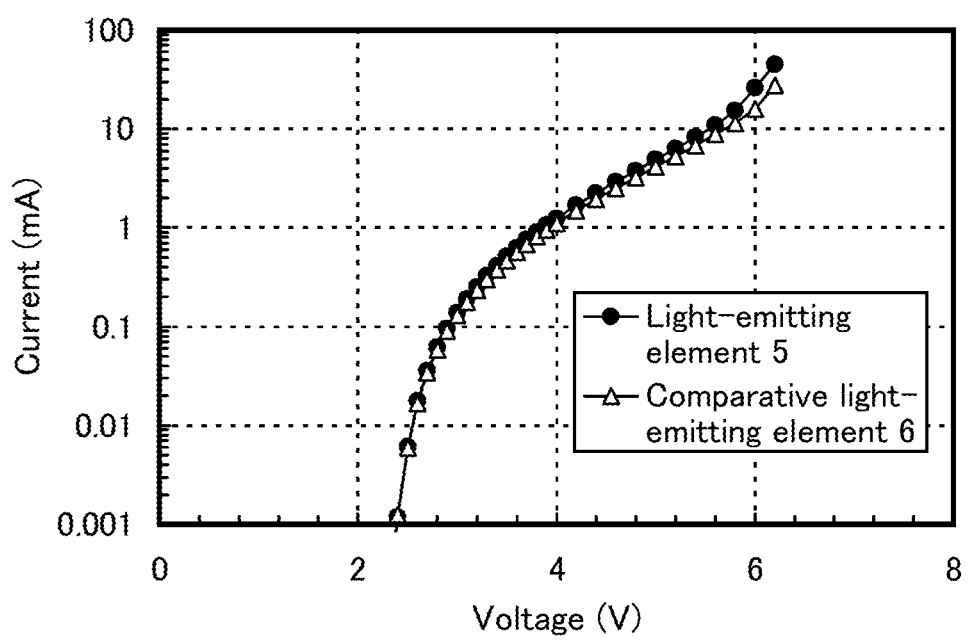
FIG. 38 shows current versus voltage characteristics of the light-emitting element 5 and the light-emitting element 6.

FIG. 35 shows luminance versus current density characteristics of the light-emitting element 5 and the comparative light-emitting element 6. In FIG. 35, the horizontal axis represents current density (mA/cm$^2$) and the vertical axis represents luminance (cd/m$^2$). FIG. 36 shows luminance versus voltage characteristics of the light-emitting element 5 and the comparative light-emitting element 6. In FIG. 36, the horizontal axis represents voltage (V) and the vertical axis represents luminance (cd/m$^2$). FIG. 37 shows current efficiency versus luminance characteristics of the light-emitting element 5 and the comparative light-emitting element 6. In FIG. 37, the horizontal axis represents luminance (cd/m$^2$) and the vertical axis represents current efficiency (cd/A). FIG. 38 shows current versus voltage characteristics of the light-emitting element 5 and the comparative light-emitting element 6. In FIG. 38, the horizontal axis represents voltage (V) and the vertical axis represents current (mA).

the light-emitting element 5 and the comparative light-emitting element 6 at a luminance of around 1000 cd/m$^2$.

TABLE 8

| | Voltage (V) | Current density (mA/cm$^2$) | Chromaticity x | Chromaticity y | Luminance (cd/m$^2$) | Current efficiency (cd/A) | External quantum efficiency(%) |
|---|---|---|---|---|---|---|---|
| Light-emitting element 5 | 2.8 | 1.5 | 0.56 | 0.43 | 1101 | 72 | 28 |
| Comparative light-emitting element 6 | 2.8 | 1.5 | 0.56 | 0.43 | 1008 | 69 | 28 |

As shown in Table 8, the CIE chromaticity coordinates of the light-emitting element 5 at a luminance of 1101 cd/m$^2$ were (x, y)=(0.56, 0.43). Further, the CIE chromaticity coordinates of the comparative light-emitting element 6 at a luminance of 1008 cd/m$^2$ were (x, y)=(0.56, 0.43). The results show that light emanating from the dopant was obtained.

As described above, the light-emitting element 5 which includes the light-emitting layer containing the phosphorescent compound and PCBAPDBq which is the organic compound of one embodiment of the present invention can efficiently emit light in the orange wavelength range. It can be said that PCBAPDBq is suitable as an assist material for a material emitting light with a wavelength equal to or longer than that of orange light.

Figure 39:
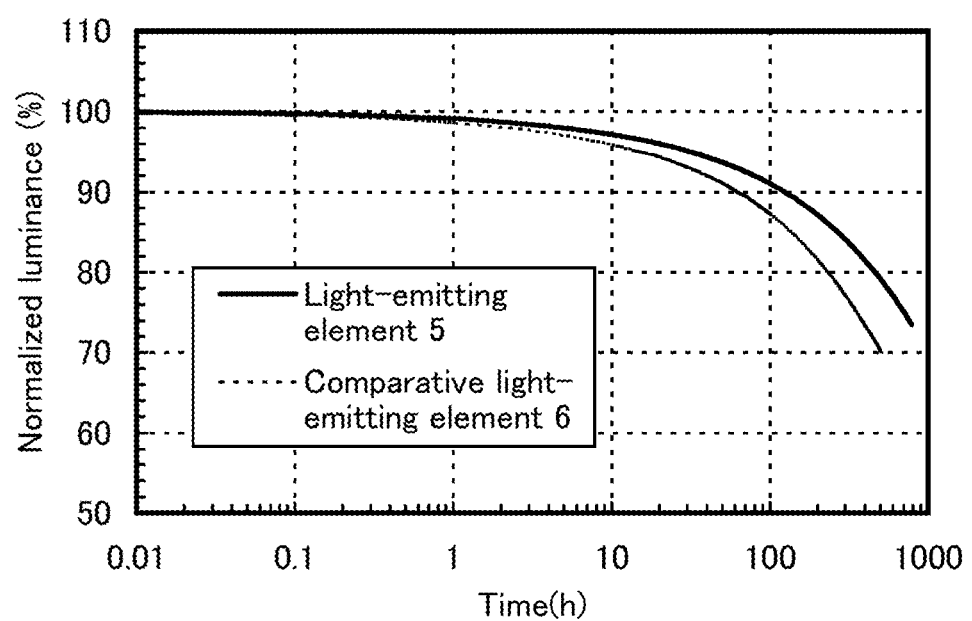
FIG. 39 shows normalized luminance versus driving time characteristics of the light-emitting element 5 and the light-emitting element 6.

Next, reliability tests were performed on the light-emitting element 5 and the comparative light-emitting element 6. FIG. 39 shows results of the reliability test.

In the reliability test, the light-emitting element 5 and the comparative light-emitting element 6 were driven under the conditions where the initial luminance was 5000 cd/m$^2$ and the current density was constant. The results are shown in FIG. 39. The horizontal axis represents driving time (h) of the element and the vertical axis represents normalized luminance (%) on the assumption that the initial luminance is 100%. According to FIG. 39, it takes about 790 hours for the normalized luminance of the light-emitting element 5 to decline to 73%. Further, it takes about 510 hours for the normalized luminance of the comparative light-emitting element 6 to decline to 70%.

FIG. 39 shows that the light-emitting element 5 has a longer lifetime than the comparative light-emitting element 6.

The above results show that the light-emitting element 5 which includes the light-emitting layer containing the phosphorescent compound and PCBAPDBq which is the organic compound of one embodiment of the present invention has high efficiency and a long lifetime.

EXAMPLE 7

In this example, a light-emitting element 7 which includes a light-emitting layer containing a phosphorescent compound and the organic compound which is described in Embodiment 1 and Example 2 and is represented by Structural Formula (201) was evaluated. Chemical formulae of materials used in this example are shown below.

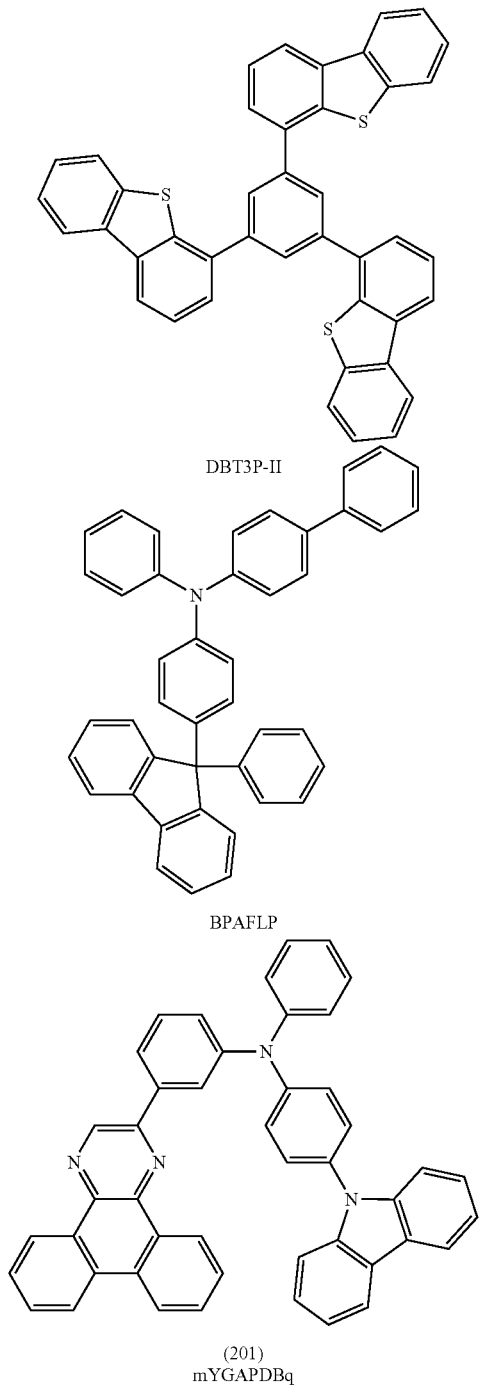

DBT3P-II

BPAFLP (201)
mYGAPDBq

-continued

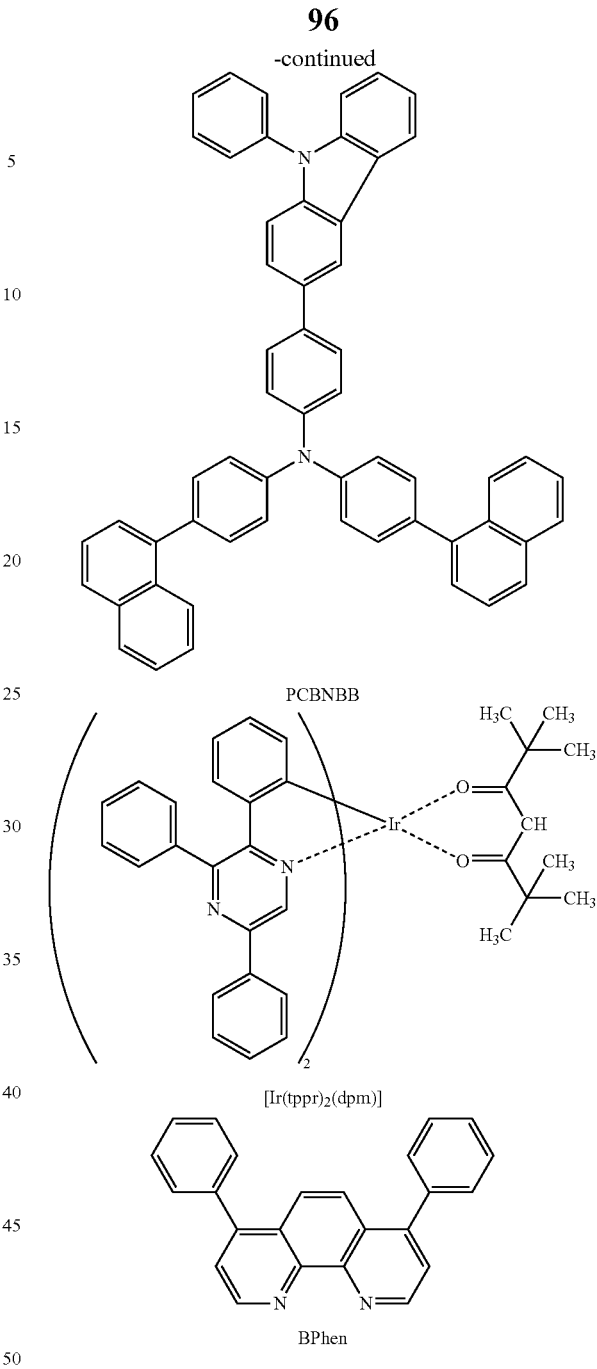

PCBNBB

[Ir(tppr)$_2$(dpm)]

BPhen

The light-emitting element 7 is described with reference to FIG. 12. A manufacturing method of the light-emitting element 7 of this example is described below.

(Light-Emitting Element 7)

First, an indium oxide-tin oxide compound containing silicon or silicon oxide (ITSO) was deposited by a sputtering method over a substrate 1100, whereby a first electrode 1101 was formed. Note that the composition ratio of In$_2$O$_3$ to SnO$_2$ and SiO$_2$ in the target used was 85:10:5 [wt %]. The thickness of the first electrode 1101 was 110 nm and the electrode area was 2 mm×2 mm. Here, the first electrode 1101 functions as an anode of the light-emitting element.

Next, as pretreatment for forming the light-emitting element over the substrate 1100, the surface of the substrate was washed, baked at 200° C. for one hour, and subjected to UV ozone treatment for 370 seconds.

After that, the substrate 1100 was transferred into a vacuum evaporation apparatus where the pressure had been reduced to approximately $10^{-4}$ Pa, and subjected to vacuum baking at 170° C. for 30 minutes in a heating chamber of the vacuum evaporation apparatus. Then, the substrate 1100 was cooled down for about 30 minutes.

Next, the substrate 1100 provided with the first electrode 1101 was fixed to a substrate holder in the vacuum evaporation apparatus so that a surface on which the first electrode 1101 was provided faced downward. The pressure in the vacuum evaporation apparatus was reduced to about $10^{-4}$ Pa. Then, DBT3P-II (abbreviation) and molybdenum oxide were co-evaporated to form a hole-injection layer 1111 on the first electrode 1101. The thickness of the hole-injection layer 1111 was set to 20 nm, and the weight ratio of DBT3P-II to molybdenum oxide was adjusted to 4:2 (=DBT3P-II: molybdenum oxide).

Next, on the hole-injection layer 1111, a film of BPAFLP (abbreviation) was formed to a thickness of 20 nm, whereby a hole-transport layer 1112 was formed.

Next, mYGAPDBq (abbreviation) synthesized in Example 2, PCBNBB (abbreviation), and Ir(tppr)$_2$(dpm) (abbreviation) were co-evaporated, whereby a light-emitting layer 1113 was formed on the hole-transport layer 1112. Here, the weight ratio of mYGAPDBq to PCBNBB and Ir(tppr)$_2$(dpm) was adjusted to 0.8:0.2:0.05 (=mYGAPDBq: PCBNBB: Ir(tppr)$_2$(dpm)). The thickness of the light-emitting layer 1113 was set to 30 nm.

Note that Ir(tppr)$_2$(dpm) is a phosphorescent compound and a guest material (dopant) in the light-emitting layer 1113. Further, mYGAPDBq is a host material in the light-emitting layer 1113. Further, PCBNBB is an assist material in the light-emitting layer 1113.

Next, on the light-emitting layer 1113, a film of mYGAPDBq was formed to a thickness of 25 nm, whereby a first electron-transport layer 1114a was formed.

Next, a film of BPhen (abbreviation) was formed to a thickness of 25 nm on the first electron-transport layer 1114a, whereby a second electron-transport layer 1114b was formed.

Next, a film of lithium fluoride (LiF) was formed to a thickness of 1 nm on the second electron-transport layer 1114b by evaporation, whereby an electron-injection layer 1115 was formed.

Lastly, a film of aluminum was formed to a thickness of 200 nm by evaporation, whereby a second electrode 1103 functioning as a cathode was formed. Thus, the light-emitting element 7 of this example was manufactured.

Table 9 shows an element structure of the light-emitting element 7 obtained as described above.

TABLE 9

| | First electrode | Hole-injection layer | Hole-transport layer | Light-emitting layer | First electron-transport layer | Second electron-transport layer | Electron-injection layer | Second electrode |
|---|---|---|---|---|---|---|---|---|
| Light-emitting element 7 | ITSO 110 nm | DBT3P-II:MoOx (=4:2) 20 nm | BPAFLP 20 nm | mYGAPDBq:PCBNBB: Ir(tppr)$_2$(dpm) (=0.8:0.2:0.05) 30 nm | mYGAPDBq 25 nm | BPhen 25 nm | LiF 1 nm | Al 200 nm |

Next, in a glove box containing a nitrogen atmosphere, the light-emitting element 7 was sealed so as not to be exposed to the air (a sealant was applied onto an outer edge of the element and heat treatment was performed at 80° C. for one hour at the time of sealing). After that, operation characteristics of the light-emitting element 7 were measured. Note that the measurement was carried out at room temperature (in an atmosphere kept at 25° C.).

Figure 40:
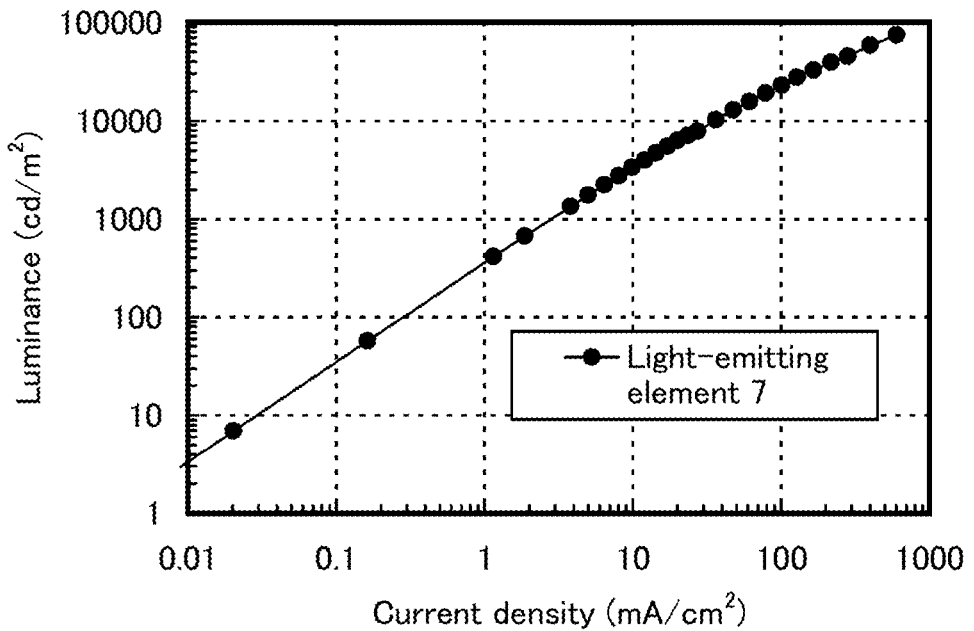
FIG. 40 shows luminance versus current density characteristics of a light-emitting element 7.
Figure 41:
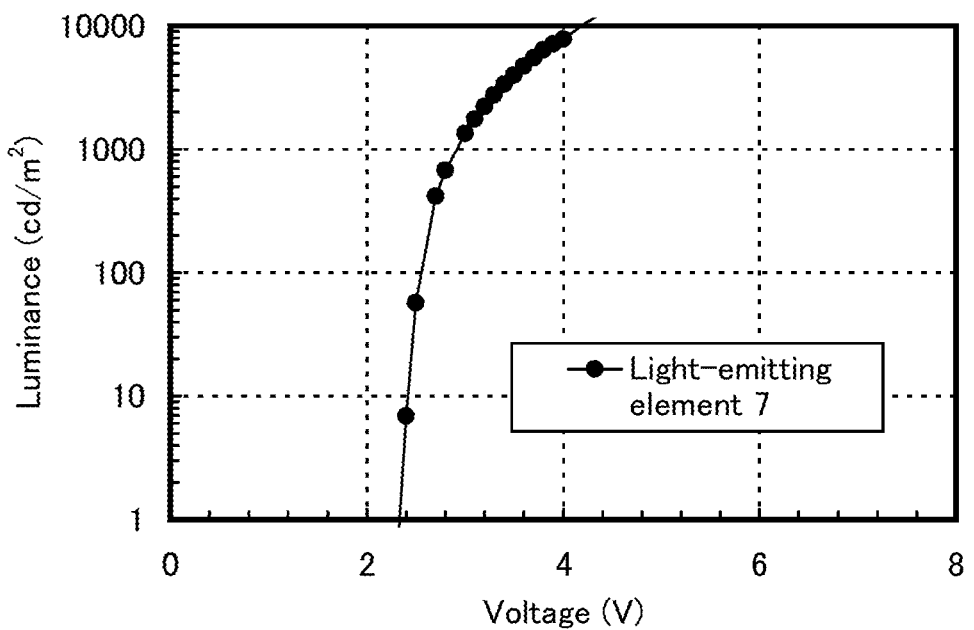
FIG. 41 shows luminance versus voltage characteristics of the light-emitting element 7.
Figure 42:
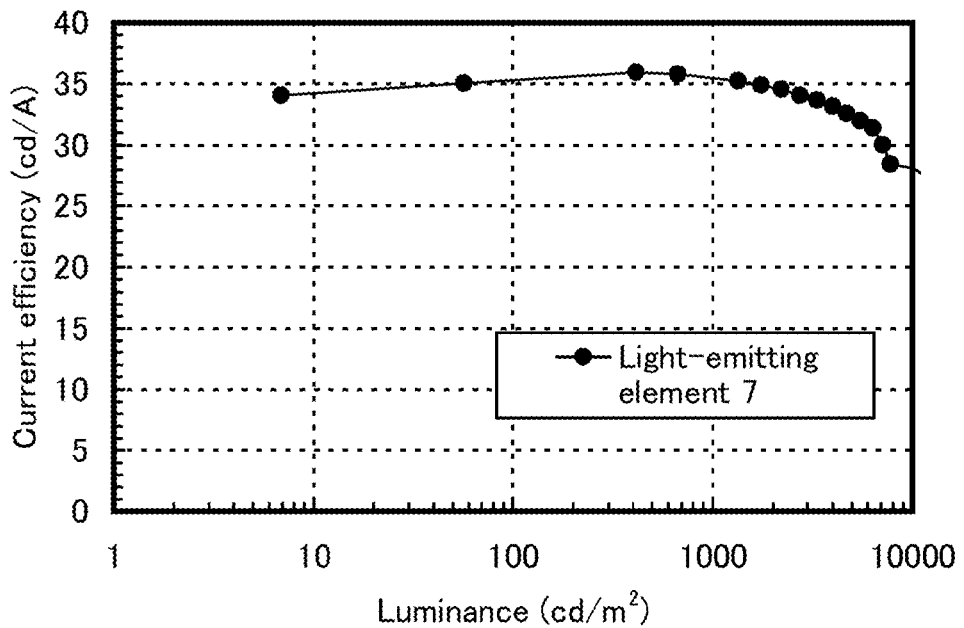
FIG. 42 shows current efficiency versus luminance characteristics of the light-emitting element 7.
Figure 43:
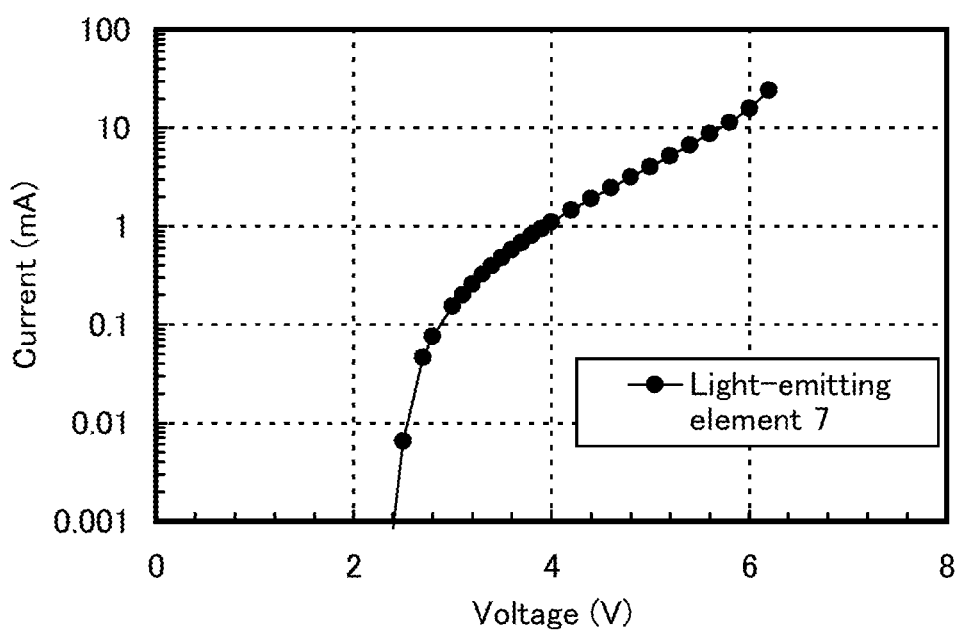
FIG. 43 shows current versus voltage characteristics of the light-emitting element 7.

FIG. 40 shows luminance versus current density characteristics of the light-emitting element 7. In FIG. 40, the horizontal axis represents current density (mA/cm$^2$) and the vertical axis represents luminance (cd/m$^2$). FIG. 41 shows luminance versus voltage characteristics of the light-emitting element 7. In FIG. 41, the horizontal axis represents voltage (V) and the vertical axis represents luminance (cd/m$^2$). FIG. 42 shows current efficiency versus luminance characteristics of the light-emitting element 7. In FIG. 42, the horizontal axis represents luminance (cd/m$^2$) and the vertical axis represents current efficiency (cd/A). FIG. 43 shows current versus voltage characteristics of the light-emitting element 7. In FIG. 43, the horizontal axis represents voltage (V) and the vertical axis represents current (mA).

FIG. 40 and FIG. 42 show that the light-emitting element 7 has high efficiency. FIG. 40, FIG. 41, and FIG. 43 show that the light-emitting element 7 has low driving voltage and low power consumption.

Table 10 shows the voltage (V), current density (mA/cm$^2$), CIE chromaticity coordinates (x, y), luminance (cd/m$^2$), current efficiency (cd/A), and external quantum efficiency (%) of the light-emitting element 7 at a luminance of 672 cd/m$^2$.

TABLE 10

| | Voltage (V) | Current density (mA/cm$^2$) | Chromaticity x | Chromaticity y | Luminance (cd/m$^2$) | Current efficiency (cd/A) | External quantum efficiency(%) |
|---|---|---|---|---|---|---|---|
| Light-emitting element 7 | 2.8 | 1.9 | 0.65 | 0.35 | 672 | 36 | 26 |

As shown in Table 10, the CIE chromaticity coordinates of the light-emitting element 7 at a luminance of 672 cd/m$^2$ were (x, y)=(0.65, 0.35). The results show that light emanating from the dopant was obtained.

As described above, the light-emitting element 7 which includes the light-emitting layer containing the phosphorescent compound and mYGAPDBq which is the organic compound of one embodiment of the present invention can efficiently emit light in the red wavelength range. This shows that mYGAPDBq is suitable as a host material for a light-emitting material.

This application is based on Japanese Patent Application serial no. 2011-258031 filed with Japan Patent Office on Nov. 25, 2011, the entire contents of which are hereby incorporated by reference.

What is claimed is:

1. A light-emitting element comprising:
a light-emitting layer interposed between a pair of electrodes,
wherein the light-emitting layer contains a metal-free first organic compound and a phosphorescent compound,
wherein a dibenzo[f,h]quinoxaline skeleton and an amino group having two substituents are bonded to each other through an arylene group in the metal-free first organic compound, and
wherein the substituents are separately an aryl group or a heteroaryl group.

2. The light-emitting element according to claim 1, wherein one of the substituents includes a carbazole skeleton.

3. The light-emitting element according to claim 1, wherein a 2-position of the dibenzo[f,h]quinoxaline skeleton is bonded to the amino group through an arylene group.

4. An organic compound represented by Formula (G1):

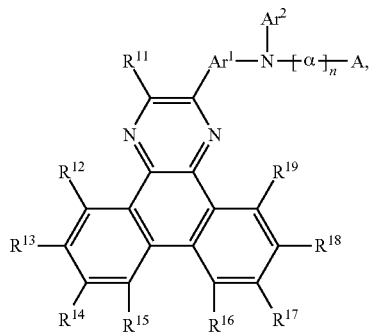

(G1)

wherein:
each of $R^{11}$ to $R^{19}$ represents any of hydrogen, an alkyl group having 1 to 4 carbon atoms, and a substituted or unsubstituted aryl group having 6 to 13 carbon atoms;
$Ar^1$ represents a substituted or unsubstituted arylene group having 6 to 13 carbon atoms;
$Ar^2$ represents a substituted or unsubstituted aryl group having 6 to 13 carbon atoms;
α represents a substituted or unsubstituted phenylene group or a substituted or unsubstituted biphenyldiyl group;
n represents 0 or 1; and
A represents substituted or unsubstituted 9H-carbazol-9-yl group or a substituted or unsubstituted 9-aryl-9H-carbazol-3-yl group.

5. The organic compound according to claim 4, wherein:
the organic compound is represented by Formula (G2-1),

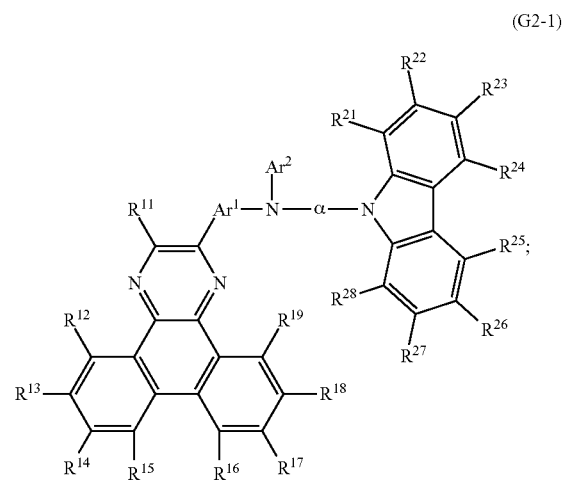

(G2-1)

and
each of $R^{21}$ to $R^{28}$ represents any of hydrogen, an alkyl group having 1 to 4 carbon atoms, and a substituted or unsubstituted aryl group having 6 to 13 carbon atoms.

6. The organic compound according to claim 5, wherein α is a substituted or unsubstituted para-phenylene group.

7. The organic compound according to claim 4, wherein:
the organic compound is represented by Formula (G3-1),

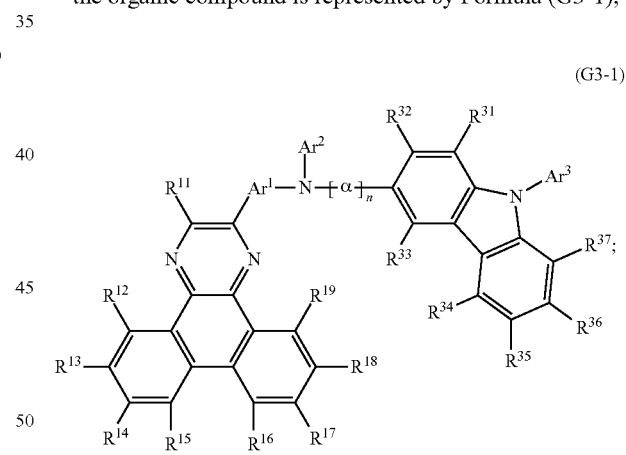

(G3-1)

each of $R^{31}$ to $R^{37}$ represents any of hydrogen, an alkyl group having 1 to 4 carbon atoms, and a substituted or unsubstituted aryl group having 6 to 13 carbon atoms; and
$Ar^3$ represents a substituted or unsubstituted aryl group having 6 to 13 carbon atoms.

8. The organic compound according to claim 7, wherein n is 1, and
wherein α is a substituted or unsubstituted para-phenylene group.

9. The organic compound according to claim 4, wherein $Ar^1$ is a substituted or unsubstituted phenylene group or a substituted or unsubstituted biphenyldiyl group.

10. The organic compound according to claim 4,
wherein $Ar^1$ is a substituted or unsubstituted para-phenylene group.

11. The organic compound according to claim 5,
wherein:
the organic compound is represented by Formula (G2-2),

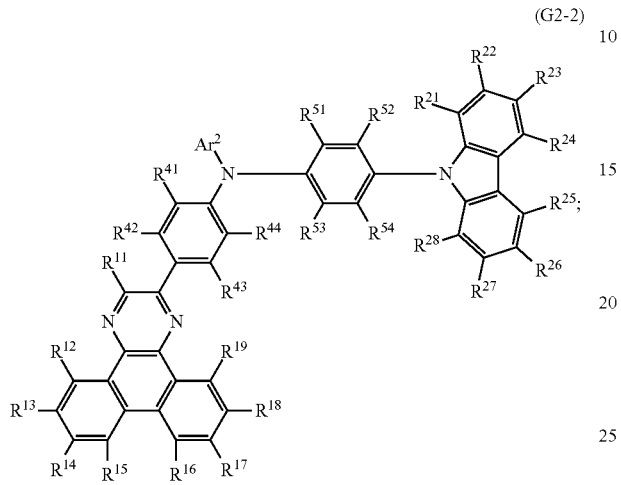

(G2-2)

and
each of $R^{41}$ to $R^{44}$ and $R^{51}$ to $R^{54}$ represents any of hydrogen, an alkyl group having 1 to 4 carbon atoms, and a substituted or unsubstituted aryl group having 6 to 13 carbon atoms.

12. The organic compound according to claim 7,
wherein:
the organic compound represented by Formula (G3-2),

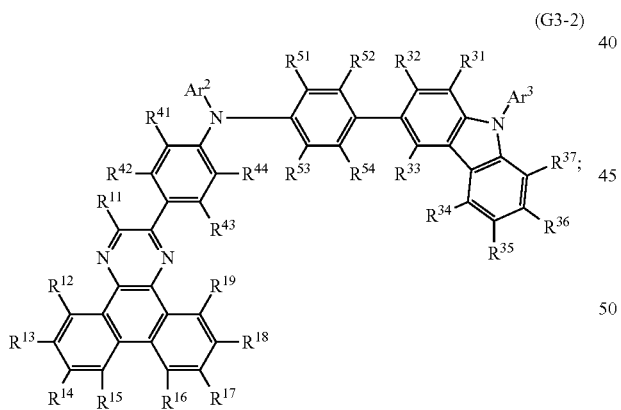

(G3-2)

and
each of $R^{41}$ to $R^{44}$ and $R^{51}$ to $R^{54}$ represents any of hydrogen, an alkyl group having 1 to 4 carbon atoms, and a substituted or unsubstituted aryl group having 6 to 13 carbon atoms.

13. The organic compound according to claim 7,
wherein:
the organic compound is represented by Formula (G3-3),

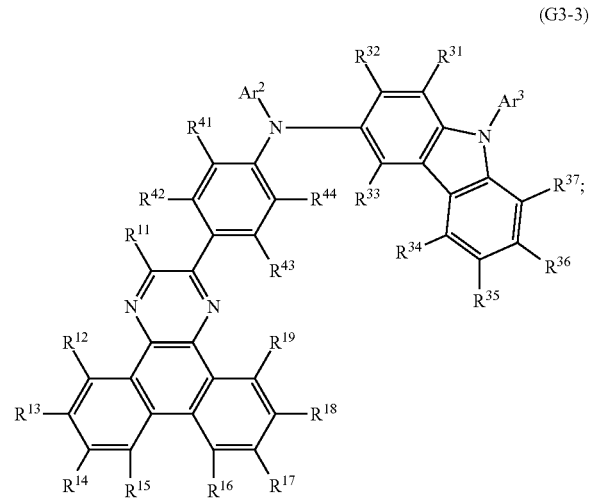

(G3-3)

and
each of $R^{41}$ to $R^{44}$ represents any of hydrogen, an alkyl group having 1 to 4 carbon atoms, and a substituted or unsubstituted aryl group having 6 to 13 carbon atoms.

14. A light-emitting element comprising:
a light-emitting layer interposed between a pair of electrodes,
wherein the light-emitting layer contains the organic compound according to claim 4 and a phosphorescent compound.

15. A light-emitting device comprising the light-emitting element according to claim 14.

16. An electronic device comprising the light-emitting element according to claim 14.

17. A lighting device comprising the light-emitting element according to claim 14.

* * * * *